United States Patent
Kuwahara

(10) Patent No.: US 11,676,842 B2
(45) Date of Patent: Jun. 13, 2023

(54) SUBSTRATE TREATING APPARATUS

(71) Applicant: SCREEN Holdings Co., Ltd., Kyoto (JP)

(72) Inventor: Joji Kuwahara, Kyoto (JP)

(73) Assignee: SCREEN Holdings Co., Ltd.

( * ) Notice: Subject to any disclaimer, the term of this patent is extended or adjusted under 35 U.S.C. 154(b) by 598 days.

(21) Appl. No.: 16/695,260

(22) Filed: Nov. 26, 2019

(65) Prior Publication Data

US 2020/0176280 A1  Jun. 4, 2020

(30) Foreign Application Priority Data

Nov. 30, 2018  (JP) ............................. JP2018-225830

(51) Int. Cl.
| | | |
|---|---|---|
| *H01L 21/677* | (2006.01) | |
| *H01L 21/67* | (2006.01) | |
| *H01L 21/673* | (2006.01) | |

(52) U.S. Cl.
CPC ...... *H01L 21/6773* (2013.01); *H01L 21/6732* (2013.01); *H01L 21/67109* (2013.01); *H01L 21/67769* (2013.01); *H01L 21/67781* (2013.01)

(58) Field of Classification Search
CPC ......... H01L 21/67109; H01L 21/67739; H01L 21/67742; H01L 21/67748; H01L 21/6732; H01L 21/67727; H01L 21/67161; H01L 21/67178; H01L 21/67196; H01L 21/67207; H01L 21/67155
See application file for complete search history.

(56) References Cited

U.S. PATENT DOCUMENTS

| | | | | |
|---|---|---|---|---|
| 2006/0182535 A1* | 8/2006 | Rice | .................. | H01L 21/67173 414/217 |
| 2006/0183340 A1* | 8/2006 | Hayashida | ........ | H01L 21/67276 438/758 |

(Continued)

FOREIGN PATENT DOCUMENTS

| | | |
|---|---|---|
| JP | 2008-192756 | 8/2008 |
| JP | 2009-278027 | 11/2009 |

(Continued)

OTHER PUBLICATIONS

Office Action dated Jan. 21, 2021 for corresponding Korean Patent Application No. 10-2019-0154431.

(Continued)

*Primary Examiner* — Glenn F Myers
(74) *Attorney, Agent, or Firm* — Ostrolenk Faber LLP

(57) ABSTRACT

A substrate treating apparatus includes a transporting space, transport mechanisms, and heat-treating sections. The transport mechanisms are provided in the transporting space. The heat-treating section, transporting space, and heat-treating section are aligned in the stated order in a transverse direction. One heat-treating section includes a plurality of heat-treating units. The heat-treating units are arranged in a longitudinal direction. The other heat-treating section includes a plurality of heat-treating units. These heat-treating units are also arranged in the longitudinal direction. One transport mechanism transports substrates to the heat-treating units. The other transport mechanism also transports substrates to the heat-treating units.

24 Claims, 18 Drawing Sheets

(56) References Cited

U.S. PATENT DOCUMENTS

| | | | |
|---|---|---|---|
| 2007/0144439 A1* | 6/2007 | Englhardt | H01L 21/67742 156/345.31 |
| 2008/0014058 A1* | 1/2008 | Hongkham | H01L 21/67745 901/50 |
| 2008/0153182 A1 | 6/2008 | Herchen et al. | 438/10 |
| 2008/0185370 A1 | 8/2008 | Fukuoka et al. | 219/385 |
| 2009/0000543 A1 | 1/2009 | Fukutomi et al. | 118/58 |
| 2012/0057861 A1* | 3/2012 | Matsuoka | G03F 7/3021 396/611 |
| 2012/0076626 A1* | 3/2012 | Hoey | H01L 21/67196 901/19 |
| 2012/0156380 A1* | 6/2012 | Fukutomi | H01L 21/67017 427/372.2 |
| 2013/0202388 A1* | 8/2013 | Hayashi | H01L 21/67184 414/222.02 |
| 2013/0280017 A1 | 10/2013 | Kaneko | 414/222.07 |
| 2014/0161983 A1 | 6/2014 | Inagaki | 427/402 |
| 2015/0318198 A1* | 11/2015 | Kuwahara | H01L 21/67703 414/806 |
| 2017/0053817 A1 | 2/2017 | Inagaki | |
| 2018/0052393 A1 | 2/2018 | Nishiyama et al. | |
| 2018/0156739 A1 | 6/2018 | Mori et al. | |

FOREIGN PATENT DOCUMENTS

| | | |
|---|---|---|
| JP | 2011-103463 | 5/2011 |
| JP | 2017-041588 | 2/2017 |
| JP | 2017-041588 A | 2/2017 |
| JP | 2018-164031 A | 10/2018 |
| KR | 10-2009-0004547 A | 1/2009 |
| KR | 10-2009-0120397 A | 11/2009 |
| KR | 10-2014-0075625 A | 6/2014 |
| KR | 10-2017-0022931 A | 3/2017 |
| TW | 201351550 A | 12/2013 |
| TW | 201543171 A | 11/2015 |
| TW | 201724305 A | 7/2017 |
| TW | 201824343 A | 7/2018 |
| TW | 201836002 A | 10/2018 |

OTHER PUBLICATIONS

Office Action and Search Report dated Apr. 22, 2021 for corresponding Taiwanese Patent Application No. 108143061.

Office Action dated Apr. 26, 2022 issued in corresponding Japanese Patent Application No. 2018-225830.

* cited by examiner

FIG. 12A
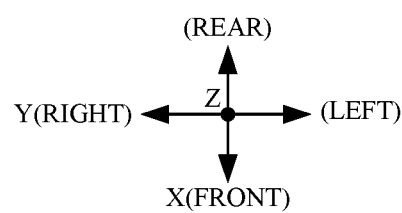
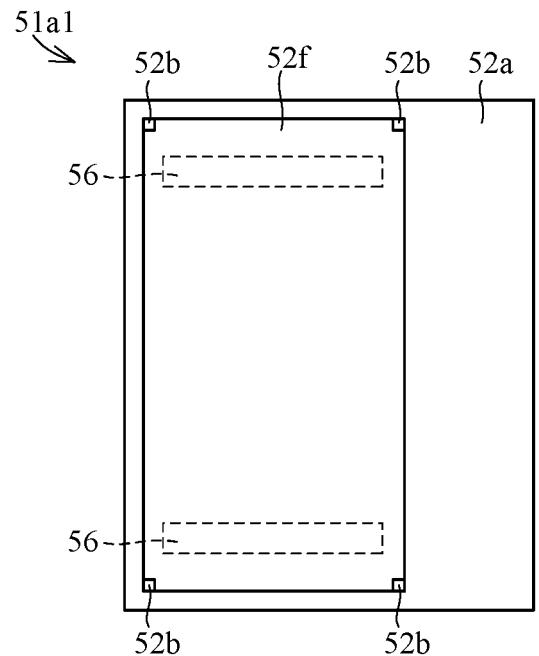
FIG. 12C
FIG. 12B
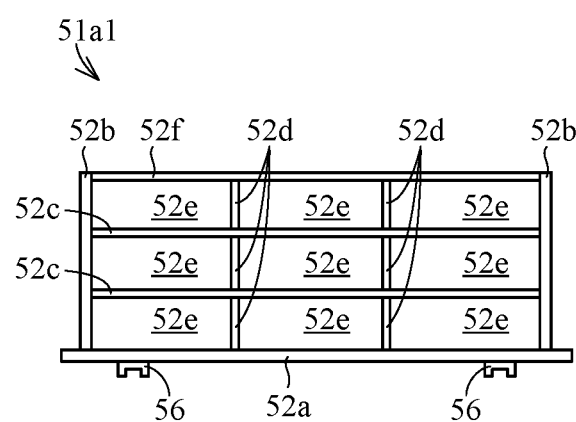
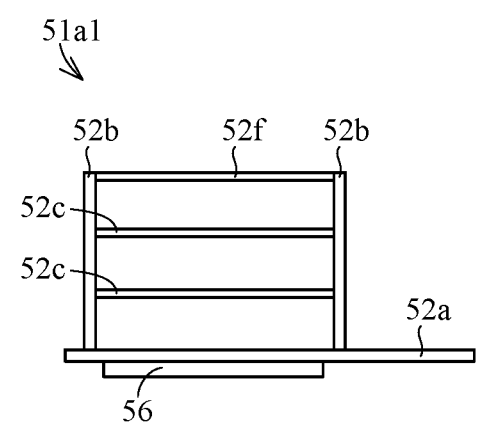
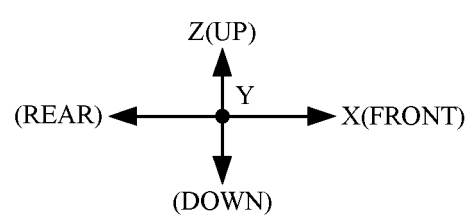
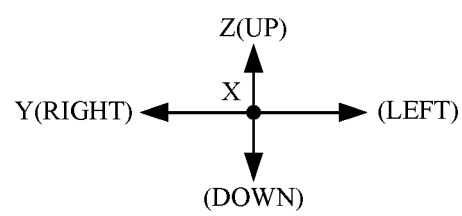

SUBSTRATE TREATING APPARATUS

CROSS-REFERENCE TO RELATED APPLICATIONS

This application claims priority to Japanese Patent Application No. 2018-225830 filed Nov. 30, 2018, the disclosure of which is hereby incorporated herein by reference in its entirety for all purposes.

BACKGROUND OF THE INVENTION

Field of the Invention

This invention relates to a substrate treating apparatus for treating substrates. The substrates are, for example, semiconductor wafers, substrates for liquid crystal displays, substrates for organic EL (Electroluminescence), substrates for FPDs (Flat Panel Displays), substrates for optical displays, substrates for magnetic disks, substrates for optical disks, substrates for magneto-optical disks, substrates for photomasks, and substrates for solar cells.

Description of the Related Art

Japanese Unexamined Patent Publication No. 2017-41588 discloses a substrate treating apparatus. Description will be made hereunder showing, in parentheses, the reference signs used in the above patent publication. The substrate treating apparatus (1) includes a heat-treating block (BA). The heat-treating block (BA) has a transporting space (AA), a main transport mechanism (TAR), and a main transport mechanism (TAL). The main transport mechanism (TAR) and main transport mechanism (TAL) are provided in the transporting space (AA). The main transport mechanism (TAR) and main transport mechanism (TAL) transport substrates, respectively. The heat-treating block (BA) has two heat-treating units (HAR) and two heat-treating units (HAL). The heat-treating units (HAR) are arranged on the right side of the transporting space (AA). The heat-treating units (HAL) are arranged on the left side of the transporting space (AA). The two heat-treating units (HAR) are arranged to align in an up-down direction. The two heat-treating units (HAL) are arranged to align in the up-down direction.

The main transport mechanism (TAR) accesses the heat-treating units (HAR). The main transport mechanism (TAL) accesses the heat-treating units (HAL).

SUMMARY OF THE INVENTION

The substrate treating apparatus is desired to achieve further improvement in throughput (the number of substrates that can be processed per unit time). However, it is difficult to further improve throughput with the construction of the substrate treating apparatus (1) shown in Japanese Unexamined Patent Publication 2017-41588.

This invention has been made having regard to the state of the art noted above, and its object is to provide a substrate treating apparatus which can improve its throughput.

To fulfill the above object, this invention provides the following construction. A substrate treating apparatus, according to this invention, comprises a transporting space extending in a longitudinal direction; a first transport mechanism disposed in the transporting space; a second transport mechanism disposed in the transporting space; a first heat-treating section for performing heat treatment on substrates; and a second heat-treating section for performing heat treatment on the substrates; wherein the first heat-treating section, the transporting space, and the second heat-treating section are aligned in the stated order in a transverse direction perpendicular to the longitudinal direction; the first heat-treating section includes a plurality of first heat-treating units arranged in the longitudinal direction, each for performing heat treatment on one substrate; the second heat-treating section includes a plurality of second heat-treating units arranged in the longitudinal direction, each for performing heat treatment on one substrate; the first transport mechanism is configured to transport the substrates to the first heat-treating units; and the second transport mechanism is configured to transport the substrates to the second heat-treating units.

The first heat-treating section and transporting space are aligned in the transverse direction. The first heat-treating section has a plurality of first heat-treating units. Each of the first heat-treating units performs heat treatment on one substrate. The first transport mechanism transports substrates to the first heat-treating units.

The second heat-treating section and transporting space are aligned in the transverse direction. More particularly, the transporting space is located in the transverse direction between the first heat-treating section and second heat-treating section. The second heat-treating section has a plurality of second heat-treating units. Each of the second heat-treating units performs heat treatment on one substrate. The second transport mechanism transports substrates to the second heat-treating units.

The first heat-treating units are aligned in the longitudinal direction. Consequently, the number of first heat-treating units included in the first heat-treating section can be increased relatively easily. The first heat-treating section can therefore perform heat treatment in parallel on a relatively large number of substrates. Similarly, the second heat-treating units are aligned in the longitudinal direction. Consequently, the number of second heat-treating units included in the second heat-treating section can be increased relatively easily. The second heat-treating section can therefore perform heat treatment in parallel on a relatively large number of substrates. Thus, the throughput of the substrate treating apparatus can be improved conveniently.

In the above substrate treating apparatus, it is preferred that the first transport mechanism is movable in the longitudinal direction relative to the first heat-treating units; and the second transport mechanism is movable in the longitudinal direction relative to the second heat-treating units independently of the first transport mechanism. The first transport mechanism is movable in the longitudinal direction relative to the first heat-treating units. The first transport mechanism can therefore conveniently access the first heat-treating units. The second transport mechanism is movable in the longitudinal direction relative to the second heat-treating units. The second transport mechanism can therefore conveniently access the second heat-treating units. The movement of the second transport mechanism is independent of the movement of the first transport mechanism. Consequently, the first transport mechanism can efficiently access the first heat-treating units. The second transport mechanism can efficiently access the second heat-treating units.

In the above substrate treating apparatus, it is preferred that the first transport mechanism includes a first horizontal mover movable in the longitudinal direction relative to the first heat-treating units; a first arm supported by the first horizontal mover to be rotatable about a first axis relative to the first horizontal mover; and a first holder fixed to the first arm for holding the substrates: the first axis being parallel to an up-down direction; a position in plan view of the first axis relative to the first horizontal mover being constant; a distance in plan view between the first holder and the first axis being constant; and the second transport mechanism includes a second horizontal mover movable in the longitudinal direction relative to the second heat-treating units; a second arm supported by the second horizontal mover to be rotatable about a second axis relative to the second horizontal mover; and a second holder fixed to the second arm for holding the substrates; the second axis being parallel to the up-down direction; a position in plan view of the second axis relative to the second horizontal mover being constant; a distance in plan view between the second holder and the second axis being constant.

The first transport mechanism includes a first horizontal mover, a first arm, and a first holder. The first arm is supported by the first horizontal mover. The first holder is fixed to the first arm. Thus, the first holder is indirectly supported by the first horizontal mover. Similarly, the second holder is indirectly supported by the second horizontal mover.

The first horizontal mover is movable in the longitudinal direction relative to the first heat-treating units. The first holder is therefore movable in the longitudinal direction relative to the first heat-treating units. The first arm is rotatable about a first axis relative to the first horizontal mover. The first holder is thus rotatable about the first axis relative to the first horizontal mover. The first holder can therefore conveniently access the first heat-treating units. Similarly, the second holder can conveniently access the second heat-treating units.

In plan view, the position of the first axis relative to the first horizontal mover is constant. Consequently, the first arm is supported by a simple construction on the first horizontal mover. The first holder is fixed to the first arm. Further, in plan view, the distance between the first holder and first axis is constant. Consequently, the first holder is supported by a simple construction on the first arm. Thus, the construction of the first transport mechanism is simple. An installation space for the first transport mechanism in plan view can therefore be reduced effectively. Consequently, the area of the transporting space in plan view can be reduced effectively. Similarly, the construction of the second transport mechanism is simple. An installation space for the second transport mechanism in plan view can therefore be reduced effectively. Consequently, the area of the transporting space in plan view can be reduced with increased effect.

In the above substrate treating apparatus, it is preferred that the first holder is configured to move the substrates thereby held linearly in the transverse direction toward the first heat-treating units when the first arm rotates about the first axis while the first horizontal mover moves in the longitudinal direction; and the second holder is configured to move the substrates thereby held linearly in the transverse direction toward the second heat-treating units when the second arm rotates about the second axis while the second horizontal mover moves in the longitudinal direction. When the first horizontal mover moves in the longitudinal direction, the first holder will make parallel translation in the longitudinal direction. When the first arm rotates about the first axis, the first holder will rotate about the first axis. When the first horizontal mover and first arm make simultaneous parallel movement, the first holder will rotate about the first axis while making parallel movement in the longitudinal direction. Consequently, the substrates held by the first holder will be linearly moved in the transverse direction. Further, the substrates held by the first holder will be moved toward the first heat-treating units. Therefore, even if the length in the longitudinal direction of one first heat-treating unit is short, the first transport mechanism can conveniently transport the substrates to the first heat-treating unit. Further, when the second arm rotates about the second axis while the second horizontal mover moves in the longitudinal direction, the substrates held by the second holder will be linearly moved in the transverse direction toward the second heat-treating units. Therefore, even if the length in the longitudinal direction of one second heat-treating unit is short, the second transport mechanism can conveniently transport the substrates to the second heat-treating unit.

In the above substrate treating apparatus, it is preferred that each of the first heat-treating units has a length in the longitudinal direction which is at most three times a radius of the substrates; and each of the second heat-treating units has a length in the longitudinal direction which is at most three times the radius of the substrates. The length in the longitudinal direction of each of the first heat-treating units does not exceed three times the radius of the substrates. Thus, the size of the first heat-treating units is relatively small. The installation space of the first heat-treating units can therefore be reduced conveniently. The length in the longitudinal direction of each of the second heat-treating units does not exceed three times the radius of the substrates. Thus, the size of the second heat-treating units is relatively small. The installation space of the second heat-treating units can therefore be reduced conveniently.

Even where the first transport mechanism has the simple construction noted above, the first transport mechanism can transport substrates linearly in the transverse direction toward the first heat-treating units. Consequently, the first transport mechanism having the above simple construction is conveniently applicable to the relatively small first heat-treating units. And the footprint of the substrate treating apparatus can be effectively reduced by applying the first transport mechanism having the above simple construction to the relatively small first heat-treating units. Similarly, the footprint of the substrate treating apparatus can be effectively reduced by applying the second transport mechanism having the above simple construction to the relatively small second heat-treating units.

In the above substrate treating apparatus, it is preferred that the first heat-treating units have first imaginary central points located centrally thereof, respectively; a distance between two first imaginary central points adjacent each other in the longitudinal direction being at most three times a radius of the substrates; and the second heat-treating units have second imaginary central points located centrally thereof, respectively; a distance between two second imaginary central points adjacent each other in the longitudinal direction being at most three times the radius of the substrates. The distance between two first central points adjoining in the longitudinal direction does not exceed three times the radius of substrates. Thus, the distance between the two first central points adjoining in the longitudinal direction is relatively small. Consequently, the size of the first heat-treating units is relatively small, and two first heat-treating units aligned in the longitudinal direction are close to each other. The installation space of the first heat-treating units can therefore be reduced conveniently. That is, the installation space of the first heat-treating section can be reduced conveniently. Similarly, the distance between two second central points adjoining in the longitudinal direction does not exceed three times the radius of substrates. Thus, the size of the second heat-treating units is relatively small, and two second heat-treating units aligned in the longitudinal direction are close to each other. The installation space of the second heat-treating units can therefore be reduced conveniently. That is, the installation space of the second heat-treating section can be reduced conveniently. Consequently, the footprint of the substrate treating apparatus can be reduced.

The footprint of the substrate treating apparatus can be effectively reduced by applying the first transport mechanism having the simple construction to the space-saving first heat-treating section. Similarly, the footprint of the substrate treating apparatus can be effectively reduced by applying the second transport mechanism having the simple construction to the space-saving second heat-treating section.

In the above substrate treating apparatus, it is preferred that the transporting space has a length in the transverse direction which is at most five times a radius of the substrates. This realizes a reduction in the area of the transporting space in plan view. The footprint (installation area) of the substrate treating apparatus can therefore be reduced.

In the above substrate treating apparatus, it is preferred that the heat treatment the first heat-treating section performs on the substrates includes pretreatment which is heat treatment performed on the substrate before solution treatment; and posttreatment which is heat treatment performed on the substrates after the solution treatment; and the heat treatment the second heat-treating section performs on the substrates includes the pretreatment, and the posttreatment. Each of the first heat-treating section and second heat-treating section performs pretreatment on substrates before solution treatment. Thus, the pretreatment can be performed efficiently on the substrates. Each of the first heat-treating section and second heat-treating section performs posttreatment on substrates after solution treatment. Thus, the posttreatment can be performed efficiently on the substrates.

In the above substrate treating apparatus, it is preferred that the heat treatment the first heat-treating section performs on the substrates includes hydrophobizing treatment, and heating treatment; and the heat treatment the second heat-treating section performs on the substrates includes the hydrophobizing treatment, and the heating treatment. Each of the first heat-treating section and second heat-treating section performs hydrophobizing treatment on substrates. Thus, the hydrophobizing treatment can be performed efficiently on the substrates. Each of the first heat-treating section and second heat-treating section performs heating treatment on substrates. Thus, the heating treatment can be performed efficiently on the substrates.

In the above substrate treating apparatus, it is preferred that the heat treatment the second heat-treating section performs on the substrates is the same as the heat treatment the first heat-treating section performs on the substrates. This can efficiently perform the heat treatment on the substrates.

It is preferred that the above substrate treating apparatus further comprises a first front rack disposed forward of the first transport mechanism for allowing the first transport mechanism to place the substrates thereon; and a second front rack disposed forward of the second transport mechanism for allowing the second transport mechanism to place the substrates thereon; wherein the first front rack and the second front rack are aligned in an up-down direction; and the second front rack overlaps the first front rack in plan view. The first rack and second rack are aligned in the up-down direction. The second rack overlaps the first rack in plan view. This realizes a reduction in the installation space of the first rack and second rack in plan view. The footprint of the substrate treating apparatus can therefore be reduced.

It is preferred that the above substrate treating apparatus further comprises a solution treating section for performing solution treatment on the substrates; wherein the solution treating section is located outside an area where the first transport mechanism can transport the substrates, and is located outside an area where the second transport mechanism can transport the substrates. The solution treating section is located in a position inaccessible to the first transport mechanism. The first transport mechanism does not therefore transport the substrates to the solution treating section. This can conveniently prevent an excessively large transport load of substrates falling on the first transport mechanism. The solution treating section is located in a position inaccessible to the second transport mechanism. The second transport mechanism does not therefore transport the substrates to the solution treating section. This can conveniently prevent an excessively large transport load of substrates falling on the second transport mechanism.

It is preferred that the above substrate treating apparatus further comprises a solution treating transport mechanism disposed rearward of the first transport mechanism and the second transport mechanism for transporting the substrates to the solution treating section; wherein the solution treating section is located in a position adjoining the solution treating transport mechanism. The substrate treating apparatus includes the solution treating transport mechanism. Consequently, substrates can conveniently be transported to the solution treating section. The solution treating transport mechanism is located rearward of the first transport mechanism. Consequently, the first transport mechanism can conveniently be prevented from interfering with the solution treating transport mechanism. The solution treating transport mechanism is located rearward of the second transport mechanism. Consequently, the second transport mechanism can conveniently be prevented from interfering with the solution treating transport mechanism. The solution treating section is located in a position adjoining the solution treating transport mechanism. Consequently, the solution treating transport mechanism can easily access the solution treating section.

It is preferred that the above substrate treating apparatus further comprises a third transport mechanism disposed in the transporting space for transporting the substrates; a fourth transport mechanism disposed in the transporting space for transporting the substrates; a third heat-treating section for performing heat treatment on the substrates; and a fourth heat-treating section for performing heat treatment on the substrates; wherein the third heat-treating section, the transporting space, and the fourth heat-treating section are aligned in the stated order in the transverse direction; the third transport mechanism and the fourth transport mechanism are arranged above the first transport mechanism and the second transport mechanism; the third heat-treating section overlaps the first heat-treating section in plan view; the fourth heat-treating section overlaps the second heat-treating section in plan view; the third heat-treating section includes a plurality of third heat-treating units arranged in the longitudinal direction, each for performing heat treatment on one substrate; the fourth heat-treating section includes a plurality of fourth heat-treating units arranged in the longitudinal direction, each for performing heat treatment on one substrate; the third transport mechanism is configured to transport the substrates to the third heat-treating units; and the fourth transport mechanism is configured to transport the substrates to the fourth heat-treating units. The third transport mechanism and fourth transport mechanism are arranged above the first transport mechanism and second transport mechanism. This can reduce the installation space in plan view of the first transport mechanism, second transport mechanism, third transport mechanism, and fourth transport mechanism. In other words, the installation area in plan view of the transporting space can be reduced. The third heat-treating section overlaps the first heat-treating section in plan view. This can reduce the installation space of the first heat-treating section and third heat-treating section in plan view. The fourth heat-treating section overlaps the second heat-treating section in plan view. This can reduce the installation space of the second heat-treating section and fourth heat-treating section in plan view. The third heat-treating section and transporting space are aligned in the transverse direction. The third heat-treating section has a plurality of third heat-treating units. Each of the third heat-treating units performs heat treatment on one substrate. The third transport mechanism transports substrates to the third heat-treating units. The fourth heat-treating section and transporting space are aligned in the transverse direction. More particularly, the transporting space is located in the transverse direction between the third heat-treating section and fourth heat-treating section. The fourth heat-treating section has a plurality of fourth heat-treating units. Each of the fourth heat-treating units performs heat treatment on one substrate. The fourth transport mechanism transports substrates to the fourth heat-treating units. The third heat-treating units are aligned in the longitudinal direction.

Consequently, the number of third heat-treating units included in the third heat-treating section can be increased relatively easily. The third heat-treating section can therefore perform heat treatment in parallel on a relatively large number of substrates. The fourth heat-treating units are aligned in the longitudinal direction. Consequently, the number of fourth heat-treating units included in the fourth heat-treating section can be increased relatively easily. The fourth heat-treating section can therefore perform heat treatment in parallel on a relatively large number of substrates. Thus, the throughput of the substrate treating apparatus can be improved conveniently.

In the above substrate treating apparatus, it is preferred that the heat treatment the second heat-treating section performs on the substrates is the same as the heat treatment the first heat-treating section performs on the substrates; the heat treatment the third heat-treating section performs on the substrates is the same as the heat treatment the first heat-treating section performs on the substrates; and the heat treatment the fourth heat-treating section performs on the substrates is the same as the heat treatment the first heat-treating section performs on the substrates. This can efficiently perform heat treatment on the substrates.

It is preferred that the above substrate treating apparatus further comprises a first front rack disposed forward of the first transport mechanism for allowing the first transport mechanism to place the substrates thereon; a second front rack disposed forward of the second transport mechanism for allowing the second transport mechanism to place the substrates thereon; a third front rack disposed forward of the third transport mechanism for allowing the third transport mechanism to place the substrates thereon; and a fourth front rack disposed forward of the fourth transport mechanism for allowing the fourth transport mechanism to place the substrates thereon; wherein the first front rack, the second front rack, the third front rack, and the fourth front rack are aligned in an up-down direction; the second front rack overlaps the first front rack in plan view; the third front rack overlaps the first front rack in plan view; and the fourth front rack overlaps the first front rack in plan view. The first front rack, second front rack, third front rack, and fourth front rack are aligned in the up-down direction. The second front rack overlaps the first front rack in plan view. The third front rack overlaps the first front rack in plan view. The fourth front rack overlaps the first front rack in plan view. This can reduce the installation space of the first front rack, second front rack, third front rack, and fourth front rack in plan view. Thus, the footprint of the substrate treating apparatus can be reduced.

It is preferred that the above substrate treating apparatus further comprises an indexer's transport mechanism disposed forward of the first front rack, the second front rack, the third front rack, and the fourth front rack; wherein the indexer's transport mechanism is configured to transport the substrates between a carrier storing the substrates and the first front rack; transport the substrates between the carrier and the second front rack; transport the substrates between the carrier and the third front rack; and transport the substrates between the carrier and the fourth front rack. The indexer's transport mechanism transports substrates between the carrier and first front rack. Consequently, substrates can be transported between the indexer's transport mechanism and first transport mechanism through the first front rack. Similarly, the indexer's transport mechanism transports substrates between the carrier and second front rack. Consequently, substrates can be transported between the indexer's transport mechanism and second transport mechanism through the second front rack. The indexer's transport mechanism transports substrates between the carrier and third front rack. Consequently, substrates can be transported between the indexer's transport mechanism and third transport mechanism. The indexer's transport mechanism transports substrates between the carrier and fourth front rack. Consequently, substrates can be transported between the indexer's transport mechanism and fourth transport mechanism through the fourth front rack.

It is preferred that the above substrate treating apparatus further comprises a solution treating section for performing solution treatment on the substrates; wherein the solution treating section is located outside an area where the first transport mechanism can transport the substrates; located outside an area where the second transport mechanism can transport the substrates; located outside an area where the third transport mechanism can transport the substrates; and located outside an area where the fourth transport mechanism can transport the substrates. The solution treating section is located in a position inaccessible to the first transport mechanism. The first transport mechanism does not therefore transport substrates to the solution treating section. This can conveniently prevent an excessively large transport load of substrates falling on the first transport mechanism. Similarly, the solution treating section is located in a position inaccessible to the second transport mechanism. The second transport mechanism does not therefore transport substrates to the solution treating section. This can conveniently prevent an excessively large transport load of substrates falling on the second transport mechanism. The solution treating section is located in a position inaccessible to the third transport mechanism. The third transport mechanism does not therefore transport substrates to the solution treating section. This can conveniently prevent an excessively large transport load of substrates falling on the third transport mechanism. The solution treating section is located in a position inaccessible to the fourth transport mechanism.

The fourth transport mechanism does not therefore transport substrates to the solution treating section. This can conveniently prevent an excessively large transport load of substrates falling on the fourth transport mechanism.

It is preferred that the above substrate treating apparatus further comprises a solution treating transport mechanism disposed rearward of the first transport mechanism, the second transport mechanism, the third transport mechanism, and the fourth transport mechanism for transporting the substrates to the solution treating section; wherein the solution treating section is located in at least one of a position to align with the solution treating transport mechanism in the transverse direction and a position rearward of the solution treating transport mechanism. The substrate treating apparatus includes a solution treating transport mechanism. This can conveniently transport substrates to the solution treating section. The solution treating transport mechanism is located rearward of the first transport mechanism. Consequently, the first transport mechanism can conveniently be prevented from interfering with the solution treating transport mechanism. Similarly, the solution treating transport mechanism is located rearward of the second transport mechanism, third transport mechanism, and fourth transport mechanism. Consequently, the second transport mechanism, third transport mechanism, and fourth transport mechanism can conveniently be prevented from interfering with the solution treating transport mechanism. The solution treating section is located in at least one of a position aligning with the solution treating transport mechanism in the transverse direction and a position rearward of the solution treating transport mechanism. The solution treating transport mechanism can therefore easily access the solution treating section.

It is preferred that the above substrate treating apparatus further comprises a first rear rack disposed rearward of the first transport mechanism and forward of the solution treating transport mechanism for allowing the first transport mechanism and the solution treating transport mechanism to place the substrates thereon; a second rear rack disposed rearward of the second transport mechanism and forward of the solution treating transport mechanism for allowing the second transport mechanism and the solution treating transport mechanism to place the substrates thereon; a third rear rack disposed rearward of the third transport mechanism and forward of the solution treating transport mechanism for allowing the third transport mechanism and the solution treating transport mechanism to place the substrates thereon; and a fourth rear rack disposed rearward of the fourth transport mechanism and forward of the solution treating transport mechanism for allowing the fourth transport mechanism and the solution treating transport mechanism to place the substrates thereon; wherein the first rear rack, the second rear rack, the third rear rack, and the fourth rear rack are aligned in an up-down direction; the second rear rack overlaps the first rear rack in plan view; the third rear rack overlaps the first rear rack in plan view; and the fourth rear rack overlaps the first rear rack in plan view. The first rear rack, second rear rack, third rear rack, and fourth rear rack are aligned in the up-down direction. The second rear rack overlaps the first rear rack in plan view. The third rear rack overlaps the first rear rack in plan view. The fourth rear rack overlaps the first rear rack in plan view. This can reduce the installation space of the first rear rack, second rear rack, third rear rack, and fourth rear rack in plan view. Thus, the footprint of the substrate treating apparatus can be reduced. The first transport mechanism and solution treating transport mechanism can place substrates on the first rear rack. Consequently, substrates can be transported between the first transport mechanism and solution treating transport mechanism through the first rear rack. Similarly, the second transport mechanism and solution treating transport mechanism can place substrates on the second rear rack. Consequently, substrates can be transported between the second transport mechanism and solution treating transport mechanism through the second rear rack. The third transport mechanism and solution treating transport mechanism can place substrates on the third rear rack. Consequently, substrates can be transported between the third transport mechanism and solution treating transport mechanism through the third rear rack. The fourth transport mechanism and solution treating transport mechanism can place substrates on the fourth rear rack. Consequently, substrates can be transported between the fourth transport mechanism and solution treating transport mechanism through the fourth rear rack.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 12A is a plan view of a movable member, FIG. 12B is a front view of the movable member, and FIG. 12C is a right side view of the movable member.

DESCRIPTION OF THE PREFERRED EMBODIMENTS

A substrate treating apparatus of this invention will be described hereinafter with reference to the drawings.

<Outline of Substrate Treating Apparatus>

Figure 1:
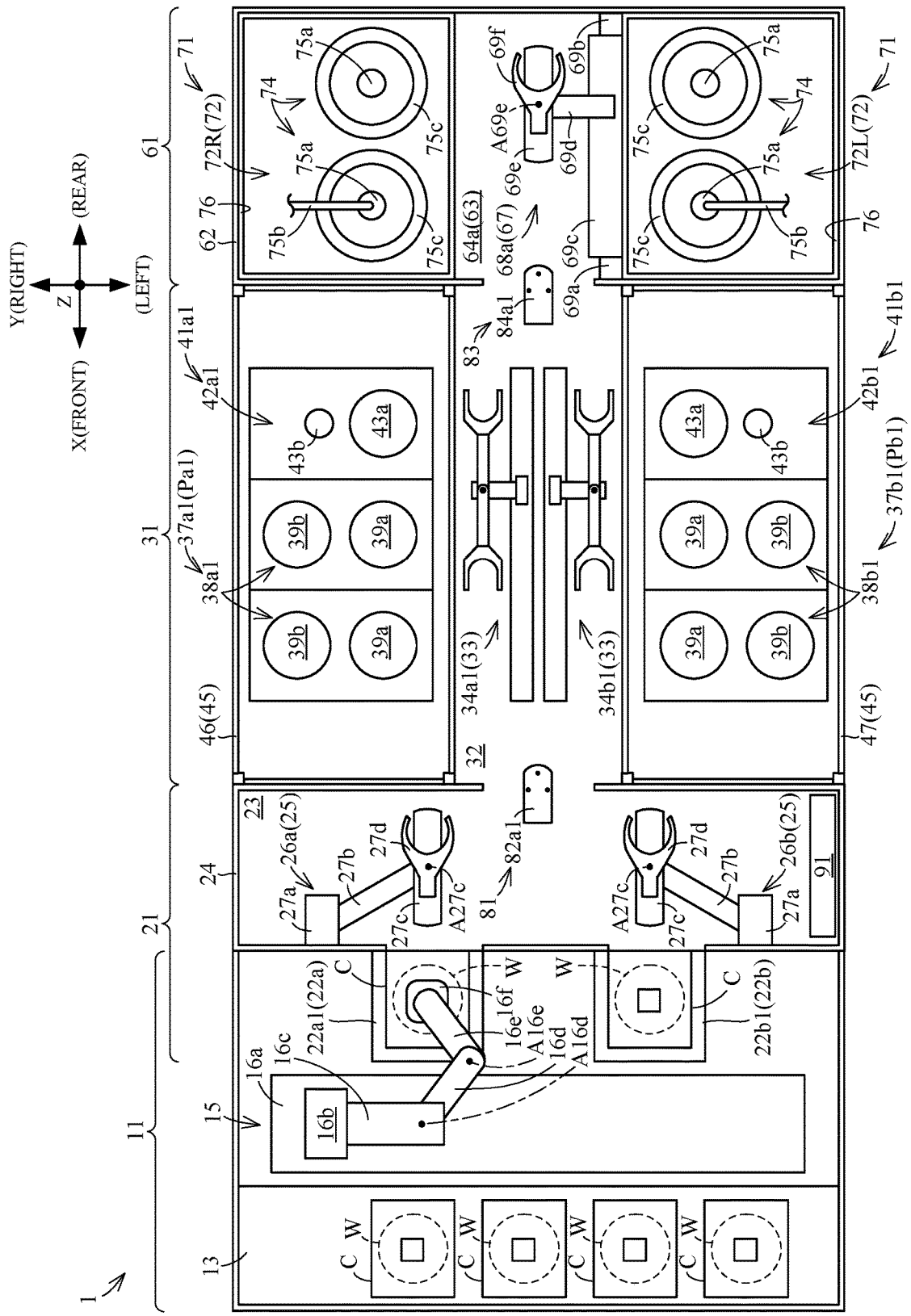
FIG. 1 is a plan view of a substrate treating apparatus in an embodiment.

FIG. 1 is a plan view of a substrate treating apparatus in an embodiment. A substrate treating apparatus 1 in the embodiment performs treatment on substrates (e.g. semiconductor wafers) W.

The substrates W are, for example, semiconductor wafers, substrates for liquid crystal displays, substrates for organic EL (Electroluminescence), substrates for FPDs (Flat Panel Displays), substrates for optical displays, substrates for magnetic disks, substrates for optical disks, substrates for magneto-optical disks, substrates for photomasks, or the substrates for solar cells. The substrates or wafers W have a thin flat shape. The wafers W have a substantially circular shape in plan view.

The substrate treating apparatus 1 includes a stocker division 11, an indexer division 21, a heat-treating block 31, and a solution treating block 61. The stocker division 11 stocks a plurality of carriers C. Each carrier C holds a plurality of wafers W. The carriers C are FOUPs (front opening unified pods), for example. The indexer division 21 unloads the wafers W from the carriers C and loads the wafers W into the carriers C. The heat-treating block 31 performs heat treatment on the wafers W. The solution treating block 61 performs solution treatment on the wafers W.

The stocker division 11 is connected to the indexer division 21. The carriers C are transported between the stocker division 11 and indexer division 21. The indexer division 21 is connected to the heat-treating block 31. The wafers W are transported between the indexer division 21 and heat-treating block 31. The heat-treating block 31 is connected to the solution treating block 61. The wafers W are transported between the heat-treating block 31 and solution treating block 61

The stocker division 11, indexer division 21, heat-treating block 31, and solution treating block 61 are arranged in this order in a row. The direction in which the stocker division 11, indexer division 21, heat-treating block 31, and solution treating block 61 are arranged in a row will be called the "longitudinal direction X". The longitudinal direction X is horizontal. Of the longitudinal direction X, the direction pointing to the stocker division 11 from the solution treating block 61 will be called "forward". The direction opposite to forward will be called "rearward". A horizontal direction perpendicular to the longitudinal direction X will be called the "transverse direction Y" or "sideways". One direction of the "transverse direction Y" will be called "rightward" as appropriate. The direction opposite to rightward will be called "leftward". The vertical direction will be called the "up-down direction Z". The up-down direction Z is perpendicular to the longitudinal direction X and also perpendicular to the transverse direction Y. For reference, the drawings show front, rear, right, left, up, and down, as appropriate.

The substrate treating apparatus 1 further includes a front rack 81 and a rear rack 83. The front rack 81 is located between the indexer division 21 and heat-treating block 31. The front rack 81 receives wafers W placed thereon. The wafers W are transported between the indexer division 21 and heat-treating block 31 through the front rack 81. The rear rack 83 is located between the heat-treating block 31 and solution treating block 61. The rear rack 83 receives wafers W placed thereon. The wafers W are transported between the heat-treating block 31 and solution treating block 61 through the rear rack 83.

The stocker division 11, indexer division 21, heat-treating block 31, solution treating block 61, front rack 81, and rear rack 83 will be described hereinafter.

<Stocker Division 11>

Figure 2:
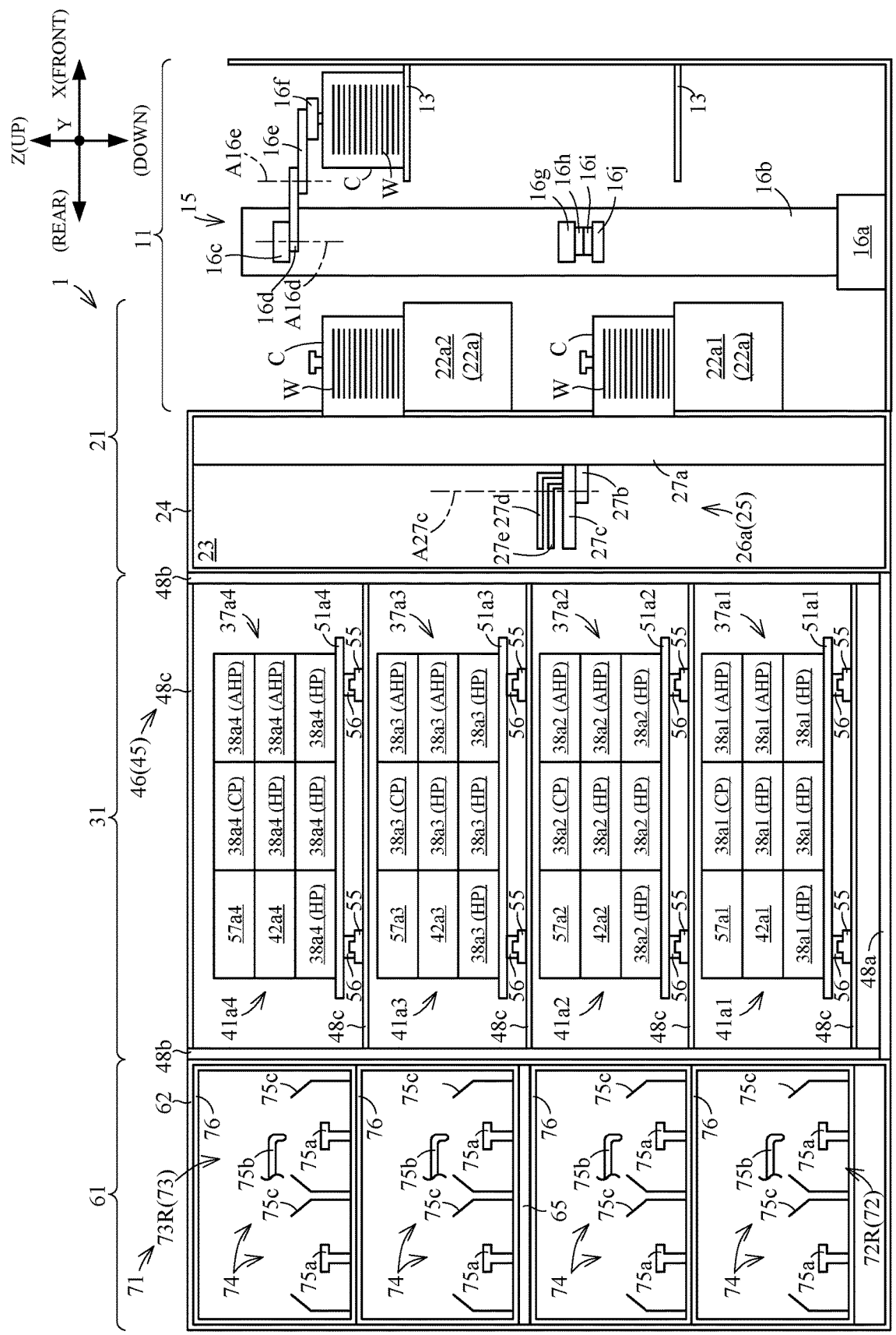
FIG. 2 is a right side view showing a construction of a right part of the substrate treating apparatus.
Figure 3:
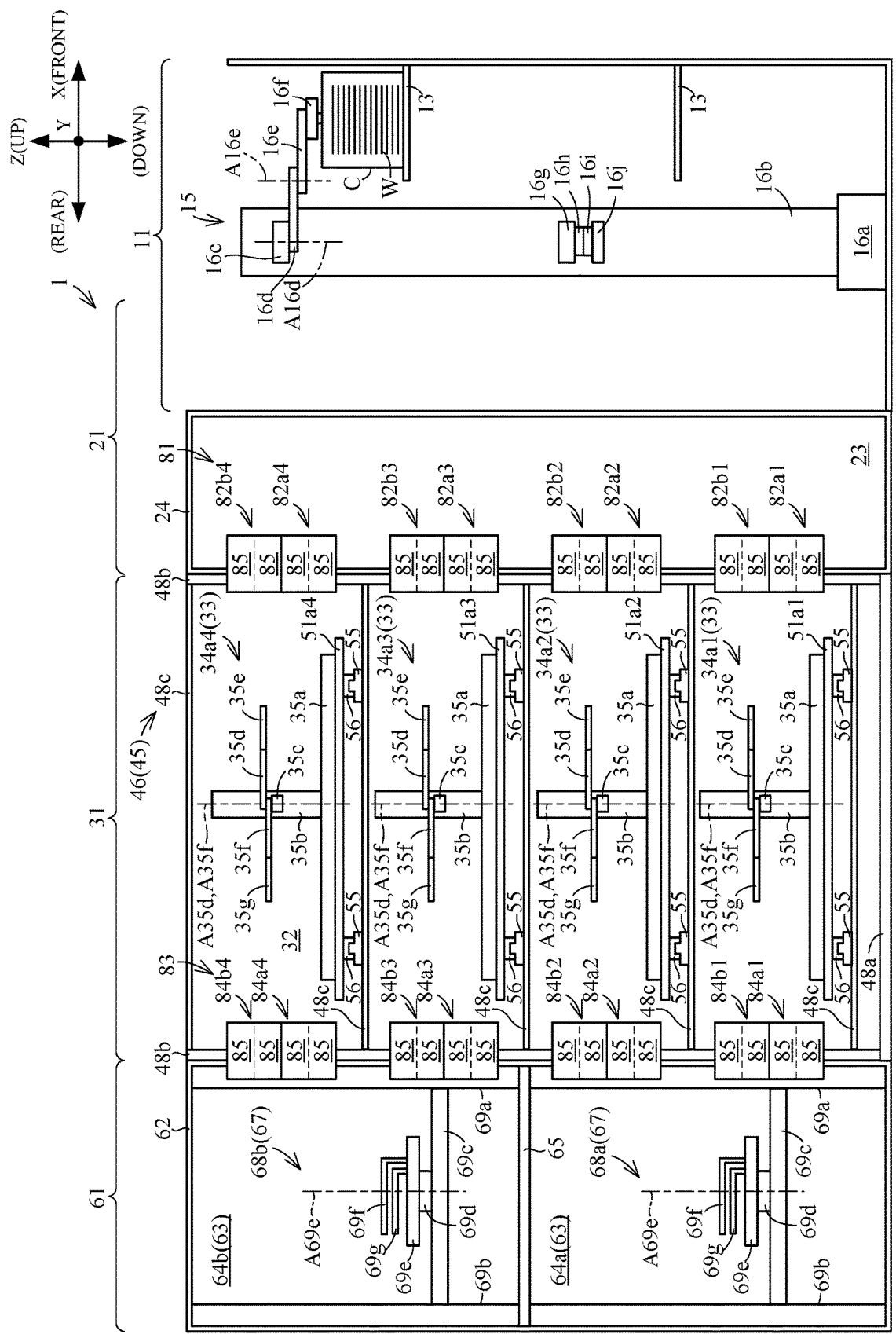
FIG. 3 is a right side view showing a construction of a middle part in a transverse direction of the substrate treating apparatus.
Figure 4:
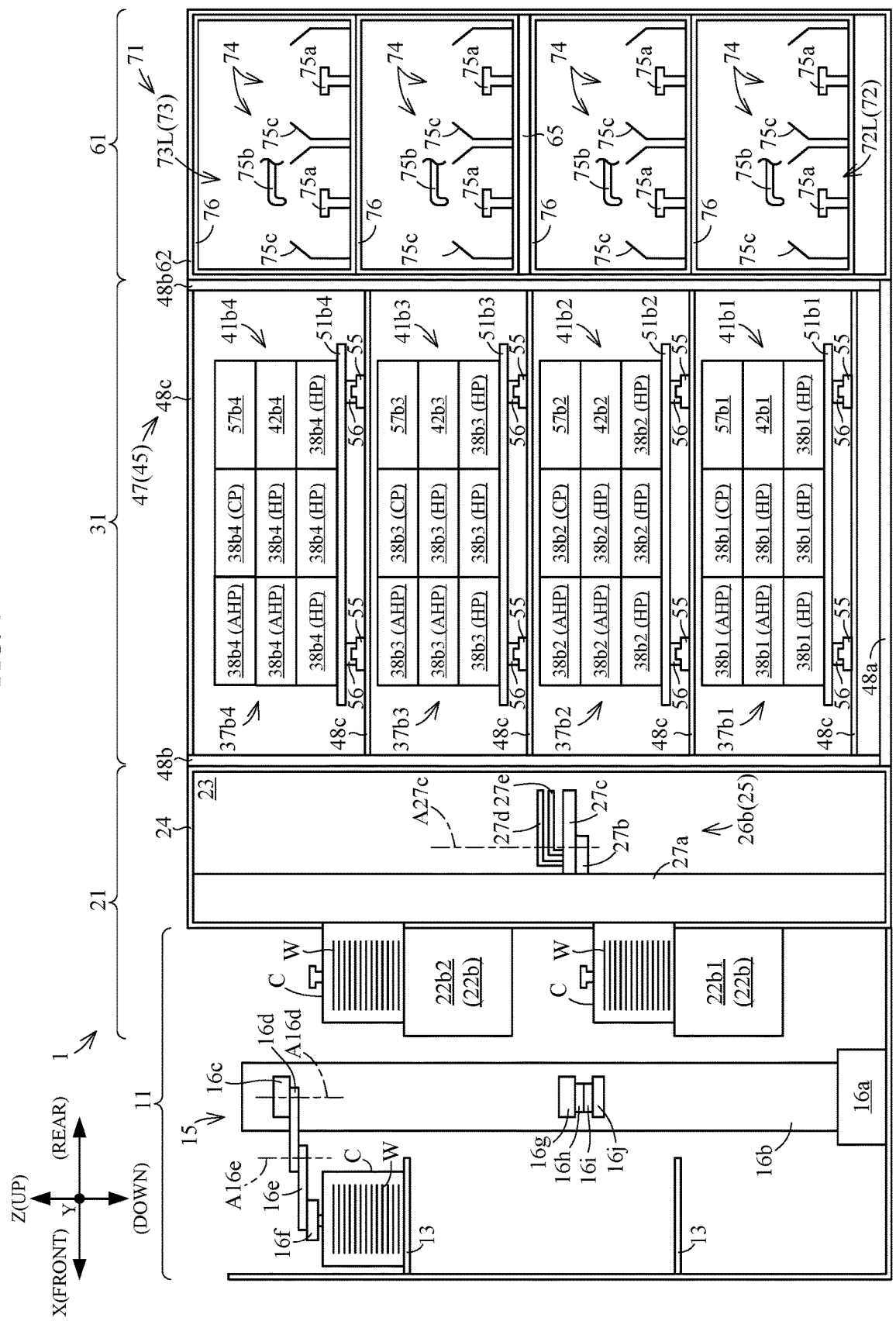
FIG. 4 is a left side view showing a construction of a left part of the substrate treating apparatus.

Reference is made to FIGS. 1-4. FIG. 2 is a right side view showing a construction of a right part of the substrate treating apparatus 1. FIG. 3 is a right side view showing a construction of a middle part in the transverse direction Y of the substrate treating apparatus 1. FIG. 4 is a left side view showing a construction of a left part of the substrate treating apparatus 1.

The stocker division 11 has a plurality of shelves 13. Each shelf 13 receives a plurality of carriers C placed thereon. The shelves 13 have a substantially horizontal plate shape. The shelves 13 are aligned in the up-down direction Z.

The carriers C can be classified into some groups according to situations of the carriers C. For example, the carriers C are classified into carriers C (which will be called "the former carriers C") transferred between the stocker division 11 and an external transport mechanism not shown, and other carriers C (which will be called "the latter carriers C"). Here, the external transport mechanism is an external device of the substrate treating apparatus 1. The external transport mechanism transports carriers C. The external transport mechanism is disposed above the stocker division 11. The external transport mechanism is an OHT (Overhead Hoist Transfer), for example. The former carriers C are further classified into carriers C which the stocker division 11 receives from the external transport mechanism, and carriers C which the stocker division 11 passes on to the external transport mechanism. The latter carriers C are further classified into carriers C which hold wafers W to be treated, carriers C which are empty of wafers W, and carriers C which hold treated wafers W.

The positions on the shelves in which the carriers C are placed may be varied according to the above groups of carriers C.

The stocker division 11 includes a carrier transport mechanism 15 for transporting the carriers C. The carrier transport mechanism 15 is located between the shelves 13 and indexer division 21. The carrier transport mechanism 15 can place the carriers C on the shelves 13, and can take the carriers C from the shelves 13. Further, the carrier transport mechanism 15 can transport the carriers C between the shelves 13 and indexer division 21.

The carrier transport mechanism 15 has a rail 16a, a horizontal mover 16b, a vertical mover 16c, a first arm 16d, a second arm 16e, and a holder 16f. The rail 16a is provided fixedly. The rail 16a extends substantially in the transverse direction Y. The horizontal mover 16b is supported by the rail 16a. The horizontal mover 16b extends substantially in the up-down direction Z. The horizontal mover 16b is movable substantially in the transverse direction Y relative to the rail 16a. The vertical mover 16c is supported by the horizontal mover 16b. The vertical mover 16c is movable substantially in the up-down direction Z relative to the horizontal mover 16b. The first arm 16d is supported by the vertical mover 16c. The first arm 16d is rotatable about an axis of rotation A16d relative to the vertical mover 16c. The axis of rotation A16d is an imaginary line substantially parallel to the up-down direction Z. The second arm 16e is supported by the first arm 16d. The second arm 16e is rotatable about an axis of rotation A16e relative to the first axis 16d. The axis of rotation A16e is an imaginary line substantially parallel to the up-down direction Z. The holder 16f is supported by the second arm 16e. The holder 16f holds one carrier C. Specifically, the holder 16f grips an upper part of the carrier C.

Reference is made to FIGS. 2-4. The carrier transport mechanism 15 further includes a vertical mover 16g, a first arm 15h, a second arm 16i, and a holder 16j. The vertical mover 16g, first arm 15h, second arm 16i, and holder 16j have substantially the same shapes and constructions as the vertical mover 16c, first arm 15d, second arm 16e, and holder 16f, respectively. The vertical mover 16g is supported by the horizontal mover 16b. The vertical mover 16g is operable independently of the vertical mover 16c. The first arm 16h is supported by the vertical mover 16g. The second arm 16i is supported by the first arm 16h. The holder 16j is supported by the second arm 16i.

<Indexer Division 21>

Figure 5:
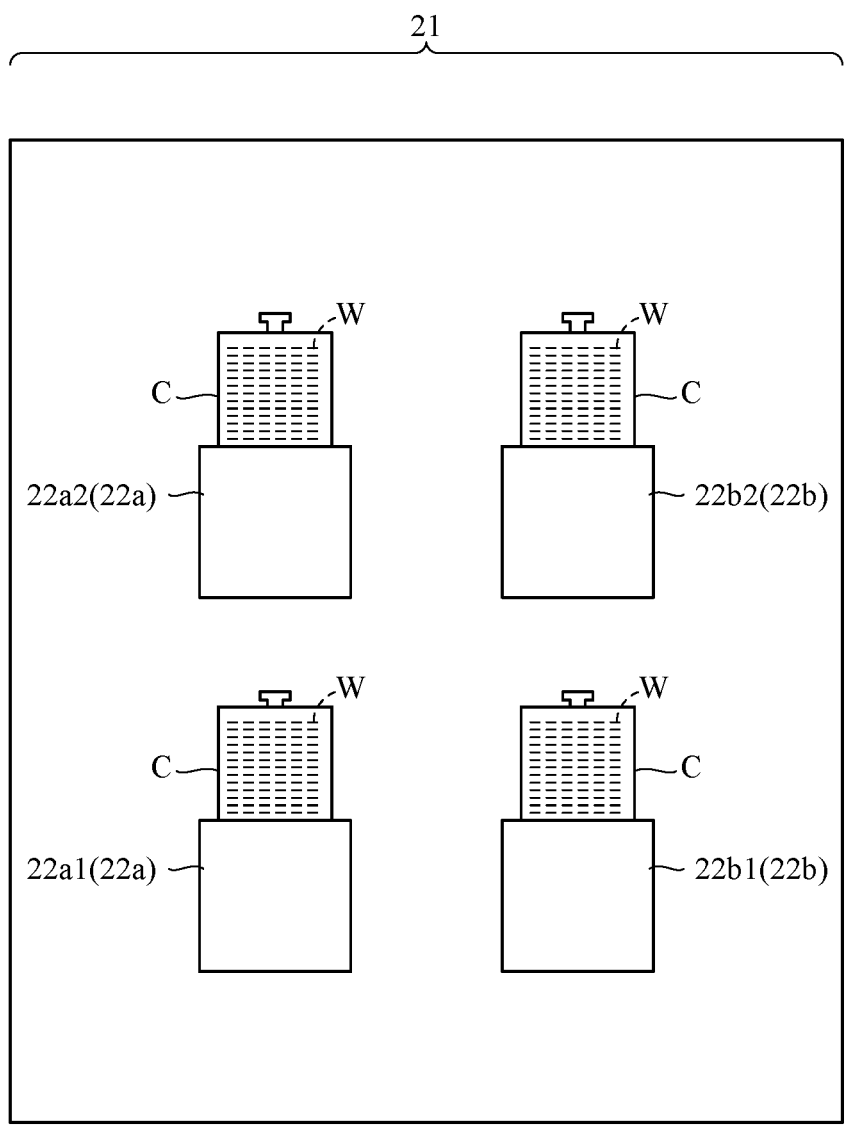
FIG. 5 is a front view of an indexer division.
Figure 5:
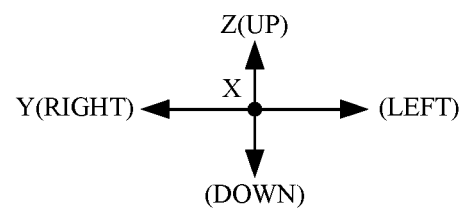

Reference is made to FIGS. 1-5. FIG. 5 is a front view of the indexer division 21. The indexer division 21 includes carrier racks 22a1, 22a2, 22b1 and 22b2. Each of the carrier racks 22a1, 22a2, 22b1 and 22b2 receives one carrier C placed thereon.

The carrier racks 22a1 and 22a2 are aligned in the up-down direction Z. The carrier rack 22a2 is located above the carrier rack 22a1. The carrier racks 22b1 and 22b2 are aligned in the up-down direction Z. The carrier rack 22b2 is located above the carrier rack 22b1. The carrier rack 22a1 is located in substantially the same height position as the carrier rack 22b1. The carrier racks 22a1 and 22b1 are aligned in the transverse direction Y. The carrier rack 22a1 is located rightward of the carrier rack 22b1. The carrier rack 22a2 is located in substantially the same height position as the carrier rack 22b2. The carrier racks 22a2 and 22b2 are aligned in the transverse direction Y. The carrier rack 22a2 is located rightward of the carrier rack 22b2.

The carrier racks 22a1 and 22a2, when not distinguished, will be written "carrier racks 22a". The carrier racks 22b1 and 22b2, when not distinguished, will be written "carrier racks 22b".

The carrier racks 22a and 22b are arranged rearward of the carrier transport mechanism 15. The carrier transport mechanism 15 can place carriers C on the carrier racks 22a and 22b. The carrier transport mechanism 15 can take carriers C from the carrier racks 22a and 22b.

Figure 6:
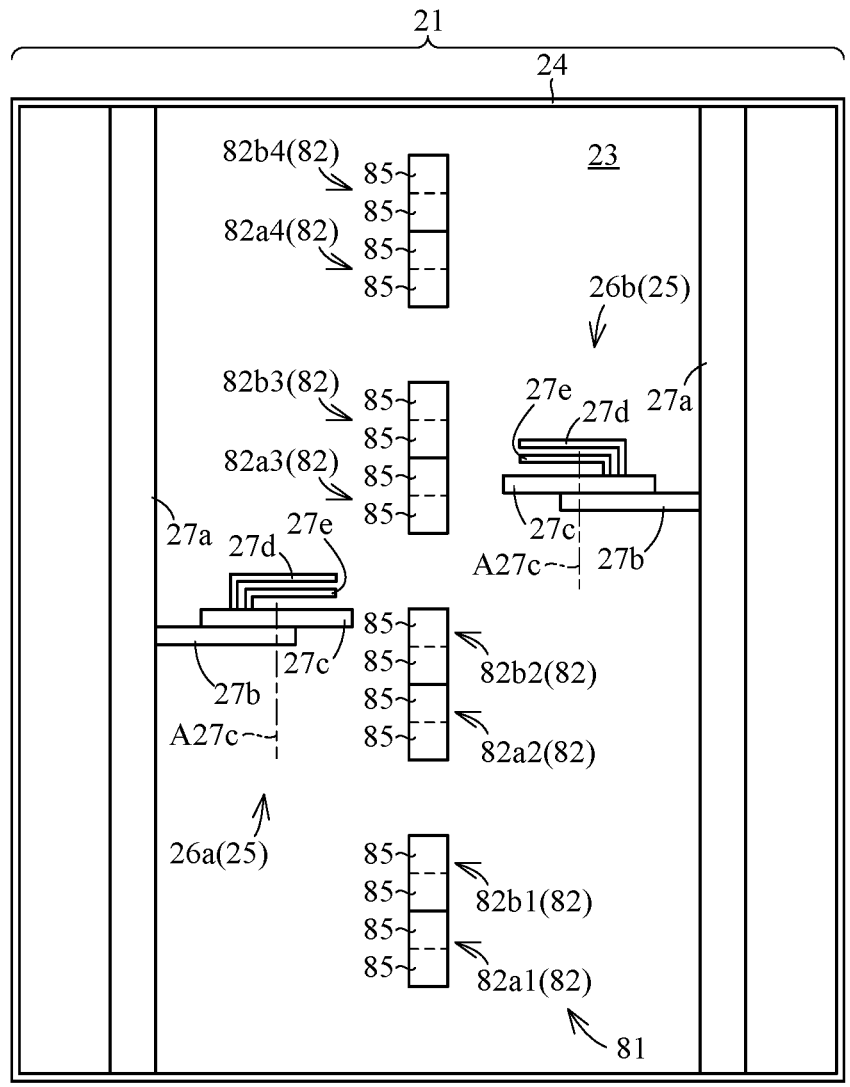
FIG. 6 is a front view showing a construction inside the indexer division.
Figure 6:
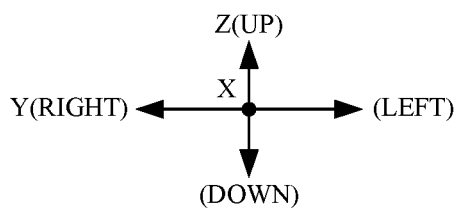

Reference is made to FIGS. 1-4 and 6. FIG. 6 is a front view showing a construction inside the indexer division 21. The indexer division 21 has a transporting space 23. The transporting space 23 is located rearward of the carrier racks 22a and 22b. The transporting space 23 is substantially box-shaped. The transporting space 23 is substantially rectangular in plan view, side view, and front view.

The indexer division 21 has a frame 24. The frame 24 is provided as a framework (skeletal structure) for the transporting space 23. The frame 24 demarcates the shape of the transporting space 23. The frame 24 is formed of metal, for example.

The indexer division 21 has an indexer's transport mechanism 25. The indexer's transport mechanism 25 is installed in the transporting space 23. The indexer's transport mechanism 25 transports wafers W between the carriers C placed on the carrier racks 22a and 22b and the heat-treating block 31.

The indexer's transport mechanism 25 includes two transport mechanisms 26a and 26b. The transport mechanism 26b is located in substantially the same height position as the transport mechanism 26a. The transport mechanism 26a and transport mechanism 26b are aligned in the transverse direction Y. The transport mechanism 26b is located leftward of the transport mechanism 26a. The transport mechanism 26a is located rearward of the carrier racks 22a. The transport mechanism 26b is located rearward of the carrier racks 22b. The transport mechanism 26a transports wafers W between the carriers C placed on the carrier racks 22a and the heat-treating block 31. The transport mechanism 26b transports wafers W between the carriers C placed on the carrier racks 22b and the heat-treating block 31. The transport mechanism 26b can transport wafers W independently of the transport mechanism 26a.

The transport mechanism 26a has a strut 27a, a vertical mover 27b, a rotating element 27c, and holders 27d and 27e. The strut 27a is supported by the frame 24. The strut 27a is fixed to the frame 24. The strut 27a is immovable relative to the frame 24. The strut 27a extends substantially in the up-down direction Z. The vertical mover 27b is supported by the strut 27a. The vertical mover 27b is movable substantially in the up-down direction Z relative to the strut 27a. The vertical mover 27b is substantially horizontally immovable relative to the strut 27a. The rotating element 27c is supported by the vertical mover 27b. The rotating element 27c is rotatable about an axis of rotation A27c relative to the vertical mover 27b. The axis of rotation A27c is an imaginary line substantially parallel to the up-down direction Z. The holders 27d and 27e are supported by the rotating element 27c. The holders 27d and 27e can advance and withdraw relative to the rotating element 27c. More particularly, the holders 27d and 27e are reciprocable along one horizontal direction determined by a rotational position of the rotating element 27c. The one horizontal direction is a radial direction of the axis of rotation A27c, for example. The holders 27d and 27e can advance and withdraw independently of each other. Each of the holders 27d and 27e holds one wafer W in a horizontal position.

Thus, the holders 27d and 27e are capable of parallel movement in the up-down direction Z. The holders 27d and 27e are rotatable about the axis of rotation A27c. The holders 27d and 27e can advance and withdraw relative to the rotating element 27c.

The transport mechanism 26b has substantially the same construction and shape as the transport mechanism 26a except for being bilaterally symmetric. That is, the transport mechanism 26b has a strut 27a, a vertical mover 27b, a rotating element 27c, and holders 27d and 27e.

Thus, in this specification, where different elements have the same construction, such elements are affixed with common signs and are not described particularly.

<Heat-Treating Block 31>

<<Outline of Heat-Treating Block 31>>

Figure 7:
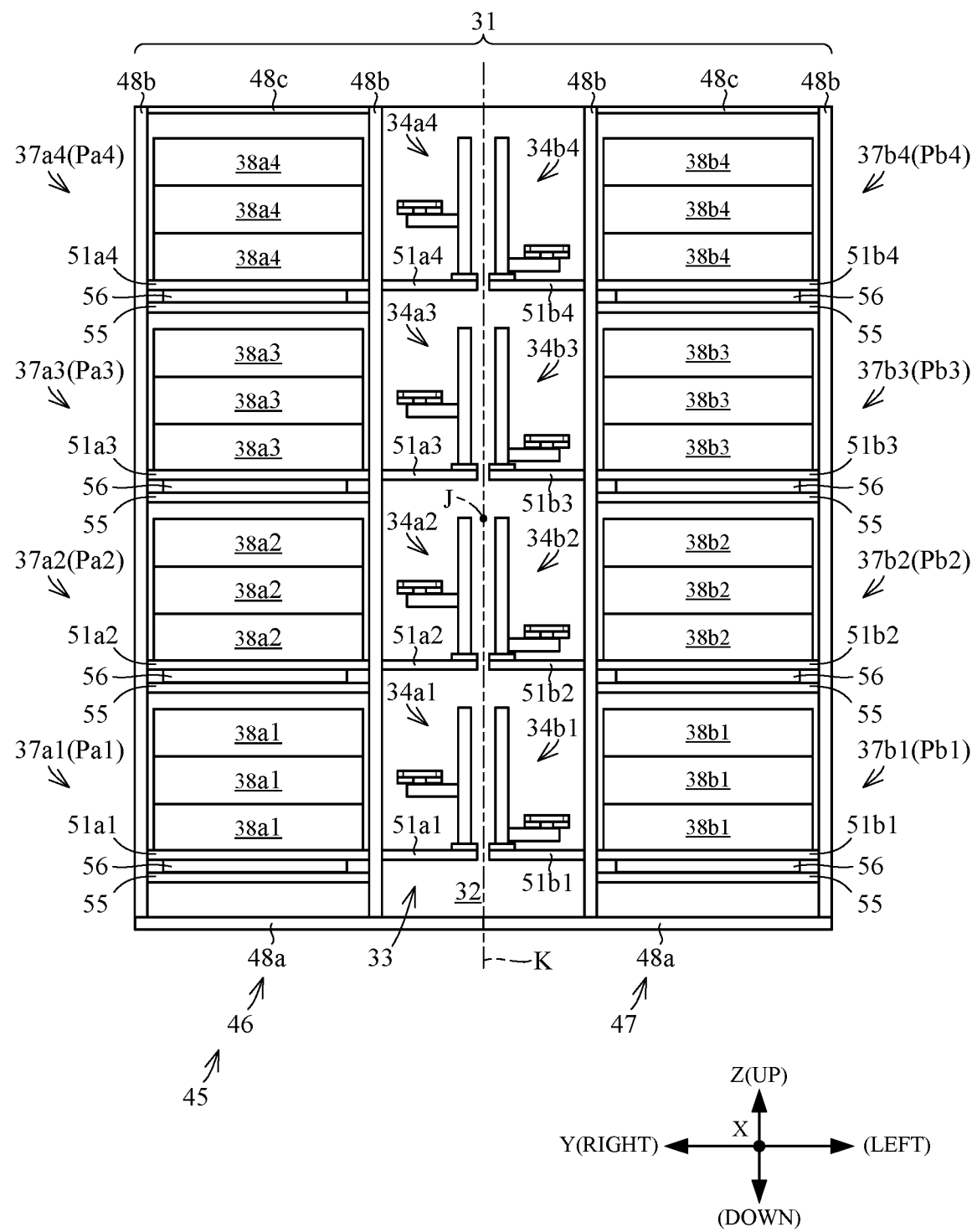
FIG. 7 is a front view of a heat-treating block.

Reference is made to FIGS. 1-4 and 7. FIG. 7 is a front view of the heat-treating block 31. The heat-treating block 31 is substantially box-shaped. The heat-treating block 31 is substantially rectangular in plan view, side view, and front view.

The heat-treating block 31 includes a transporting space 32 and a heat-treating transport mechanism 33. The heat-treating transport mechanism 33 is provided in the transporting space 32. The heat-treating transport mechanism 33 transports wafers W.

The heat-treating transport mechanism 33 includes a plurality of (e.g. eight) transport mechanisms 34a1, 34a2, 34a3, 34a4, 34b1, 34b2, 34b3 and 34b4. The transport mechanisms 34a1-34a4 and 34b1-34b4, when not distinguished, will be collectively called the transport mechanisms 34. The transport mechanisms 34 each transport wafers W.

The heat-treating block 31 includes a plurality of (e.g. eight) heat-treating sections 37a1, 37a2, 37a3, 37a4, 37b1, 37b2, 37b3 and 37b4. The heat-treating sections 37a1-37a4 and 37b1-37b4, when not distinguished, will be collectively called the heat-treating sections 37. The heat-treating sections 37 each perform heat treatment on wafers W.

The heat-treating section 37a1 has a plurality of (e.g. seven) heat-treating units 38a1. Similarly, the heat-treating sections 37a2-37a4 and 37b1-37b4 each have a plurality of (e.g. seven) heat-treating units 38a2-38a4 and 38b1-38b4. The heat-treating units 38a1-38a4 and 38b1-38b4, when not distinguished, will be collectively called the heat-treating units 38. Each of the heat-treating units 38 performs heat treatment on one wafer W.

The heat-treating block 31 includes a plurality of (e.g. eight) inspecting sections 41a1, 41a2, 41a3, 41a4, 41b1, 41b2, 41b3 and 41b4. The inspecting sections 41a1-41a4 and 41b1-41b4, when not distinguished, will be collectively called the inspecting sections 41. The inspecting sections 41 inspect wafers W.

The inspecting section 41a1 has one inspection unit 42a1. Similarly, the inspecting sections 41a2-41a4 and 41b1-41b4 each have one inspection unit 42a2-42a4 or 42b1-42b4. The inspection units 42a1-42a4 and 42b1-42b4, when not distinguished, will be collectively called the inspection units 42. Each of the inspection units 42 inspects one wafer W.

The transport mechanism 34a1 transports wafers W to the heat-treating section 37a1. The transport mechanism 34a1 does not transport wafers W to the heat-treating sections 37 other than the heat-treating section 37a1. To the heat-treating section 37a1 only the transport mechanism 34a1 transports wafers W. Specifically, the transport mechanism 34a1 transports wafers W to the heat-treating units 38a. Similarly, the transport mechanisms 34a2-34a4 and 34b1-34b4 transport wafers W to the heat-treating sections 37a2-37a4 and 37b1-37b4, respectively. Specifically, the transport mechanisms 34a2-34a4 and 34b1-34b4 transport wafers W to the heat-treating units 38a2-38a4 and 38b1-38b4, respectively.

The transport mechanism 34a1 transports wafers W to the inspecting section 41a1. The transport mechanism 34a1 does not transport wafers W to the inspecting sections 41 other than the inspecting section 41a1. To the inspecting section 41a1 only the transport mechanism 34a1 transports wafers W. Specifically, the transport mechanism 34a transports wafers W to the inspection unit 42a1. Similarly, the transport mechanisms 34a2-34a4 and 34b1-34b4 transport wafers W to the inspecting sections 41a2-41a4 and 41b1-41b4, respectively. Specifically, the transport mechanisms 34a2-34a4 and 34b1-34b4 transport wafers W to the inspection units 42a2-42a4 and 42b1-42b4, respectively.

<<Arrangement of the Elements of the Heat-Treating Block 31>>

An arrangement of the transporting space 32, heat-treating transport mechanism 33, heat-treating sections 37, and inspecting sections 41 will be described.

Reference is made to FIG. 1. The transporting space 32 is, in plan view, located in the middle part in the transverse direction Y of the heat-treating block 31. The transporting space 32 has a substantially rectangular shape in plan view. The transporting space 32 extends substantially in the longitudinal direction X. The transporting space 32 adjoins the transporting space 23 of the indexer division 21. The transporting space 32 is located leftward and rearward of the transport mechanism 26a. The transporting space 32 is located rightward and rearward of the transport mechanism 26b.

Figure 8:
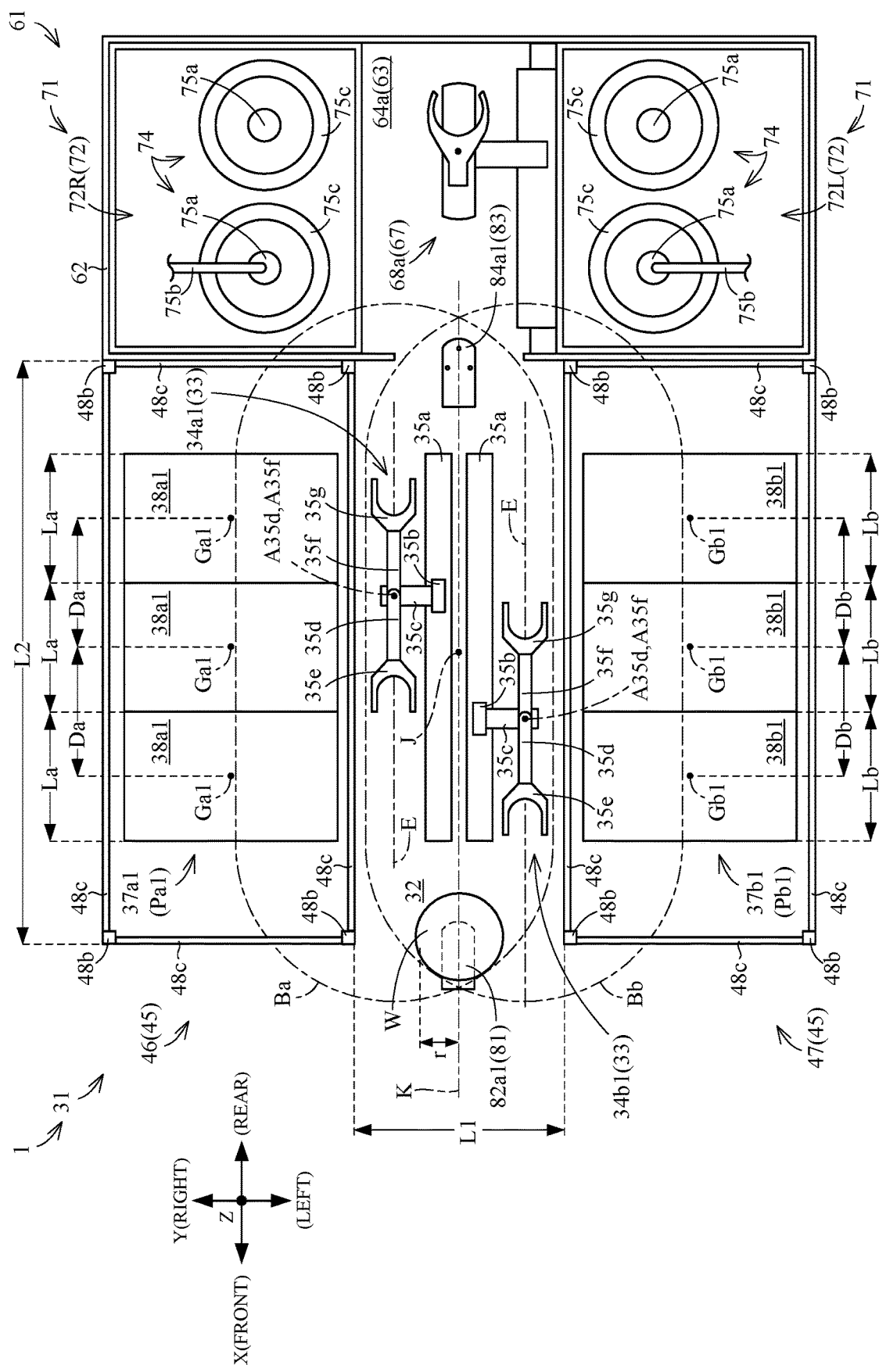
FIG. 8 is an enlarged plan view of the heat-treating block.

FIG. 8 is an enlarged plan view of the heat-treating block 31. The transporting space 32 has a length L1 in the transverse direction Y which does not exceed five times the radius r of wafers W, for example. The length L1 is equal to or more than four times the radius r of wafers W. The length L1 is shorter than a length L2 in the longitudinal direction X of the transporting space 32. Thus, the length L1 is relatively small.

Reference is made to FIGS. 7 and 8. The transporting space 32 has a central point J located centrally of the transporting space 32. FIGS. 7 and 8 show an imaginary plane K passing through the central point J and perpendicular to the transverse direction Y. The transport mechanisms 34a1-34a4 are arranged rightward of the imaginary plane K. The transport mechanisms 34b1-34b4 are arranged leftward of the imaginary plane K.

The transport mechanism 34b1 is located in substantially the same height position as the transport mechanism 34a1. The transport mechanisms 34a1 and 34b1 are aligned in the transverse direction Y. The transport mechanism 34b1 is located leftward of the transport mechanism 34a1. The transport mechanism 34b1 is located in a position bilaterally symmetric to the transport mechanism 34a1. Specifically, the transport mechanism 34b1 is located in a position bilaterally symmetric to the transport mechanism 34a1 about the imaginary plane K.

The transport mechanisms 34a2 and 34b2 are in the same relative positional relationship as the transport mechanisms 34a1 and 34b1. The transport mechanisms 34a3 and 34b3 are in the same relative positional relationship as the transport mechanisms 34a1 and 34b1. The transport mechanisms 34a4 and 34b4 are in the same relative positional relationship as the transport mechanisms 34a1 and 34b1.

Reference is made to FIG. 7. The transport mechanisms 34a2 and 34b2 are located above the transport mechanisms 34a1 and 34b1. The transport mechanisms 34a3 and 34b3 are located above the transport mechanisms 34a2 and 34b2. The transport mechanisms 34a4 and 34b4 are located above the transport mechanisms 34a3 and 34b3.

The transport mechanisms 34a1-34a4 are aligned in the up-down direction Z. The transport mechanism 34a2 overlaps the transport mechanism 34a1 in plan view. The transport mechanism 34a3 overlaps the transport mechanism 34a1 in plan view. The transport mechanism 34a4 overlaps the transport mechanism 34a1 in plan view.

The transport mechanisms 34b1-34b4 are aligned in the up-down direction Z. The transport mechanism 34b2 overlaps the transport mechanism 34b1 in plan view. The transport mechanism 34b3 overlaps the transport mechanism 34b1 in plan view. The transport mechanism 34b4 overlaps the transport mechanism 34b1 in plan view.

Reference is made to FIGS. 1, 2, 4, 7 and 8. The heat-treating section 37a1, transporting space 32, and heat-treating section 37b1 are aligned in this order substantially in the transverse direction Y. In other words, the transporting space 32 is located substantially in the transverse direction Y between the heat-treating section 37a1 and heat-treating section 37b1. Similarly, the heat-treating section 37a2, transporting space 32, and heat-treating section 37b2 are aligned in this order substantially in the transverse direction Y. The heat-treating section 37a3, transporting space 32, and heat-treating section 37b3 are aligned in this order substantially in the transverse direction Y. The heat-treating section 37a4, transporting space 32, and heat-treating section 37b4 are aligned in this order substantially in the transverse direction Y.

Specifically, the heat-treating sections 37a1-37a4 are arranged in positions rightward of the transporting space 32. The heat-treating sections 37b1-37b4 are arranged in positions leftward of the transporting space 32.

Reference is made to FIG. 7. The heat-treating section 37a1 is located in substantially the same height position as the transport mechanism 34a1. The heat-treating section 37a1 is aligned with the transport mechanism 34a1 substantially in the transverse direction Y. The heat-treating section 37a1 is located in a position rightward of the transport mechanism 34a1. Similarly, the heat-treating sections 37a2-37a4 are located in substantially the same height positions as the transport mechanisms 34a2-34a4, respectively. The heat-treating sections 37a2-37a4 are aligned, respectively, with the transport mechanisms 34a2-34a4 substantially in the transverse direction Y. The heat-treating sections 37a2-37a4 are located in positions rightward of the transport mechanisms 34a2-34a4, respectively.

The heat-treating section 37b1 is located in substantially the same height position as the transport mechanism 34b1. The heat-treating section 37b1 is aligned with the transport mechanism 34b1 substantially in the transverse direction Y. The heat-treating section 37b1 is located in a position leftward of the transport mechanism 34b1. Similarly, the heat-treating sections 37b2-37b4 are located in substantially the same height positions as the transport mechanisms 34b2-34b4, respectively. The heat-treating sections 37b2-37b4 are aligned, respectively, with the transport mechanisms 34b2-34b4 substantially in the transverse direction Y. The heat-treating sections 37b2-37b4 are located in positions leftward of the transport mechanisms 34b2-34b4, respectively.

The heat-treating section 37a1, transport mechanism 34a1, transport mechanism 34b1, and heat-treating section 37b1 are aligned in this order substantially in the transverse direction Y. Similarly, the heat-treating section 37a2, transport mechanism 34a2, transport mechanism 34b2, and heat-treating section 37b2 are aligned in this order substantially in the transverse direction Y. The heat-treating section 37a3, transport mechanism 34a3, transport mechanism 34b3, and heat-treating section 37b3 are aligned in this order substantially in the transverse direction Y. The heat-treating section 37a4, transport mechanism 34a4, transport mechanism 34b4, and heat-treating section 37b4 are aligned in this order substantially in the transverse direction Y.

Reference is made to FIGS. 2 and 7. The heat-treating sections 37a1-37a4 are aligned in the up-down direction Z. The heat-treating section 37a2 is located above the heat-treating section 37a1. The heat-treating section 37a3 is located above the heat-treating section 37a2. The heat-treating section 37a4 is located above the heat-treating section 37a3. The heat-treating section 37a2 overlaps the heat-treating section 37a1 in plan view. The heat-treating section 37a3 overlaps the heat-treating section 37a1 in plan view. The heat-treating section 37a4 overlaps the heat-treating section 37a1 in plan view.

Reference is made to FIGS. 4 and 7. The heat-treating sections 37b1-37b4 are aligned in the up-down direction Z. The heat-treating section 37b2 is located above the heat-treating section 37b1. The heat-treating section 37b3 is located above the heat-treating section 37b2. The heat-treating section 37b4 is located above the heat-treating section 37b3. The heat-treating section 37b2 overlaps the heat-treating section 37b1 in plan view. The heat-treating section 37b3 overlaps the heat-treating section 37b1 in plan view. The heat-treating section 37b4 overlaps the heat-treating section 37b1 in plan view.

Reference is made to FIG. 7. The heat-treating section 37b1 is located in substantially the same height position as the heat-treating section 37a1. The heat-treating section 37b1 is opposed to the heat-treating section 37a1 across the transporting space 32. The heat-treating section 37b1 is located in a position bilaterally symmetric to the heat-treating section 37a1. Specifically, the heat-treating section 37b1 is located in a position bilaterally symmetric to the heat-treating section 37a1 about the imaginary plane K.

The heat-treating sections 37a2 and 37b2 are in the same relative positional relationship therebetween as that between the heat-treating sections 37a1 and 37b1. The heat-treating sections 37a3 and 37b3 are in the same relative positional relationship therebetween as that between the heat-treating sections 37a1 and 37b1. The heat-treating sections 37a4 and 37b4 are in the same relative positional relationship therebetween as that between the heat-treating sections 37a1 and 37b1.

Reference is made to FIGS. 1, 2 and 4. The inspecting sections 41a1-41a4 are located in positions rightward of the transporting space 32. The inspecting sections 41b1-41b4 are located in positions leftward of the transporting space 32.

Although not shown, the inspecting sections 41a1-41a4 and 41b1-41b4 are located in substantially the same height positions as the transport mechanisms 34a1-34a4 and 34b1-34b4, respectively. The inspecting sections 41a1-41a4 are located rightward of the transport mechanisms 34a1-34a4, respectively. The inspecting sections 41b1-41b4 are located leftward of the transport mechanisms 34b1-34b4, respectively.

The inspecting sections 41a1-41a4 are aligned in the up-down direction Z. The inspecting sections 41b1-41b4 are aligned in the up-down direction Z.

The inspecting section 41b1 is located in substantially the same height position as the inspecting section 41a1. The inspecting section 41b1 is opposed to the inspecting section 41a1 across the transporting space 32. The inspecting section 41b1 is located in a position bilaterally symmetric to the inspecting section 41a1. Specifically, the inspecting section 41b1 is located in a position bilaterally symmetric to the inspecting section 41a1 about the imaginary plane K.

The inspecting sections 41a2 and 41b2 are in the same relative positional relationship therebetween as that between the inspecting sections 41a1 and 41b1. The inspecting sections 41a3 and 41b3 are in the same relative positional relationship therebetween as that between the inspecting sections 41a1 and 41b1. The inspecting sections 41a4 and 41b4 are in the same relative positional relationship therebetween as that between the inspecting sections 41a1 and 41b1.

Reference is made to FIG. 8. A plurality of (e.g. two or three) heat-treating units 38a1 are aligned substantially in the longitudinal direction X. A plurality of (e.g. two or three) heat-treating units 38b1 are aligned substantially in the longitudinal direction X.

One heat-treating unit 38a1 has a length La in the longitudinal direction X which does not exceed three times the radius r of wafers W. The length La is larger than twice the radius r of wafers W.

Each of the heat-treating units 38a1 has an imaginary first central point Ga1 located centrally thereof. A distance Da between two first central points Ga1 adjoining substantially in the longitudinal direction X does not exceed three times the radius r of wafers W. The distance Da is larger than twice the radius r of wafers W.

One heat-treating unit 38b1 has a length Lb in the longitudinal direction X which does not exceed three times the radius r of wafers W. The length Lb is larger than twice the radius r of wafers W. The length Lb is substantially equal to the length La.

Each of the heat-treating units 38b1 has an imaginary second central point Gb1 located centrally thereof. A distance Db between two second central points Gb1 adjoining substantially in the longitudinal direction X does not exceed three times the radius r of wafers W. The distance Db is larger than twice the radius r of wafers W. The length Db is substantially equal to the length Da.

Reference is made to FIG. 2. A plurality of (e.g. two or three) heat-treating units 38a1 are aligned substantially in the up-down direction Z.

The plurality of heat-treating units 38a1 and one inspecting unit 42a1 are arranged in a matrix form in the side view. For example, the heat-treating units 38a1 and one inspecting unit 42a1 are arranged in three rows in the longitudinal direction X and in three stages in the up-down direction Z. The inspection unit 42a1 overlaps at least one of the heat-treating units 38a1 in plan view.

Reference is made to FIG. 4. A plurality of (e.g. two or three) heat-treating units 38b1 are aligned substantially in the up-down direction Z.

The plurality of heat-treating units 38b1 and one inspecting unit 42b1 are arranged in a matrix form in the side view. For example, the heat-treating units 38b1 and one inspecting unit 42b1 are arranged in three rows in the longitudinal direction X and in three stages in the up-down direction Z. The inspection unit 42b1 overlaps at least one of the heat-treating units 38b1 in plan view.

The heat-treating units 38a2, 38a3 and 38a4 are arranged like the heat-treating units 38a1, respectively. The heat-treating units 38b2, 38b3 and 38b4 are arranged like the heat-treating units 38b1, respectively. The inspecting units 42a2, 42a3 and 42a4 are arranged like the inspecting unit 42a1, respectively. The inspecting units 42b2, 42b3 and 42b4 are arranged like the inspecting unit 42b1, respectively.

<<Construction of the Transport Mechanisms 34 of the Heat-Treating Block 31>>

The construction of the transport mechanism 34a1 will be described with reference to FIGS. 3 and 8. The transport mechanism 34a1 has a rail 35a, a horizontal mover 35b, a vertical mover 35c, an arm 35d, and a holder 35e. The rail 35a is provided fixedly. The rail 35a extends substantially in a horizontal direction. Specifically, the rail 35a extends substantially in the longitudinal direction X. The rail 35a extends from a position more forward than any one of the first central points Ga1 to a position more rearward than any one of the first central points Ga1. The horizontal mover 35b is supported by the rail 35a. The horizontal mover 35b is movable substantially in a horizontal direction relative to the rail 35a. Specifically, the horizontal mover 35b is movable substantially in the longitudinal direction X relative to the rail 35a. The horizontal mover 35b extends substantially in the up-down direction Z. The horizontal mover 35b has a length in the up-down direction Z which is shorter than the length in the longitudinal direction X of the rail 35a. The vertical mover 35c is supported by the horizontal mover 35b. The vertical mover 35c is movable substantially in the up-down direction Z relative to the horizontal mover 35b. The vertical mover 35c projects rightward from the horizontal mover 35b. The arm 35d is supported by the vertical mover 35c. The arm 35d is rotatable about an axis of rotation A35d relative to the vertical mover 35c. The axis of rotation A35d is an imaginary line substantially parallel to the up-down direction Z. The axis of rotation A35d passes through the arm 35d, for example. The axis of rotation A35d is located rightward of the horizontal mover 35b, for example. The arm 35d extends horizontally from the vertical mover 35c. The holder 35e is supported by the arm 35d. The holder 35e is fixed to the arm 35d. The axis of rotation A35d does not pass through the holder 35e. The holder 35e is located in a position spaced from the axis of rotation A35d. The holder 35e holds one wafer W in a horizontal position.

The transport mechanism 34a1 further includes an arm 35f and a holder 35g. The arm 35f and holder 35g have substantially the same shapes and constructions as the arm 35d and holder 35e, respectively. The arm 35f is located below the arm 35d. The arm 35f is supported by the vertical mover 35c. The arm 35f is rotatable about an axis of rotation A35f relative to the vertical mover 35c. The axis of rotation A35f is an imaginary line substantially parallel to the up-down direction Z. The axis of rotation A35f is coaxial with the axis of rotation A35d. The arm 35f is rotatable independently of the arm 35d. The holder 35g is fixed to the arm 35f.

Thus, the holders 35e and 35g are capable of parallel movement in the longitudinal direction X and up-down direction Z, respectively. Further, the holders 35e and 35g are rotatable about the axis of rotation A35d, respectively. However, the holders 35e and 35g are incapable of parallel movement in the transverse direction Y, respectively.

FIG. 8, in plan view, shows an imaginary line E which passes through the axis of rotation A35d and extends substantially parallel to the longitudinal direction X. The imaginary line E passes through the axis of rotation A35E The axes of rotation A35d and A35f move on the imaginary line E in plan view. The axes of rotation A35d and A35f cannot move to positions deviating from the imaginary line E in plan view.

The position of the axis of rotation A35d relative to the horizontal mover 35b is constant in plan view, and the distance between the holder 35e and axis of rotation A35d is constant in plan view. The construction of the transport mechanism 34a1 is therefore simple. This will be described specifically hereinafter.

The position of the axis of rotation A35d relative to the horizontal mover 35b is constant in plan view. Even when, for example, the arm 35d rotates about the axis of rotation A35d relative to the horizontal mover 35b, the axis of rotation A35d is maintained in the position rightward of the horizontal mover 35b in plan view. The construction in which the horizontal mover 35b supports the arm 35d is therefore relatively simple. The distance between the holder 35e and axis of rotation A35d is constant in plan view. Even when, for example, the arm 35d rotates about the axis of rotation A35d relative to the horizontal mover 35b, the distance between the holder 35e and axis of rotation A35d is maintained constant in plan view. The construction in which the arm 35d supports the holder 35e is therefore relatively simple.

Similarly, the position of the axis of rotation A35f relative to the horizontal mover 35b is constant in plan view, and the distance between the holder 35e and axis of rotation A35f is constant in plan view. The construction of the transport mechanism 34a1 is therefore simple, as concerns the holder 35g also. Specifically, the construction in which the horizontal mover 35b supports the arm 35f is relatively simple, and the construction in which the arm 35f supports the holder 35g is relatively simple.

The transport mechanisms 34a2-34a4 have substantially the same construction as the transport mechanism 34a1, respectively. The transport mechanisms 34b1-34b4 have substantially the same construction and shape as the transport mechanism 34a1 except for being bilaterally symmetric, respectively.

The transport mechanism 34a1 is movable substantially in the longitudinal direction X relative to the heat-treating units 38a1. More particularly, the horizontal mover 35b, vertical mover 35c, arm 35d, holder 35e, arm 35f, and holder 35g of the transport mechanism 34a1 are movable substantially in the longitudinal direction X relative to the heat-treating units 38a1. Similarly, the transport mechanisms 34a2-34a4 and 34b1-34b4 are movable substantially in the longitudinal direction X relative to the heat-treating units 38a2-38a4 and 38b1-38b4, respectively.

The transport mechanism 34a1 is movable substantially in the longitudinal direction X relative to the inspecting unit 42a1. Similarly, the transport mechanisms 34a2-34a4 and 34b1-34b4 are movable substantially in the longitudinal direction X relative to the inspecting units 42a2-42a4 and 42b1-42b4 respectively.

The transport mechanisms 34 are movable substantially in the longitudinal direction X independently of one another. Specifically, the horizontal movers 35b of the transport mechanisms 34a1-34a4 and 34b1-34b4 are movable substantially in the longitudinal direction X independently of one another. The transport mechanism 34a1, for example, is movable substantially in the longitudinal direction X independently of the transport mechanisms 34 other than the transport mechanism 34a1.

FIG. 8 schematically shows an area Ba where the transport mechanism 34a1 can transport wafers W. FIG. 8 schematically shows an area Bb where the transport mechanism 34b1 can transport wafers W. Each of the areas Ba and Bb is oval-shaped which is long in the longitudinal direction X. The area Ba, for example, has a length in the longitudinal direction X which is larger than a length in the transverse direction Y of the area Ba. The heat-treating section 37a1 is located inside the area Ba. The heat-treating section 37b1 is located inside the area Bb. The heat-treating section 37b1 is located outside the area Ba. The heat-treating section 37a1 is located outside the area Bb.

Areas where the transport mechanisms 34a2, 34a3 and 34a4 can transport wafers W are substantially the same as the area Ba in plan view. Areas where the transport mechanisms 34b2, 34b3 and 34b4 can transport wafers W are substantially the same as the area Bb in plan view.

The transport mechanism 34a1 is an example of the first transport mechanism in this invention. The transport mechanism 34b1 is an example of the second transport mechanism in this invention. The transport mechanism 34a2 is an example of the third transport mechanism in this invention. The transport mechanism 34b2 is an example of the fourth transport mechanism in this invention.

The rail 35a of the transport mechanism 34a1 is an example of the first rail in this invention. The horizontal mover 35b of the transport mechanism 34a1 is an example of the first horizontal mover in this invention. The vertical mover 35c of the transport mechanism 34a1 is an example of the first vertical mover in this invention. The arms 35d and 35f of the transport mechanism 34a1 are examples of the first arm in this invention. The axes of rotation A35d and A35f of the transport mechanism 34a1 are examples of the first axis in this invention. The holders 35e and 35g of the transport mechanism 34a1 are examples of the first holder in this invention.

The rail 35a of the transport mechanism 34b1 is an example of the second rail in this invention. The horizontal mover 35b of the transport mechanism 34b1 is an example of the second horizontal mover in this invention. The vertical mover 35c of the transport mechanism 34b1 is an example of the second vertical mover in this invention. The arms 35d and 35f of the transport mechanism 34b1 are examples of the second arm in this invention. The axes of rotation A35d and A35f of the transport mechanism 34b1 are examples of the second axis in this invention. The holders 35e and 35g of the transport mechanism 34b1 are examples of the second holder in this invention.

<<Construction of the Heat-Treating Units 38 of the Heat-Treating Block 31>>

The construction of the heat-treating units 38 will be described with reference to FIG. 1. The heat-treating units 38a1-38a4 and 38b1-38b4, basically, have substantially the same construction.

Each of the heat-treating units 38 has a first plate 39a. The first plate 39a is substantially disk-shaped. The first plate 39a receives one wafer W placed thereon. The transport mechanism 34a1, for example, can place wafers W on the first plate 39a of the heat-treating unit 38a1. The transport mechanism 34a1 can take wafers W from the first plate 39a of the heat-treating unit 38a1.

Each heat-treating unit 38 has a second plate 39b. The second plate 39b is provided in substantially the same height position as the first plate 39a. The first plate 39a and second plate 39b are aligned substantially in the transverse direction Y. The second plate 39b is substantially disk-shaped. The second plate 39b receives one wafer W placed thereon.

Each heat-treating unit 38 has a local transport mechanism not shown. The local transport mechanism transports wafers W between the first plate 39a and second plate 39b.

Each heat-treating unit 38 has a first temperature controller not shown. The first temperature controller is attached to at least one of the first plate 39a and local transport mechanism. When the first temperature controller is attached to the first plate 39a, the first temperature controller adjusts the temperature of the wafer W on the first plate 39a. When the first temperature controller is attached to the local transport mechanism, the first temperature controller adjusts the temperature of the wafer W held by the local transport mechanism. The first temperature controller adjusts the wafer W to a first temperature. The first temperature controller cools the wafer W, for example. The first temperature controller is a heat exchanger, for example. The heat exchanger has a flow path through which a heat medium (cooling water) flows, for example.

Each heat-treating unit 38 has a second temperature controller not shown. The second temperature controller is attached to the second plate 39b. The second temperature controller adjusts the temperature of the wafer W on the second plate 39b. The second temperature controller adjusts the wafer W to a second temperature higher than the first temperature. The second temperature controller heats the wafer W, for example. The second temperature controller is a heater, for example.

As described above, each heat-treating section 37 performs heat treatment on wafers W. More particularly, the heat treatment the heat-treating section 37a1 performs on wafers W includes hydrophobizing treatment, heating treatment, and cooling treatment. The hydrophobizing treatment is treatment for adjusting wafers W to a predetermined temperature while supplying the wafers W with a treating gas including hexamethyldisilazane (HMDS). The hydrophobizing treatment is carried out in order to improve adhesion of the wafers W and film. The heating treatment heats the wafers W. The cooling treatment cools the wafers W.

The heat treatment the heat-treating section 37b1 performs on wafers W includes hydrophobizing treatment, heating treatment, and cooling treatment. Thus, the heat treatment the heat-treating section 37b1 performs on wafers W is the same as the heat treatment the heat-treating section 37a1 performs on wafers W.

The heat treatment the heat-treating sections 37a2-37a4 and 37b2-37b4 perform on wafers W includes hydrophobizing treatment, heating treatment, and cooling treatment.

Thus, the heat treatment the heat-treating sections 37a2-37a4 and 37b2-37b4 perform on wafers W is the same as the heat treatment the heat-treating section 37a1 performs on wafers W.

Reference is made to FIG. 2. As noted hereinbefore, the heat-treating section 37a1 has a plurality of (e.g. seven) heat-treating units 38a1. Here, at least one heat-treating unit 38a1 corresponds to a hydrophobizing unit AHP which performs hydrophobizing treatment. At least another heat-treating unit 38a1 corresponds to a heating unit HP which performs heating treatment. At least one remaining heat-treating unit 38a1 corresponds to a cooling unit CP which performs cooling treatment. For example, the heat-treating section 37a1 has two hydrophobizing units AHP, four heating units HP, and one cooling unit CP.

Reference is made to FIGS. 2 and 4. Similarly, each of the heat-treating sections 37a2-37a4 and 37b1-37b4 has, as the heat-treating units 38, two hydrophobizing units AHP, four heating units HP, and one cooling unit CP.

The constructions of the heat-treating units 38 may be different between the hydrophobizing units AHP, heating units HP, and cooling unit CP. Each hydrophobizing unit AHP, for example, may further include a gas supplier for supplying a treating gas to the wafer W on the second plate 39b. Each cooling unit CP, for example, need not include the second plate 39b, local transport mechanism, or second temperature controller.

Here, heat treatment can be divided into pretreatment and posttreatment. The pretreatment is heat treatment performed on wafers W before solution treatment. The posttreatment is heat treatment performed on wafers W after solution treatment. The solution treatment is treatment performed on wafers W in the solution treating block 61. The heat treatment the heat-treating section 37a1 performs on wafers W may include pretreatment and posttreatment. The pretreatment may include the hydrophobizing treatment noted above. The posttreatment may include the heat treatment and cooling treatment noted above. Similarly, the heat treatment the heat-treating sections 37a2-37a4 and 37b1-37b4 perform on wafers W may include the pretreatment and posttreatment, respectively.

The heat-treating section 37a1 is an example of the first heat-treating section in this invention. The heat-treating section 37b1 is an example of the second heat-treating section in this invention. The heat-treating section 37a2 is an example of the third heat-treating section in this invention. The heat-treating section 37b2 is an example of the fourth heat-treating section in this invention.

The heat-treating units 38a1 are an example of the first heat-treating units in this invention. The heat-treating units 38b1 are an example of the second heat-treating units in this invention. The heat-treating units 38a2 are an example of the third heat-treating units in this invention. The heat-treating units 38b2 are an example of the fourth heat-treating units in this invention.

<<Construction of the Inspecting Units 42 of the Heat-Treating Block 31>>

The construction of the inspecting units 42 will be described with reference to FIG. 1. The inspecting units 42a1-42a4 and 42b1-42b4 have substantially the same construction.

Each of the inspecting units 42 has a plate 43a. The plate 43a is substantially disk-shaped. The plate 43a receives one wafer W placed thereon. The transport mechanism 34a1, for example, can place a wafer W on the plate 43a of the inspecting unit 42a1. The transport mechanism 34a1 can take a wafer W from the plate 43a of the inspecting unit 42a1.

Each inspecting unit 42 has an image sensor 43b. The image sensor 43b is disposed above the plate 43a, for example. The image sensor 43b images the upper surface of a wafer W on the plate 43a.

Each inspecting unit 42 may have a driver not shown. The driver moves at least one of the plate 43a and image sensor 43b to change a relative position between the plate 43a and image sensor 43b. With the driver changing the relative position between the plate 43a and image sensor 43b, ranges of the upper surface of the wafer W can be changed for imaging by the image sensor 43b.

Each inspecting unit 42 inspects the upper surface of the wafer W based on the image acquired by the image sensor 43b. Examples of inspection items by the inspecting units 42 are as follows:

Measuring the geometry of the upper surface of wafer W;
Determining the state of the upper surface of wafer W; and
Detecting defects on the upper surface of wafer W.

Here, the upper surface of wafer W is meant to include at least one of the upper surface of the wafer W itself, the film formed on the upper surface of the wafer W, and the pattern formed on the upper surface of the wafer W. The above phrase "measuring the geometry of the upper surface of wafer W" includes, for example measuring and inspecting the thickness of the film formed on the upper surface of the wafer W, and measuring and inspecting the edge cut width of the wafer W.

<<Support Structure for Each Element of the Heat-Treating Block 31>>

Reference is made to FIGS. 1 and 7. FIGS. 1 and 7 show the heat-treating sections 37 in treating positions. The treating positions are positions of the heat-treating sections 37 for performing heat treatment on wafers W.

The treating position of the heat-treating section 37a1 will be called treating position Pa1 as appropriate. Similarly, the treating positions of the heat-treating sections 37a2-37a4 and 37b1-37b4 will be called, as appropriate, treating positions Pa2-Pa4 and Pb1-Pb4, respectively.

Figure 9:
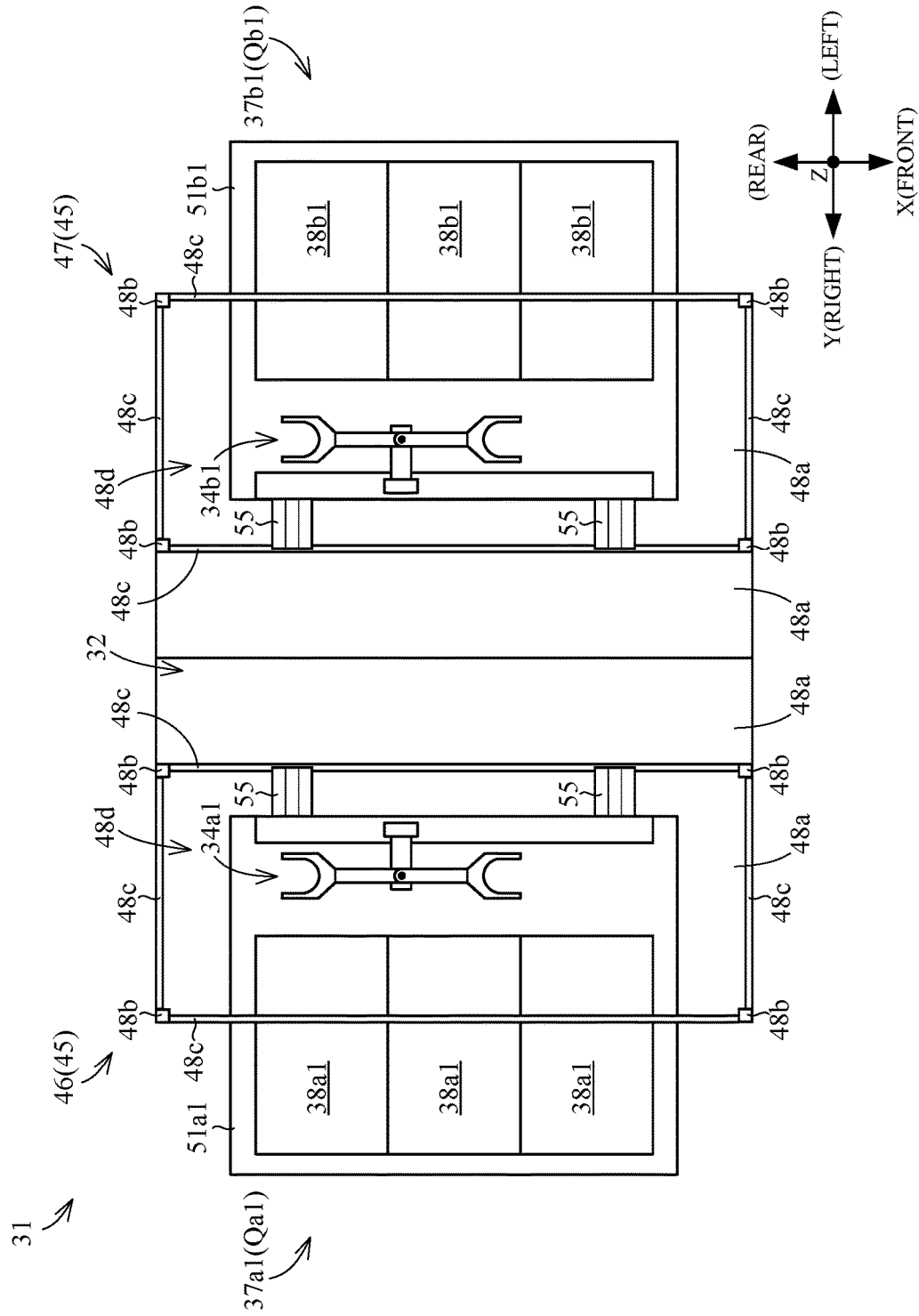
FIG. 9 is a plan view illustrating maintenance positions of heat-treating sections.
Figure 10:
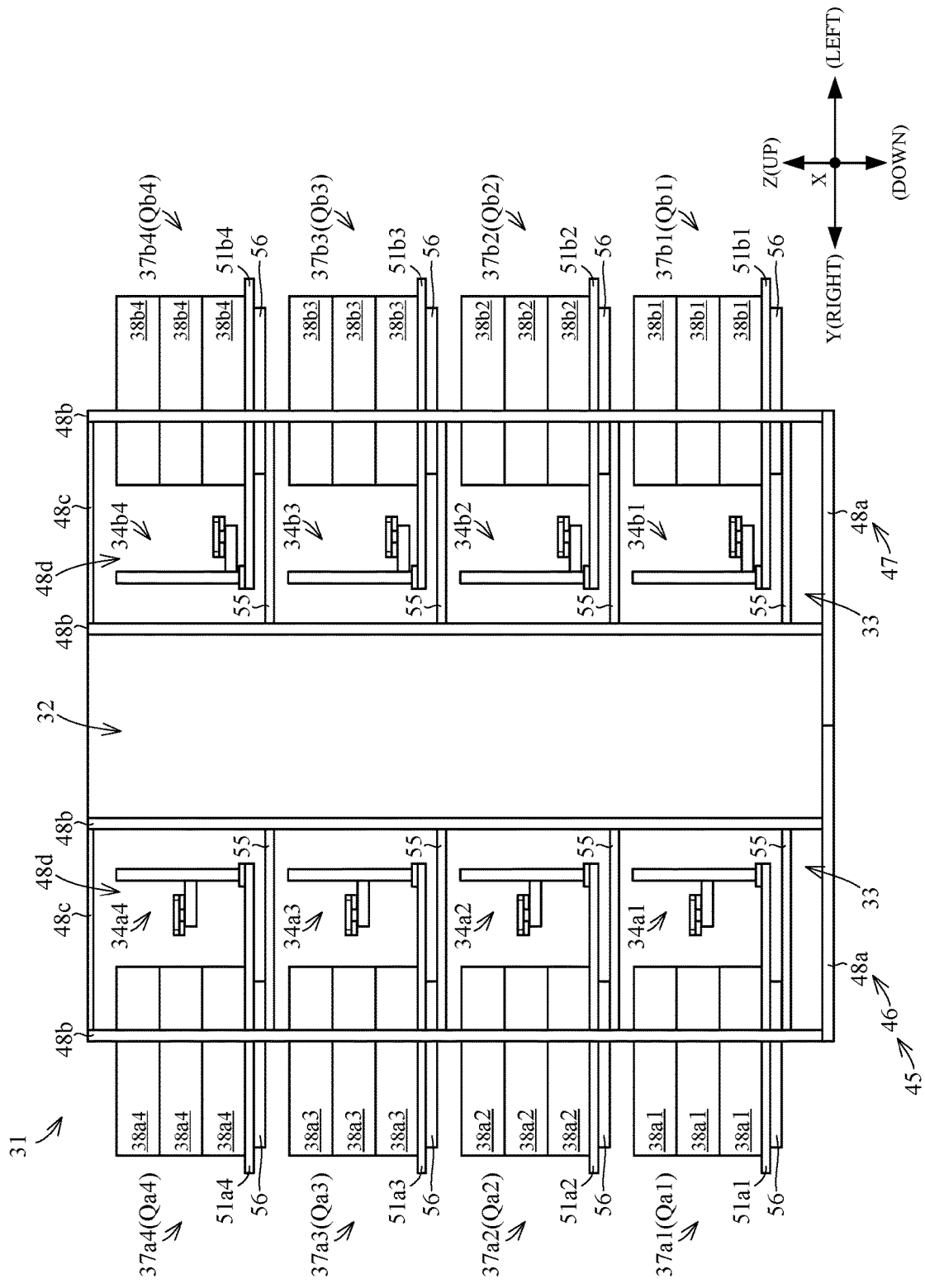
FIG. 10 is a front view illustrating the maintenance positions of the heat-treating sections.

FIG. 9 is a plan view illustrating maintenance positions of the heat-treating sections 37. FIG. 10 is a front view illustrating the maintenance positions of the heat-treating sections 37. The maintenance positions are positions of the heat-treating sections 37 for performing maintenance of the heat-treating sections 37. The maintenance is meant to include checking, upkeep, adjustment, repair, and servicing, for example, of the heat-treating sections 37. Each heat-treating section 37 is provided movable to the treating position and maintenance position.

The maintenance position of the heat-treating section 37a1 will be called maintenance position Qa1 as appropriate. Similarly, the maintenance positions of the heat-treating sections 37a2-37a4 and 37b1-37b4 will be called, as appropriate, maintenance positions Qa2-Qa4 and Qb1-Qb4, respectively.

The treating position Pa1 is an example of the first treating position in this invention. The treating positions Pb1, Pa2 and Pb2 are examples of the second, third and fourth treating positions in this invention, respectively. The maintenance position Qa1 is an example of the first maintenance position in this invention. The maintenance positions Qb1, Qa2 and Qb2 are examples of the second, third and fourth maintenance positions in this invention, respectively.

A support structure for the heat-treating sections 37, transport mechanisms 34, and inspecting sections 41 will be described hereinafter.

Reference is made to FIGS. 1-4, 7 and 8. The heat-treating block 31 has a frame 45. The frame 45 is provided as a framework (skeletal structure) for the heat-treating block 31. The frame 45 demarcates the shape of the heat-treating block 31. The frame 45 is formed of metal, for example.

The frame 45 includes a first frame 46 and a second frame 47. The second frame 47 is disposed in substantially the same height position as the first frame 46. The first frame 46 and second frame 47 are aligned in a horizontal direction. Specifically, the first frame 46 and second frame 47 are aligned in the transverse direction Y. The second frame 47 is located leftward of the first frame 46. The first frame 46 demarcates the shape of a right part of the heat-treating block 31. The second frame 47 demarcates the shape of a left part of the heat-treating block 31.

The first frame 46 supports the transport mechanisms 34$a$1-34$a$4, heat-treating sections 37$a$1-37$a$4, and inspecting sections 41$a$1-41$a$4. The second frame 47 supports the transport mechanisms 34$b$1-34$b$4, heat-treating sections 37$b$1-37$b$4, and inspecting sections 41$b$1-41$b$4.

Figure 11A:
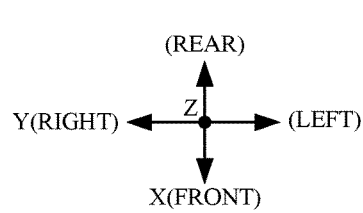
FIG. 11A is a plan view of a first frame and a second frame.
Figure 11A:
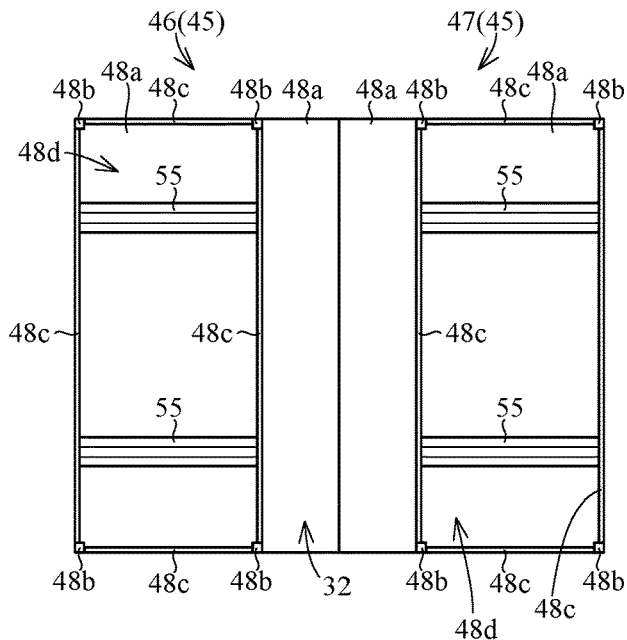
Figure 11C:
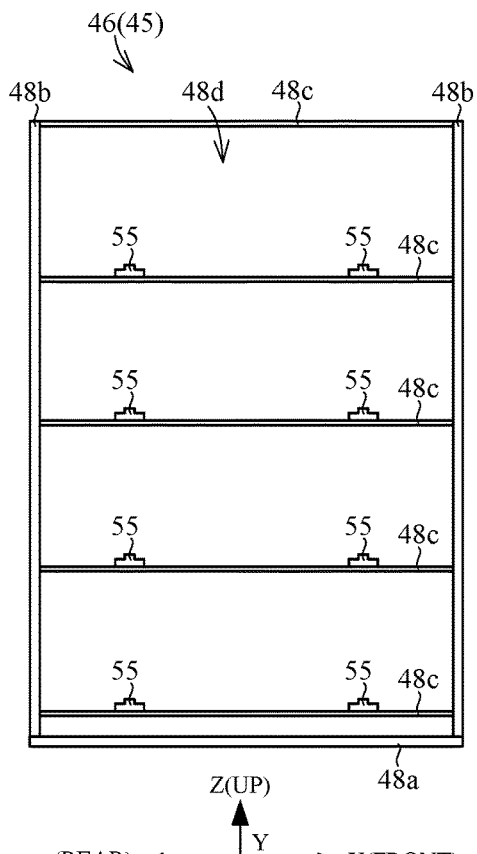
FIG. 11C is a right side view of the first frame.
Figure 11B:
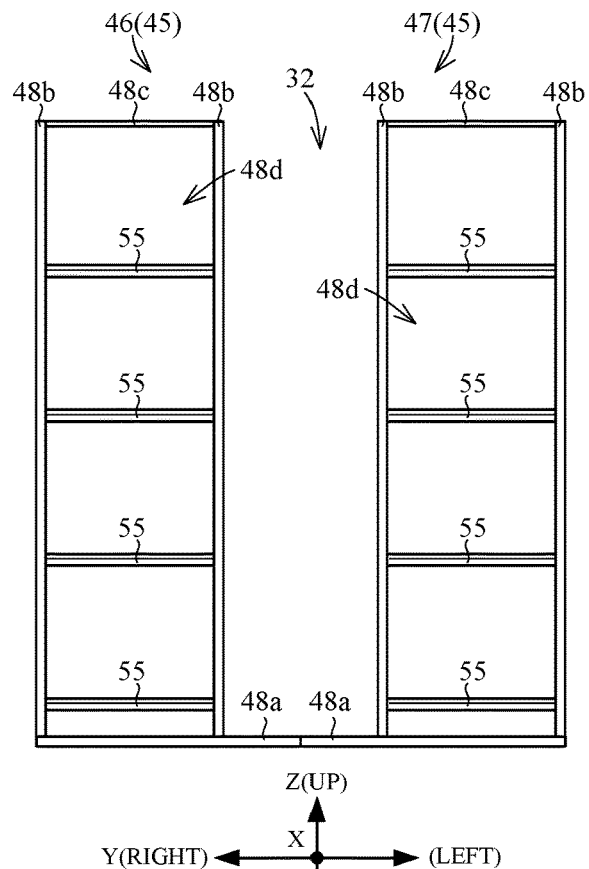
FIG. 11B is a front view of the first frame and second frame.

FIG. 11A is a plan view of the first frame and second frame. FIG. 11B is a front view of the first frame and second frame. FIG. 11C is the right side view of the first frame. The first frame 46 and second frame 47 are shaped bilaterally symmetric in front view. Each of the first frame 46 and second frame 47 is shaped substantially rectangular in plan view.

The first frame 46 has a base portion 48$a$. The base portion 48$a$ has the shape of a substantially horizontal plate or box. The base portion 48$a$ is shaped substantially rectangular in plan view.

The first frame 46 has a plurality of (e.g. four) struts 48$b$. The struts 48$b$ are connected to the base portion 48$a$, respectively. The struts 48$b$ extend upward from the base portion 48$a$, respectively.

The first frame 46 has bars 48$c$. The bars 48$c$ are located in positions higher than the base portion 48$a$. The bars 48$c$ connect the struts 48$b$. The bars 48$c$ extend substantially in a horizontal direction.

The first frame 46 has a space 48$d$. The space 48$d$ is demarcated by the base portion 48$a$, struts 48$b$, and bars 48$c$. The space 48$d$ has a substantially rectangular parallelepiped shape.

The second frame 47 has the same construction as the first frame 46. The second frame 47 has the same shape as the first frame 46. The second frame 47 corresponds to the first frame 46 turned 180 degrees about an axis parallel to the up-down direction Z. The second frame 47 has a base portion 48$a$, struts 48$b$, bars 48$c$, and a space 48$d$.

The space 48$d$ of the first frame 46 is an example of position "inside the first frame 46" in this invention. Outside the space 48$d$ of the first frame 46 is an example of position "outside the first frame 46" in this invention. The space 48$d$ of the second frame 47 is an example of position "inside the second frame 47" in this invention. Outside the space 48$d$ of the second frame 47 is an example of position "outside the second frame 47" in this invention.

The second frame 47 is connected to the first frame 46. Specifically, the base portion 48$a$ of the second frame 47 is connected to the base portion 48$a$ of the first frame 46.

More particularly, the base portion 48$a$ of the first frame 46 has a left part located more leftward than the struts 48$b$ of the first frame 46. The base portion 48$a$ of the second frame 47 has a right part located more rightward than the struts 48$b$ of the second frame 47. The right part of the base portion 48$a$ of the second frame 47 is connected to the left part of the base portion 48$a$ of the first frame 46. The struts 48$b$ of the second frame 47 are not in contact with the struts 48$b$ of the first frame 46. The struts 48$b$ of the second frame 47 are located leftward of the struts 48$b$ of the first frame 46.

The second frame 47 is separable from the first frame 46.

The transporting space 32 is formed between the first frame 46 and second frame 47. Specifically, the transporting space 32 is formed leftward of the first frame 46 and rightward of the second frame 47. More particularly, the transporting space 32 is formed leftward of the struts 48$b$ of the first frame 46 and rightward of the struts 48$b$ of the second frame 47.

Reference is made to FIGS. 2-4, 7, 9 and 10. The heat-treating block 31 includes a plurality of (e.g. eight) movable members 51$a$1, 51$a$2, 51$a$3, 51$a$4, 51$b$1, 51$b$2, 51$b$3 and 51$b$4. The movable members 51$a$1-51$a$4 and 51$b$1-51$b$4, when not distinguished, will be collectively called the movable members 51.

The movable members 51$a$1-51$a$4 are supported by the first frame 46. The movable members 51$a$1-51$a$4 are movable relative to the first frame 46. The movable members 51$b$1-51$b$4 are supported by the second frame 47. The movable members 51$b$1-51$b$4 are movable relative to the second frame 47.

The heat-treating block 31 includes a plurality of guides 55 and a plurality of slides 56. The guides 55 are fixed to the first frame 46 and second frame 47. The guides 55 are fixed to the bars 48$c$ of the first frame 46 and second frame 47, for example. The slides 56 are individually fixed to the movable members 51$a$1-51$a$4 and 51$b$1-51$b$4. Each slide 56 is fixed only to one of the movable members 51$a$1-51$a$4 and 51$b$1-51$b$4. Each slide 56 is supported by one guide 55. The slides 56 fixed to the movable members 51$a$1-51$a$4 are supported by the guides 55 fixed to the first frame 46. The movable members 51$a$1-51$a$4 are supported by the first frame 46 through the guides 55 and slides 56. The slides 56 fixed to the movable members 51$b$1-51$b$4 are supported by the guides 55 fixed to the second frame 47. The movable members 51$b$1-51$b$4 are supported by the second frame 47 through the guides 55 and slides 56.

Each slide 56 is movable relative to the guide 55. Specifically, the slides 56 are slidable relative to the guides 55. The slides 56 are movable substantially in the transverse direction Y relative to the guides 55, for example. When the slides 56 move relative to the guides 55, the respective movable members 51 move relative to the frame 45. When, for example, the slides 56 fixed to the movable member 51$a$1 move relative to the guides 55, the movable member 51$a$1 moves relative to the first frame 46. When, for example, the slides 56 fixed to the movable member 51$b$1 move relative to the guides 55, the movable member 51$b$1 moves relative to the second frame 47.

The slides 56 are movable independently of one another relative to the guides 55. Consequently, the movable members 51 are movable independently of one another relative to at least one of the first frame 46 and second frame 47.

FIG. 12A is a plan view of the movable member 51$a$1. FIG. 12B is a front view of the movable member 51$a$1. FIG. 12C is a right side view of the movable member 51$a$1. The construction of the movable member 51$a$1 will be described hereinafter.

The movable member 51$a$1 has a bottom plate 52$a$. The bottom plate 52$a$ has a substantially horizontal plate shape. The bottom plate 52$a$ has a substantially rectangular shape in plan view. The slides 56 noted above are fixed to the bottom plate 52a, for example.

The movable member 51a1 has a plurality of (e.g. four) struts 52b. The struts 52b are connected to the bottom plate 52a, respectively. The struts 52b extend upward from the bottom plate 52a, respectively.

The movable member 51a1 has a plurality of (e.g. two) shelf boards 52c. Each shelf board 52c is located above the bottom plate 52a. Each shelf board 52c is supported by the struts 52b. Each shelf board 52c has a substantially horizontal plate shape. Each shelf board 52c is smaller than the bottom plate 52a in plan view.

The movable member 51a1 has a plurality of walls 52d. The walls 52d are connected to the shelf boards 52c. The walls 52d have a substantially vertical plate shape. Specifically, the walls 52d have a plate shape substantially perpendicular to the longitudinal direction X. The shelf boards 52c and walls 52d divide a space above the bottom plate 52a into a plurality of (e.g. nine) small spaces (slots) 52e. The plurality of slots 52e arranged in a matrix form in side view.

The movable member 51a1 has one top board 52f. The top board 52f is located above the shelf boards 52c. The top board 52f is located above the slots 52e. The top board 52f is supported by the struts 52b. The top board 52f has a substantially horizontal plate shape. The top board 52f is smaller than the bottom plate 52a in plan view. The top board 52f has substantially the same size as the shelf boards 52c in plan view.

The movable members 51a2-51a4 and 51b1-51b4 have substantially the same construction as the movable member 51a1.

Reference is made to FIGS. 2, 7, 9 and 10. The movable member 51a1 supports the heat-treating section 37a1. Specifically, the heat-treating units 38a1 are installed on the shelf boards 52c and bottom plate 52a of the movable member 51a1. Each heat-treating unit 38a1 is located in one slot 52e. Each heat-treating unit 38a1 overlaps the shelf board 52c and top board 52f in the plan view.

Reference is made to FIGS. 3, 7, 9 and 10. The movable member 51a1 supports the transport mechanism 34a1. Specifically, the transport mechanism 34a1 is installed on the bottom plate 52a of the movable member 51a1. The transport mechanism 34a1 does not overlap the shelf boards 52c or top board 52f in plan view. More particularly, the rail 35a of the transport mechanism 34a1 is installed on the bottom plate 52a of the movable member 51a1. The rail 35a of the transport mechanism 34a1 does not overlap the shelf boards 52c or top board 52f in plan view. The rail 35a of the transport mechanism 34a1 is fixed to the first movable member 51a1 (specifically the bottom plate 52a).

Reference is made to FIG. 2. The movable member 51a1 supports the inspecting section 41a1. For example, one inspecting unit 42a1 is placed on the shelf board 52c of the movable member 51a1. The inspecting unit 42a1 is located in one slot 52e. The inspecting unit 42a1 overlaps the shelf boards 52c and top board 52f in plan view.

The heat-treating block 31 includes an electric equipment section 57a1. The movable member 51a1 supports the electric equipment section 57a1. For example, the electric equipment section 57a1 is placed on the shelf board 52c of the movable member 51a1. The electric equipment section 57a1 is located in one slot 52e of the movable member 51a1. The electric equipment section 57a1 overlaps the shelf boards 52c and top board 52f in the plan view.

Here, the electric equipment section 57a1 is an electric component relevant to at least one of the transport mechanism 34a1, heat-treating section 37a1, and inspecting section 41a1. The electric equipment section 57a1 electrically controls at least one of the transport mechanism 34a1, heat-treating section 37a1, and inspecting section 41a1, for example. The electric equipment section 57a1 supplies electric power to at least one of the transport mechanism 34a1, heat-treating section 37a1 and inspecting section 41a1, for example.

Reference is made to FIGS. 2, 4, 7, 9 and 10. Similarly, the movable members 51a2-51a4 and 51b1-51b4 support the heat-treating sections 37a2-37a4, 37b1-37b4, transport mechanisms 34a2-34a4 and 34b1-34b4, and inspecting sections 41a2-41a4 and 41b1-41b4, respectively.

The heat-treating block 31 includes electric equipment sections 57a2-57a4 and 57b1-57b4. The movable members 51a2-51a4 and 51b1-51b4 support the electric equipment sections 57a2-57a4 and 57b1-57b4, respectively. The electric equipment sections 57a1-57a4 and 57b1-57b4, when not distinguished, will be collectively called the electric equipment sections 57.

As described above, the first frame 46 supports the transport mechanism 34a1, heat-treating section 37a1, inspecting section 41a1, and electric equipment section 57a1 through the movable member 51a1. Similarly, the first frame 46 supports the transport mechanisms 34a2-34a4, heat-treating sections 37a2-37a4, inspecting sections 41a2-41a4, and electric equipment sections 57a2-57a4 through the movable members 51a2-51a4. The second frame 47 supports the transport mechanisms 34b1-34b4, heat-treating sections 37b1-37b4, inspecting sections 41b1-41b4, and electric equipment sections 57b1-57b4 through the movable members 51b1-51b4.

The heat-treating section 37a1 is located in a position farther than the transport mechanism 34a1 from the second frame 47. The transport mechanism 34a1 is located between the heat-treating section 37a1 and second frame 47. Specifically, the transport mechanism 34a1 is located between the heat-treating section 37a1 and second frame 47 in the transverse direction Y. Similarly, the heat-treating sections 37a2-37a4 are located in positions farther than the transport mechanisms 34a2-34a4 from the second frame 47. The transport mechanisms 34a2-34a4 are located between the heat-treating sections 37a2-37a4 and second frame 47.

The heat-treating section 37b1 is located in a position farther than the transport mechanism 34b1 from the first frame 46. The transport mechanism 34b1 is located between the heat-treating section 37b1 and first frame 46. Specifically, the transport mechanism 34b1 is located between the heat-treating section 37b1 and first frame 46 in the transverse direction Y. Similarly, the heat-treating sections 37b2-37b4 are located in positions farther than the transport mechanisms 34b2-34b4 from the first frame 46. The transport mechanisms 34b2-34b4 are located between the heat-treating sections 37b2-37b4 and first frame 46.

Reference is made to FIGS. 1, 7, 9 and 10. When the movable member 51a1 moves relative to the first frame 46, the heat-treating section 37a1 will move relative to the first frame 46. Specifically, when the movable member 51a1 moves relative to the first frame 46, the heat-treating section 37a1 will move substantially in a horizontal direction relative to the first frame 46. More particularly, when the movable member 51a1 moves relative to the first frame 46, the heat-treating section 37a1 will move substantially in the transverse direction Y relative to the first frame 46.

When the movable member 51a1 moves relative to the first frame 46, the heat-treating section 37a1 will move together with the transport mechanism 34a1, inspecting section 41a1, and electric equipment section 57a1.

When the movable member 51a1 moves relative to the first frame 46, the heat-treating section 37a1 can move to the treating position Pa1 and maintenance position Qa1. When the heat-treating section 37a1 moves to the treating position Pa1 and maintenance position Qa1, the movable member 51a1 remains supported by the first frame 46 without disengaging from the first frame 46. The first frame 46 can therefore support the heat-treating section 37a1 in the treating position Pa1 through the movable member 51a1. Further, the first frame 46 can support the heat-treating section 37a1 in the maintenance position Qa1 through the movable member 51a1.

The maintenance position Qa1 is at substantially the same height as the treating position Pa1. The maintenance position Qa1 lies rightward of the treating position Pa1. The heat-treating section 37a1, by moving rightward, can move from the treating position Pa1 to the maintenance position Qa1. The heat-treating section 37a1, by moving leftward, can move from the maintenance position Qa1 to the treating position Pa1.

When the heat-treating section 37a1 is in the treating position Pa1, the whole of heat-treating section 37a1 is located in the space 48d of the first frame 46. That is, when the heat-treating section 37a1 is in the treating position Pa1, the whole of heat-treating section 37a1 is located inside the first frame 46.

When the heat-treating section 37a1 is in the maintenance position Qa1, at least part of the heat-treating section 37a1 is located outside the space 48d of the first frame 46. That is, when the heat-treating section 37a1 is in the maintenance position Qa1, at least part of the heat-treating section 37a1 is located outside the first frame 46. The part of the heat-treating section 37a1 located outside the first frame 46 when the heat-treating section 37a1 is in the maintenance position Qa1 is larger than the part of the heat-treating section 37a1 located outside the first frame 46 when the heat-treating section 37a1 is in the treating position Pa1. When the heat-treating section 37a1 is in the maintenance position Qa1, at least part of the heat-treating section 37a1 is located rightward of the first frame 46. It is desirable that, when the heat-treating section 37a1 is in the maintenance position Qa1, at least one half of the heat-treating section 37a1 is located outside the first frame 46.

When the heat-treating section 37a1 is in the maintenance position Qa1, the whole of heat-treating section 37a1 is located outside the second frame 47. When the heat-treating section 37a1 is in the treating position Pa1 also, the whole of heat-treating section 37a1 is located outside the second frame 47.

The movable member 51a1 and heat-treating section 37a1 will be described further. Assume the direction from the second frame 47 toward the first frame 46 to be the first direction. In this embodiment, the first direction is rightward. When the movable member 51a1 moves relative to the first frame 46, the heat-treating section 37a1 can move in the first direction relative to the first frame 46. The movable member 51a1, by moving relative to the first frame 46, can draw at least part of the heat-treating section 37a1 in the first direction out of the first frame 46.

When the heat-treating section 37a1 is in the treating position Pa1, the whole of inspecting section 41a1 is located inside the first frame 46. When the heat-treating section 37a1 is in the treating position Pa1, the whole of electric equipment section 57a1 is located inside the first frame 46. When the heat-treating section 37a1 is in the maintenance position Qa1, at least part of the inspecting section 41a1 is located outside the first frame 46. When the heat-treating section 37a1 is in the maintenance position Qa1, at least part of the electric equipment section 57a1 is located outside the first frame 46.

When the movable member 51b1 moves relative to the second frame 47, the heat-treating section 37b1 will move relative to the second frame 47. Specifically, when the movable member 51b1 moves relative to the second frame 47, the heat-treating section 37b1 will move substantially in a horizontal direction relative to the second frame 47. More particularly, when the movable member 51b1 moves relative to the second frame 47, the heat-treating section 37b1 will move substantially in the transverse direction Y relative to the second frame 47.

When the movable member 51b1 moves relative to the second frame 47, the heat-treating section 37b1 will move together with the transport mechanism 34b1, inspecting section 41b1, and electric equipment section 57b1.

When the movable member 51b1 moves relative to the second frame 47, the heat-treating section 37b1 can move to the treating position Pb1 and maintenance position Qb1. When the heat-treating section 37b1 moves to the treating position Pb1 and maintenance position Qb1, the movable member 51b1 remains supported by the second frame 47 without disengaging from the second frame 47. The second frame 47 can therefore support the heat-treating section 37b1 in the treating position Pb1 through the movable member 51b1. Further, the second frame 47 can support the heat-treating section 37b1 in the maintenance position Qb1 through the movable member 51b1.

The maintenance position Qb1 is at substantially the same height as the treating position Pb1. The maintenance position Qb1 lies leftward of the treating position Pb1. The heat-treating section 37b1, by moving leftward, can move from the treating position Pb1 to the maintenance position Qb1. The heat-treating section 37b1, by moving rightward, can move from the maintenance position Qb1 to the treating position Pb1.

When the heat-treating section 37b1 is in the treating position Pb1, the whole of heat-treating section 37b1 is located inside the second frame 47.

When the heat-treating section 37b1 is in the maintenance position Qb1, at least part of the heat-treating section 37b1 is located outside the second frame 47. Thus, the part of the heat-treating section 37b1 located outside the second frame 47 when the heat-treating section 37a1 is in the maintenance position Qb1 is larger than the part of the heat-treating section 37b1 located outside the second frame 47 when the heat-treating section 37b1 is in the treating position Pb1. When the heat-treating section 37b1 is in the maintenance position Qb1, at least part of the heat-treating section 37b1 is located leftward of the second frame 47. It is desirable that, when the heat-treating section 37b1 is in the maintenance position Qb1, at least one half of the heat-treating section 37b1 is located outside the second frame 47.

When the heat-treating section 37b1 is in the maintenance position Qb1, the whole of heat-treating section 37b1 is located outside the first frame 46. When the heat-treating section 37b1 is in the treating position Pb1 also, the whole of heat-treating section 37b1 is located outside the first frame 46.

The movable member 51b1 and heat-treating section 37b1 will be described further. Assume the direction opposite to the first direction to be the second direction. In this embodiment, the second direction is leftward. When the movable member 51b1 moves relative to the second frame 47, the heat-treating section 37a1 can move in the second direction relative to the second frame 47. The movable member 51b1, by moving relative to the second frame 47, can draw in the second direction at least part of the heat-treating section 37*b*1 out of the second frame 47.

When the heat-treating section 37*b*1 is in the treating position Pb1, the whole of inspecting section 41*b*1 is located inside the second frame 47. When the heat-treating section 37*b*1 is in the treating position Pb1, the whole of electric equipment section 57*b*1 is located inside the second frame 47. When the heat-treating section 37*b*1 is in the maintenance position Qb1, at least part of the inspecting section 41*b*1 is located outside the second frame 47. When the heat-treating section 37*b*1 is in the maintenance position Qb1, at least part of the electric equipment section 57*b*1 is located outside the second frame 47.

The movable members 51*a*2-51*a*4 move in the same way as the movable member 51*a*1. The movable members 51*b*2-51*b*4 move in the same way as the movable member 51*b*1.

The heat-treating sections 37*a*2-37*a*4 move in the same way as the heat-treating section 37*a*1. The maintenance position Qa2 is located above the maintenance position Qa1. The maintenance position Qa3 is located above the maintenance position Qa2. The maintenance position Qa4 is located above the maintenance position Qa3.

The heat-treating sections 37*b*2-37*b*4 move in the same way as the heat-treating section 37*b*1. The maintenance position Qb2 is located above the maintenance position Qb1. The maintenance position Qb3 is located above the maintenance position Qb2. The maintenance position Qb4 is located above the maintenance position Qb3.

The heat-treating sections 37*a*1-37*a*4 and 37*b*1-37*b*4 are movable independently of one another. The heat-treating sections 37*a*1-37*a*4 and 37*b*1-37*b*4 can move to the maintenance positions Qa1-Qa4 and Qb1-Qb4 without interfering with one another.

The movable member 51*a*1 is an example of the first movable member in this invention. The movable member 51*b*1 is an example of the second movable member in this invention. The movable member 51*a*2 is an example of the third movable member in this invention. The movable member 51*b*2 is an example of the fourth movable member in this invention.

<Solution Treating Block 61>

Reference is made to FIGS. 1-4. The solution treating block 61 is substantially box-shaped. The solution treating block 61 is substantially rectangular in plan view and side view. Although not shown, the solution treating block 61 is substantially rectangular also in front view.

The solution treating block 61 has a frame 62. The frame 62 is provided as a framework (skeletal structure) for the solution treating block 61. The frame 62 demarcates the shape of the solution treating block 61. The frame 62 is formed of metal, for example.

The solution treating block 61 includes a transporting space 63. The transporting space 63 is, in plan view, located in the middle part in the transverse direction Y of the solution treating block 61. The transporting space 63 extends substantially in the longitudinal direction X. The transporting space 63 adjoins the transporting space 32 of the heat-treating block 31.

The solution treating block 61 includes a solution treating transport mechanism 67. The solution treating transport mechanism 67 is disposed in the transporting space 63. That is, the solution treating transport mechanism 67 is located rearward of the heat-treating transport mechanism 33. The solution treating transport mechanism 67 transports wafers W.

Reference is made to FIG. 3. The transporting space 63 includes two transporting spaces 64*a* and 64*b*. The transporting space 64*b* is located above the transporting space 64*a*.

The solution treating block 61 includes a partition 65. The partition 65 has the shape of a horizontal plate. The partition 65 is located at the boundary between the transporting space 64*a* and transporting space 64*b*. The partition 65 separates the transporting space 64*a* and transporting space 64*b*.

The solution treating transport mechanism 67 includes two transport mechanisms 68*a* and 68*b*. The transport mechanisms 68*a* and 68*b* are aligned in the up-down direction Z. The transport mechanism 68*b* is located above the transport mechanism 68*a*. The transport mechanism 68*a* is located in the transporting space 64*a*. The transport mechanism 68*a* is located below the partition 65. The transport mechanism 68*b* is located in the transporting space 64*b*. The transport mechanism 68*b* is located above the partition 65. The transport mechanisms 68*a* and 68*b* transport wafers W, respectively. The transport mechanism 68*a* can transport wafers W independently of the transport mechanism 68*b*.

Reference is made to FIGS. 1 and 3. The transport mechanism 68*a* has struts 69*a* and 69*b*, a vertical mover 69*c*, a horizontal mover 69*d*, a rotating element 69*e*, and holders 69*f* and 69*g*. The struts 69*a* and 69*b* are supported by the frame 62. The struts 69*a* and 69*b* are fixed to the frame 62. The struts 69*a* and 69*b* are immovable relative to the frame 62. The strut 69*b* is located in substantially the same height position as the strut 69*a*. The struts 69*a* and 69*b* are aligned substantially in the longitudinal direction X. The strut 69*a* is located in a left front corner of the transporting space 64*a*. The strut 69*b* is located in a left rear corner of the transporting space 64*a*. The struts 69*a* and 69*b* extend in the up-down direction Z. The vertical mover 69*c* is supported by the struts 69*a* and 69*b*. The vertical mover 69*c* is movable substantially in the up-down direction Z relative to the struts 69*a* and 69*b*. The vertical mover 69*c* extends substantially in the longitudinal direction X. The horizontal mover 69*d* is supported by the vertical mover 69*c*. The horizontal mover 69*d* is movable substantially in the longitudinal direction X relative to the vertical mover 69*c*. The rotating element 69*e* is supported by the horizontal mover 69*d*. The rotating element 69*e* is rotatable about an axis of rotation A69*e* relative to the horizontal mover 69*d*. The axis of rotation A69*e* is an imaginary line substantially parallel to the up-down direction Z. The axis of rotation A69*e* is located rightward of the horizontal mover 69*d*, for example. The holders 69*f* and 69*g* are supported by the rotating element 69*e*. The holders 69*f* and 69*g* can advance and withdraw relative to the rotating element 69*e*. More particularly, the holders 69*f* and 69*g* are reciprocable along one horizontal direction determined by a rotational position of the rotating element 69*e*. The one horizontal direction is a radial direction of the axis of rotation A69*e*, for example. The holders 69*f* and 69*g* can advance and withdraw independently of each other. Each of the holders 69*f* and 69*g* holds one wafer W in a horizontal position.

Thus, the holders 69*f* and 69*g* are capable of parallel movement in the longitudinal direction X and up-down direction Z. The holders 69*f* and 69*g* are rotatable about the axis of rotation A69*e*. The holders 69*f* and 69*g* can advance and withdraw relative to the rotating element 69*e*.

The transport mechanism 68*b* has substantially the same construction as the transport mechanism 68*a*. That is, the transport mechanism 68*b* has struts 69*a* and 69*b*, a vertical mover 69*c*, a horizontal mover 69*d*, a rotating element 69*e*, and holders 69*f* and 69*g*.

Reference is made to FIG. 1. The solution treating block 61 includes a solution treating section 71. The solution treating section 71 is disposed laterally of the transporting space 63. The solution treating section 71 is located in a position adjoining the solution treating transport mechanism 67. The solution treating section 71 is located in substantially the same height position as the solution treating transport mechanism 67. The solution treating section 71 is located in a position to align substantially in the transverse direction Y with the solution treating transport mechanism 67. Specifically, the solution treating section 71 is located in a position rightward of the solution treating transport mechanism 67 and a position leftward of the solution treating transport mechanism 67.

Reference is made to FIG. 8. The solution treating section 71 is located outside the areas where the heat-treating transport mechanism 33 can transport wafers W. The solution treating section 71 is located outside the area Ba. Specifically, spin holders 75a described hereinafter are located outside the area Ba. The solution treating section 71 is located outside the area Bb. Specifically, spin holders 75a described hereinafter are located outside the area Bb. Similarly, the solution treating section 71 is located outside the areas where the transport mechanisms 34a2-34a4 and 34b2-34b4 can transport wafers W.

The solution treating section 71 performs solution treatment on wafers W. The solution treatment is treatment which supplies wafers W with a treating solution. The solution treatment is coating treatment, for example. The treating solution is a film material, for example. The coating treatment is treatment which applies the film material to wafers W and forms film on the wafers W. The film material is a resist film material, for example. The film is resist film, for example.

Reference is made to FIGS. 1-4. The solution treating section 71 includes a plurality of (e.g. two) solution treating sections 72 and 73. The solution treating section 72 is located in substantially the same height position as the transport mechanism 68a. The solution treating section 72 is located below the partition 65. The solution treating section 73 is located in substantially the same height position as the transport mechanism 68b. The solution treating section 73 is located above the partition 65. The transport mechanism 68a transports wafers W to the solution treating section 72. The transport mechanism 68b transports wafers W to the solution treating section 73.

The solution treating section 72 is located in a position adjoining the transport mechanism 68a. The solution treating section 72 includes a solution treating section 72R located rightward of the transport mechanism 68a, and a solution treating section 72L located leftward of the transport mechanism 68a. The solution treating section 73 is located in a position adjoining the transport mechanism 68b. The solution treating section 73 includes a solution treating section 73R located rightward of the transport mechanism 68b, and a solution treating section 73L located leftward of the transport mechanism 68b.

The solution treating sections 72R and 73R are aligned in the up-down direction Z. The solution treating section 73R is located above the treating section 72R. The solution treating sections 72L and 73L are aligned in the up-down direction Z. The solution treating section 73L is located above the solution treating section 72L.

The solution treating section 72R has a plurality of (e.g. four) solution treating units 74. The solution treating units 74 of the solution treating section 72R are arranged in a matrix form in the longitudinal direction X and up-down direction Z. For example, two solution treating units 74 are arranged on the lower stage of the solution treating section 72R. The two remaining solution treating units 74 are arranged on the upper stage of the solution treating section 72R. The two solution treating units 74 on the lower stage of the solution treating section 72R are aligned in the longitudinal direction X. The two solution treating units 74 on the upper stage of the solution treating section 72R are aligned in the longitudinal direction X. The two solution treating units 74 on the upper stage of the solution treating section 72R overlap, in plan view, the two solution treating units 74 on the lower stage of the solution treating section 72R. The two solution treating units 74 on the lower stage of the solution treating section 72R are housed in one chamber 76. The two solution treating units 74 on the upper stage of the solution treating section 72R are housed in another chamber 76.

The solution treating section 72L has a plurality of (e.g. four) solution treating units 74. The solution treating units 74 of the solution treating section 72L are arranged like the solution treating units 74 of the solution treating section 72R except for being bilaterally symmetric.

The solution treating section 73R has a plurality of (e.g. four) solution treating units 74. The solution treating units 74 of the solution treating section 73R are arranged like the solution treating units 74 of the solution treating section 72R.

The solution treating section 73L has a plurality of (e.g. four) solution treating units 74. The solution treating units 74 of the solution treating section 73L are arranged like the solution treating units 74 of the solution treating section 72R except for being bilaterally symmetric.

Each solution treating unit 74 has a spin holder 75a, a nozzle 75b, and a cup 75c. The spin holder 75a holds one wafer W in a horizontal position. For example, the transport mechanism 68a can place a wafer W on the spin holder 75a of the solution treating unit 74 of the solution treating section 72. For example, the transport mechanism 68a can take a wafer W from the spin holder 75a of the solution treating unit 74 of the solution treating section 72. The spin holder 75a can spin the wafer W placed thereon about an axis parallel to the up-down direction Z. The nozzle 75b dispenses a treating solution to the wafer W. The treating solution is a coating solution, for example. The nozzle 75b is movable between a treating position and a withdrawn position. The treating position is a position above the wafer W held by the spin holder 75a. The nozzle 75b, when in the treating position, overlaps the wafer W held by the spin holder 75a in plan view. The nozzle 75b, when in the withdrawn position, does not overlap the wafer W held by the spin holder 75a in plan view. The cup 75c is located around the spin holder 75a. The cup 75c collects the treating solution.

<Front Rack 81>

Reference is made to FIGS. 1, 3, 6 and 8. The front rack 81 is located between the indexer division 21 and heat-treating block 31. The front rack 81 is provided as a bridge between the transporting space 23 of the indexer division 21 and the transporting space 32 of the heat-treating block 31.

The front rack 81 is located rearward of the indexer's transport mechanism 25. The front rack 81 is located leftward and rearward of the transport mechanism 26a. The front rack 81 is located rightward and rearward of the transport mechanism 26b. The indexer's transport mechanism 25 transports wafers W between carriers C and the front rack 81.

The front rack 81 is located forward of the heat-treating transport mechanism 33.

The front rack 81 includes a plurality of (e.g. eight) racks 82a1, 82a2, 82a3, 82a4, 82b1, 82b2, 82b3 and 82b4. The racks 82a1-82a4 and 82b1-82b4, when not distinguished, will be collectively called the rack(s) 82. Each rack 82 receives wafers W placed thereon. The indexer's transport mechanism 25 can place wafers W on each rack 82.

Specifically, the transport mechanisms 26a and 26b can place wafers W on each rack 82, respectively. The indexer's transport mechanism 25 can take wafers W from each rack 82. Specifically, the transport mechanisms 26a and 26b can take wafers W from each rack 82, respectively.

The plurality of racks 82 are aligned substantially in the up-down direction Z. The rack 82b1 overlaps the rack 82a1 in plan view. Similarly, the racks 82a2-82a4 and 82b2-82b4 overlap the rack 82a1 in plan view. Each rack 82 is located in a position intersecting the imaginary plane K (see FIG. 8).

The racks 82a2 and 82b2 are located above the racks 82a1 and 82b1. The racks 82a3 and 82b3 are located above the racks 82a2 and 82b2. The racks 82a4 and 82b4 are located above the racks 82a3 and 82b3.

The racks 82a1 and 82b1 are located in substantially the same height position as the transport mechanisms 34a1 and 34b1. The racks 82a1 and 82b1 are located forward and leftward of the transport mechanism 34a1. The racks 82a1 and 82b1 are located forward and rightward of the transport mechanism 34b1. The transport mechanisms 34a1 and 34b1 can place wafers W on the racks 82a1 and 82b1, respectively. The transport mechanisms 34a1 and 34b1 can take wafers W from the racks 82a1 and 82b1, respectively.

The racks 82a2 and 82b2 and transport mechanisms 34a2, and 34b2 are in the same relative positional relationship as that of the racks 82a1 and 82b1 and transport mechanisms 34a1 and 34b1. The racks 82a3 and 82b3 and transport mechanisms 34a3 and 34b3 are in the same relative positional relationship as that of the racks 82a1 and 82b1 and transport mechanisms 34a1 and 34b1. The racks 82a4 and 82b4 and transport mechanisms 34a4 and 34b4 are in the same relative positional relationship as that of the racks 82a1 and 82b1 and transport mechanisms 34a1 and 34b1.

Each rack 82 has a plurality of (e.g. two) plates 85. The plates 85 are aligned substantially in the up-down direction Z. One wafer W is placed on one plate 85. Each rack 82 can therefore receive a plurality of wafers W placed thereon.

The rack 82a1 is an example of the first front rack in this invention. The rack 82b1 is an example of the second front rack in this invention. The rack 82a2 is an example of the third front rack in this invention. The rack 82b2 is an example of the fourth front rack in this invention.

<Rear Rack 83>

Reference is made to FIGS. 1, 3 and 8. The rear rack 83 is located between the heat-treating block 31 and solution treating block 61. The rear rack 83 is provided as a bridge between the transporting space 32 of the heat-treating block 31 and the transporting space 63 of the solution treating block 61.

The rear rack 83 is located rearward of the heat-treating transport mechanism 33. The rear rack 83 is located forward of the solution treating transport mechanism 67.

The rear rack 81 includes a plurality of (e.g. eight) racks 84a1, 84a2, 84a3, 84a4, 84b1, 84b2, 84b3 and 84b4. The racks 84a1-84a4 and 84b1-84b4, when not distinguished, will be collectively called the rack(s) 84. Each rack 84 receives wafers W placed thereon. The solution treating transport mechanism 67 can place wafers W on each rack 84. The solution treating transport mechanism 67 can take wafers W from each rack 84.

The plurality of racks 84 are aligned substantially in the up-down direction Z. The rack 84b1 overlaps the rack 84a1 in plan view. Similarly, the racks 84a2-84a4 and 84b2-84b4 overlap the rack 84a1 in plan view. Each rack 84 is located in a position intersecting the imaginary plane K (see FIG. 8).

The racks 84a2 and 84b2 are located above the racks 84a1 and 84b1. The racks 84a3 and 84b3 are located above the rack 84a2 and 84b2. The racks 84a4 and 84b4 are located above the rack 84a3 and 84b3.

The racks 84a1 and 84b1 are located in substantially the same height position as the transport mechanisms 34a1 and 34b1. The racks 84a1 and 84b1 are located rearward and leftward of the transport mechanism 34a1. The racks 84a1 and 84b1 are located rearward and rightward of the transport mechanism 34b1. The transport mechanisms 34a1 and 34b1 can place wafers W on the racks 84a1 and 84b1, respectively. The transport mechanisms 34a1 and 34b1 can take wafers W from the racks 84a1 and 84b1, respectively.

The racks 84a2 and 84b2 and transport mechanisms 34a2, and 34b2 are in the same relative positional relationship as that of the racks 84a1 and 84b1 and transport mechanisms 34a1 and 34b1. The racks 84a3 and 84b3 and transport mechanisms 34a3 and 34b3 are in the same relative positional relationship as that of the racks 84a1 and 84b1 and transport mechanisms 34a1 and 34b1. The racks 84a4 and 84b4 and transport mechanisms 34a4 and 34b4 are in the same relative positional relationship as that of the racks 84a1 and 84b1 and transport mechanisms 34a1 and 34b1.

The racks 84a1, 84a2, 84b1 and 84b2 are located in substantially the same height position as the transport mechanism 68a. The racks 84a1, 84a2, 84b1 and 84b2 are located forward of the transport mechanism 68a. The transport mechanism 68a can place wafers W on the racks 84a1, 84a2, 84b1 and 84b2. The transport mechanism 68a can take wafers W from the racks 84a1, 84a2, 84b1 and 84b2.

The racks 84a3, 84a4, 84b3 and 84b4 are located in substantially the same height position as the transport mechanism 68b. The racks 84a3, 84a4, 84b3 and 84b4 are located forward of the transport mechanism 68b. The transport mechanism 68b can place wafers W on the racks 84a3, 84a4, 84b3 and 84b4. The transport mechanism 68b can take wafers W from the racks 84a3, 84a4, 84b3 and 84b4.

Each rack 84 has substantially the same construction as the rack 82. Specifically, each rack 84 has a plurality of (e.g. two) plates 85. Each rack 84 can receive a plurality of wafers W placed thereon.

The rack 84a1 is an example of the first rear rack in this invention. The rack 84b1 is an example of the second rear rack in this invention. The rack 84a2 is an example of the third rear rack in this invention. The rack 84b2 is an example of the fourth rear rack in this invention.

<Controller>

Reference is made to FIG. 1. The substrate treating apparatus 1 includes a controller 91. The controller 91 is installed in the indexer division 21, for example. The controller 91 controls the stocker division 11, indexer division 21, heat-treating block 31, and solution treating block 61. More particularly, the controller 91 controls the carrier transport mechanism 15, indexer's transport mechanism 25, heat-treating transport mechanism 33, heat-treating sections 37, inspecting sections 41, electric equipment sections 57, solution treating transport mechanism 67, and solution treating sections 71.

The controller 91 is realized by a central processing unit (CPU) which performs various processes, a RAM (Random-Access Memory) used as working space for arithmetic processes, and a storage medium such as a fixed disk. The storage medium stores varieties of information such as treatment recipes (processing programs) for treating wafers W and information for identifying each wafer W.

<Example of Operation of the Substrate Treating Apparatus 1>

An example of operation of the stocker division 11 and indexer division 21, and an example of operation of the indexer division 21, heat-treating block 31, and solution treating block 61 will be described hereinafter.

<<Example of Operation of the Stocker Division 11 and Indexer Division 21>>

The external transport mechanism, not shown, places a carrier C holding wafers W to be treated, on one of the shelves 13. The carrier transport mechanism 15 transports the carrier C holding wafers W to be treated, from the shelf 13 to the carrier rack 22a. The transport mechanism 26a unloads the wafers W from the carrier C on the carrier rack 22a. After the transport mechanism 26a unloads all the wafers W from the carrier C on the carrier rack 22a, the carrier transport mechanism 15 transports the carrier C empty of wafers W from the carrier rack 22a to the carrier rack 22b. At this time, the carrier transport mechanism 15 may temporarily place the carrier C empty of wafers W on the shelf 13. The transport mechanism 26b loads treated wafers W into the carrier C on the carrier rack 22b. Then, the carrier transport mechanism 15 transports the carrier C holding the treated wafers W from the carrier rack 22b to the shelf 13. The external transport mechanism takes the carrier C holding the treated wafers W from the shelf 13.

<<Example of Operation of the Indexer Division 21, Heat-Treating Block 31, and Solution Treating Block 61>>

Figure 13:
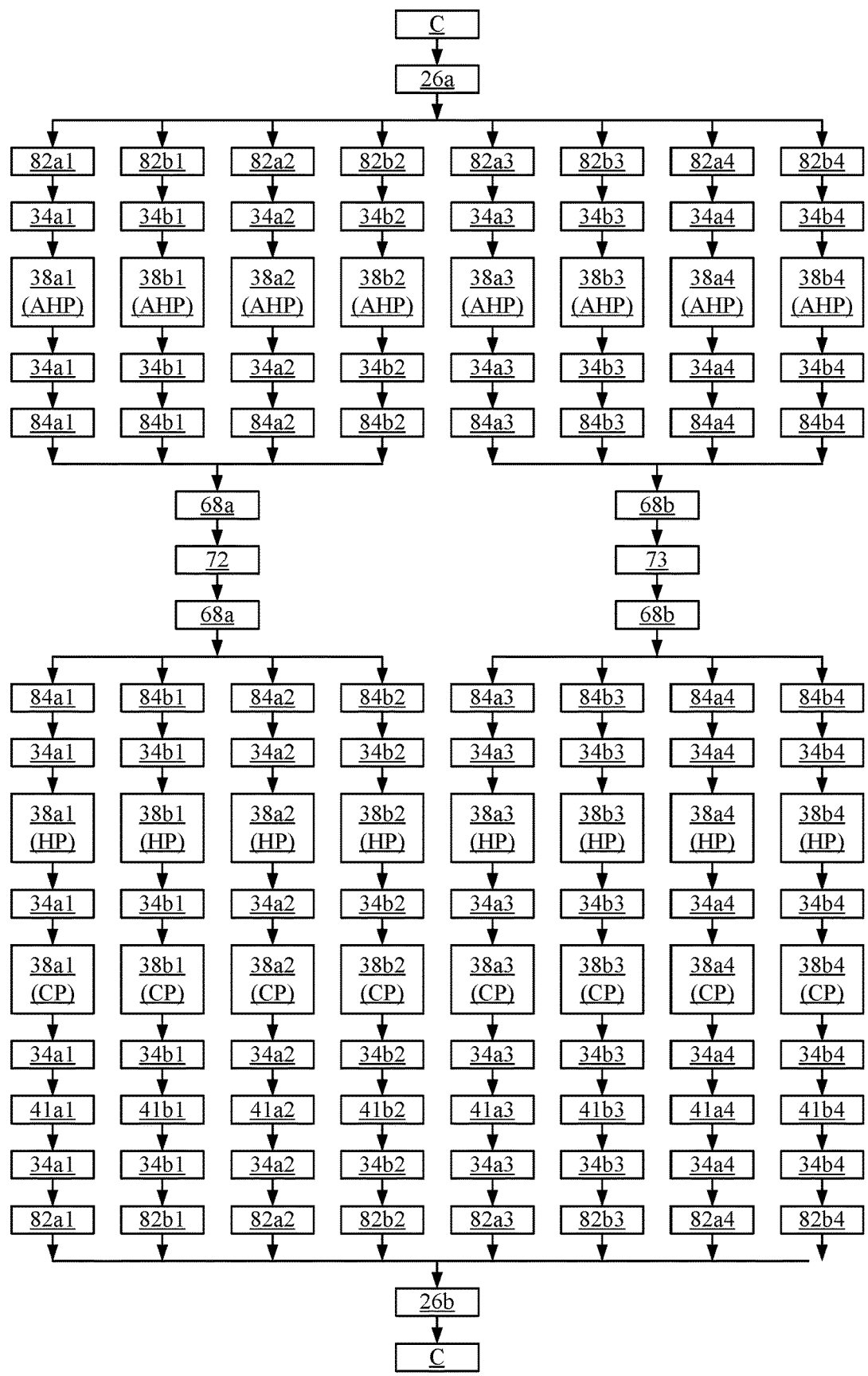
FIG. 13 is a view schematically showing elements of the substrate treating apparatus passed through by substrates.

FIG. 13 is a view schematically showing elements (e.g. the transport mechanisms and treating sections) of the substrate treating apparatus 1 passed through by wafers W.

The transport mechanism 26a transports wafers W from the carrier C on the carrier rack 22a to the racks 82a1-82a4 and 82b1-82b4. For example, the transport mechanism 26a may place one wafer W at a time on each rack 82. For example, the transport mechanism 26a may place two wafers W at a time on each rack 82. For example, the transport mechanism 26a may place two wafers W on each rack 82 at the same time.

The transport mechanism 34a1 transports wafers W from the rack 82a1 to the heat-treating unit 38a1 (specifically, the hydrophobizing unit AHP). The hydrophobizing unit AHP of the heat-treating section 37a1 performs hydrophobizing treatment on the wafers W. The transport mechanism 34a1 transports the wafers W from the hydrophobizing unit AHP of the heat-treating section 37a1 to the rack 84a1.

The transport mechanism 34b1 transports wafers W from the rack 82b1 to the heat-treating unit 38b1 (specifically, the hydrophobizing unit AHP). The hydrophobizing unit AHP of the heat-treating section 37b1 performs hydrophobizing treatment on the wafers W. The transport mechanism 34b1 transports the wafers W from the hydrophobizing unit AHP of the heat-treating section 37b1 to the rack 84b1.

The transport mechanisms 34a2-34a4 and 34b2-34b4 transport wafers W as do the transport mechanisms 34a1 and 34b1, respectively. The transport mechanisms 34a1-34a4 and 34b1-34b4 operate in parallel. The heat-treating sections 37a2-37a4 and 37b2-37b4 perform heat treatment on the wafers W as do the heat-treating sections 37a1 and 37b1, respectively. The heat-treating sections 37a1-37a4 and 37b1-37b4 operate in parallel.

The transport mechanism 68a transports the wafers W from the racks 84a1, 84a2, 84b1 and 84b2 to the solution treating section 72. The solution treating section 72 performs solution treatment on the wafers W. The transport mechanism 68a transports the wafers W from the solution treating section 72 to the racks 84a1, 84a2, 84b1 and 84b2.

The transport mechanism 68b transports the wafers W from the racks 84a3, 84a4, 84b3 and 84b4 to the solution treating section 73. The solution treating section 73 performs solution treatment on the wafers W. The transport mechanism 68b transports the wafers W from the solution treating section 73 to the racks 84a3, 84a4, 84b3 and 84b4.

The transport mechanism 34a1 transports the wafers W from the rack 84a1 to the heat-treating unit 38a1 (specifically the heating unit HP). The heating unit HP of the heat-treating section 37a1 performs heating treatment on the wafers W. The transport mechanism 34a1 transports the wafers W from the heating unit HP of the heat-treating section 37a1 to another heat-treating unit 38a1 (specifically, the cooling unit CP). The cooling unit CP of the heat-treating section 37a1 performs cooling treatment on the wafers W. The transport mechanism 34a1 transports the wafers W from the cooling unit CP of the heat-treating section 37a1 to the inspecting section 41a1. The inspecting section 41a1 inspects the wafers W. The transport mechanism 34a1 transports the wafers W from the inspecting section 41a1 to the rack 82a1.

The transport mechanism 34b1 transports the wafers W from the rack 84b1 to the heat-treating unit 38b1 (specifically the heating unit HP). The heating unit HP of the heat-treating section 37b1 performs heating treatment on the wafers W. The transport mechanism 34b1 transports the wafers W from the heating unit HP of the heat-treating section 37b1 to another heat-treating unit 38b1 (specifically, the cooling unit CP). The cooling unit CP of the heat-treating section 37b1 performs cooling treatment on the wafers W. The transport mechanism 34b1 transports the wafers W from the cooling unit CP of the heat-treating section 37b1 to the inspecting section 41b1. The inspecting section 41b1 inspects the wafers W. The transport mechanism 34b1 transports the wafers W from the inspecting section 41b1 to the rack 82b1.

The transport mechanisms 34a2-34a4 and 34b2-34b4 transport the wafers W as do the transport mechanisms 34a1 and 34b1, respectively. The transport mechanisms 34a1-34a4 and 34b1-34b4 operate in parallel. The heat-treating sections 37a2-37a4 and 37b2-37b4 perform heat treatment on the wafers W as do the heat-treating sections 37a1 and 37b1, respectively. The heat-treating sections 37a1-37a4 and 37b1-37b4 operate in parallel. The inspecting sections 41a2-41a4 and 41b2-41b4 inspect the wafers W as do the inspecting sections 41a1 and 41b1, respectively. The inspecting sections 41a1-41a4 and 41b1-41b4 operate in parallel.

The transport mechanism 26b transports the wafers W from the racks 82a1-82a4 and 82b1-82b4 to the carrier C on the carrier rack 22b.

<<Detailed Example of Operation of the Transport Mechanisms 34>

Figure 14A:
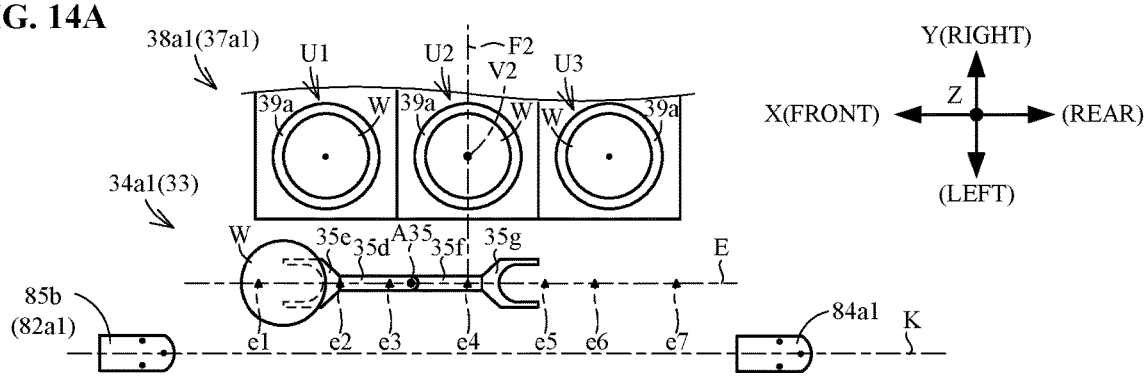
FIGS. 14A-14R are plan views showing an example of operation of a transport mechanism.
Figure 14B:
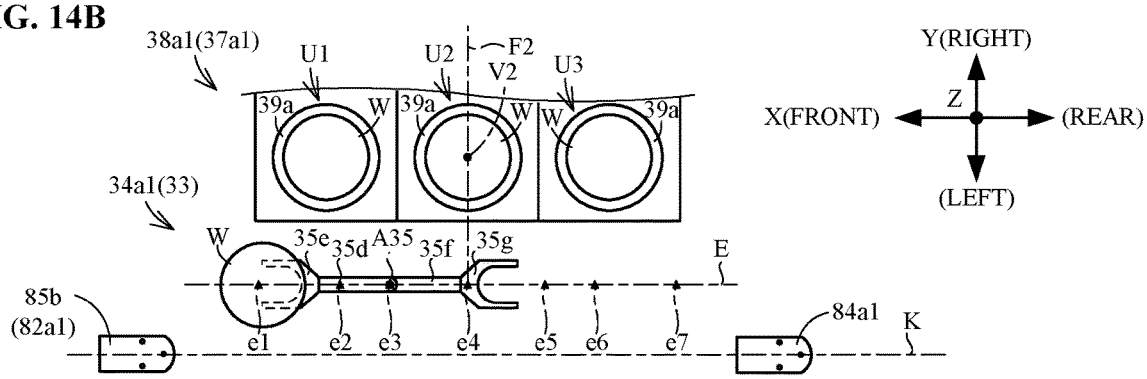
Figure 14C:
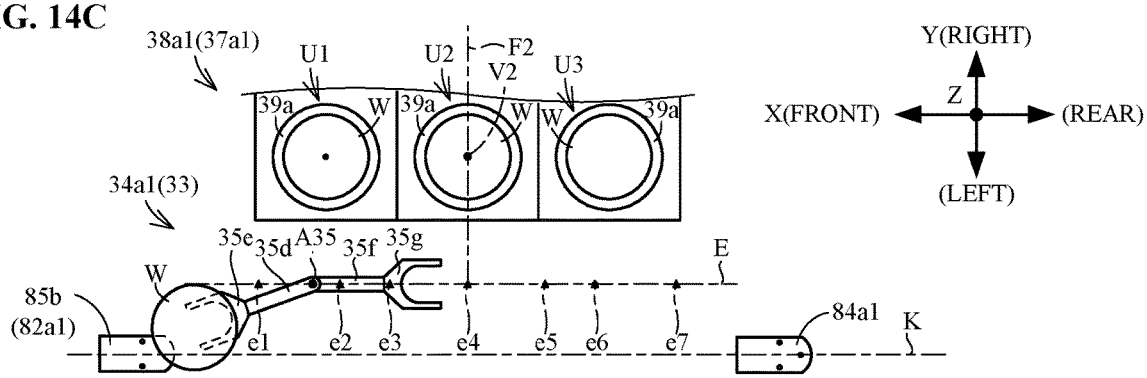
Figure 14D:
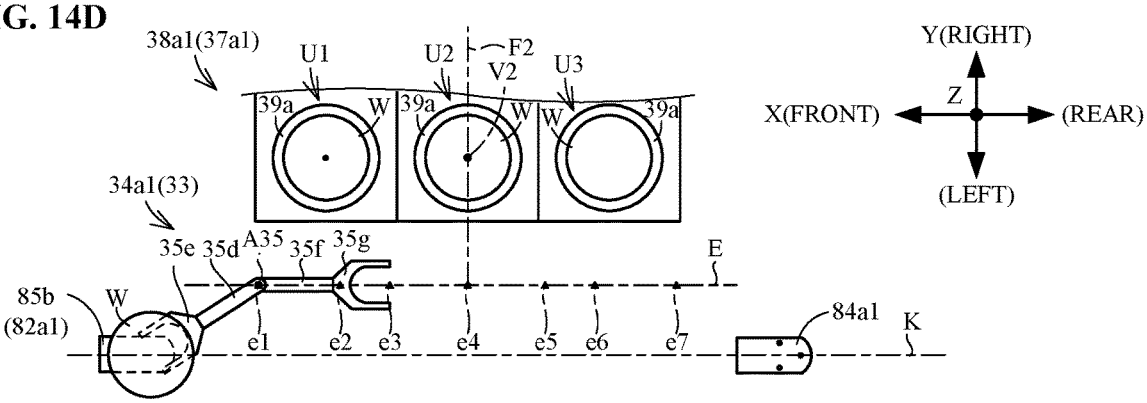
Figure 14E:
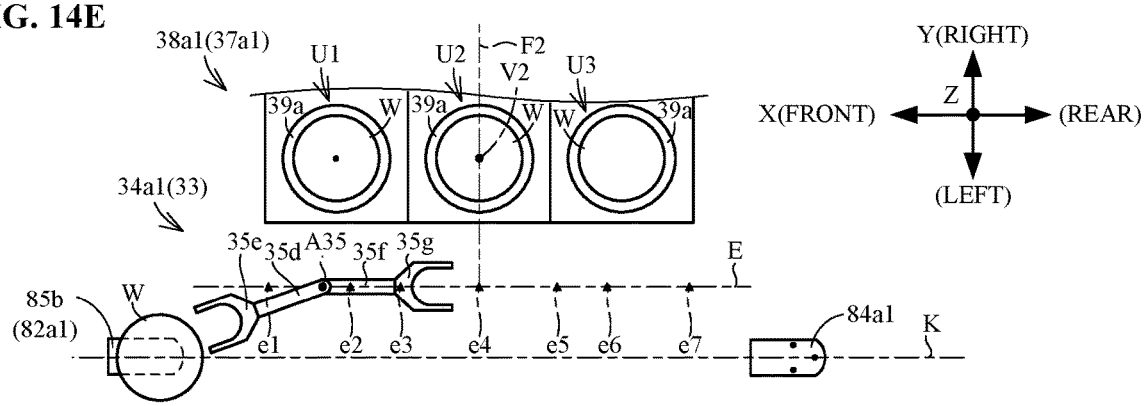
Figure 14F:
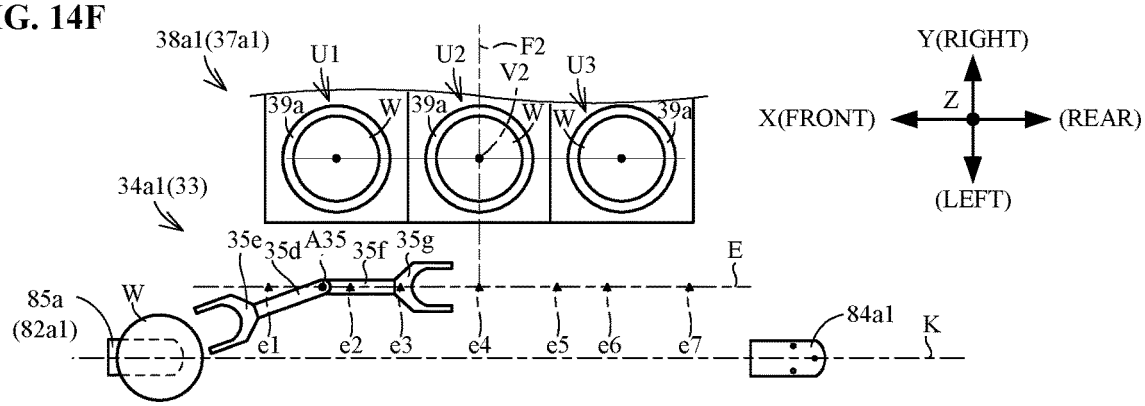
Figure 14G:
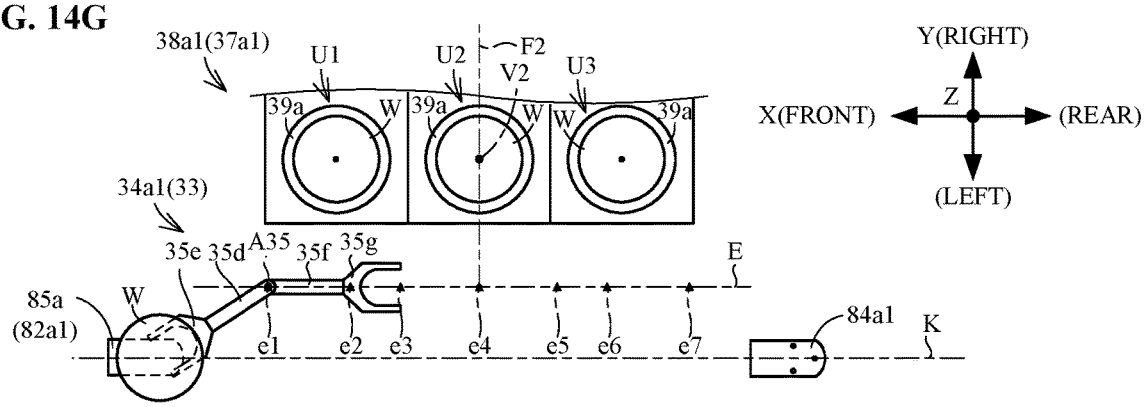
Figure 14H:
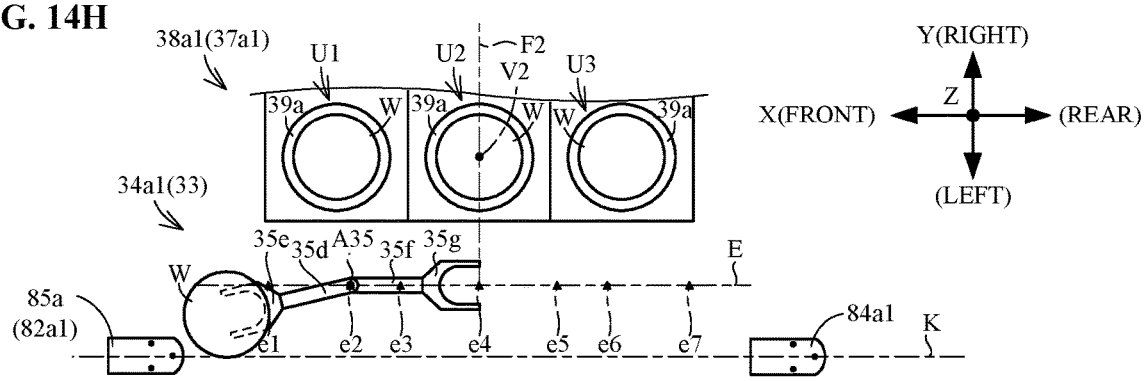
Figure 14I:
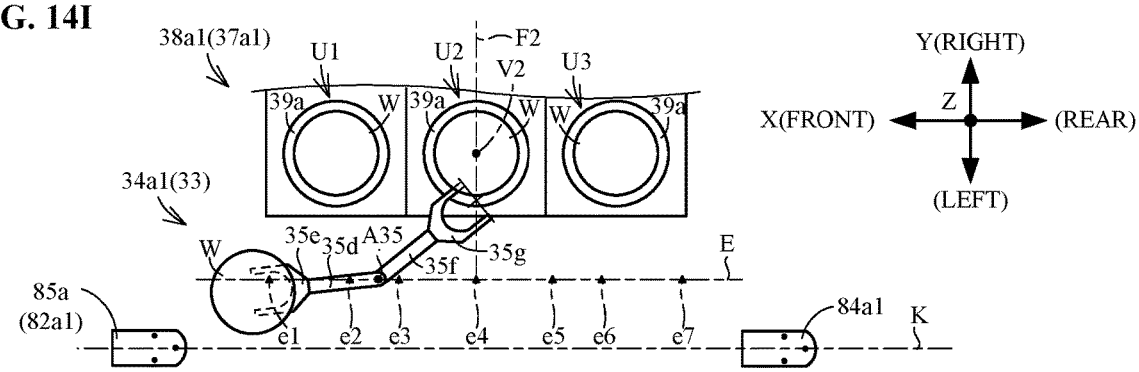
Figure 14J:
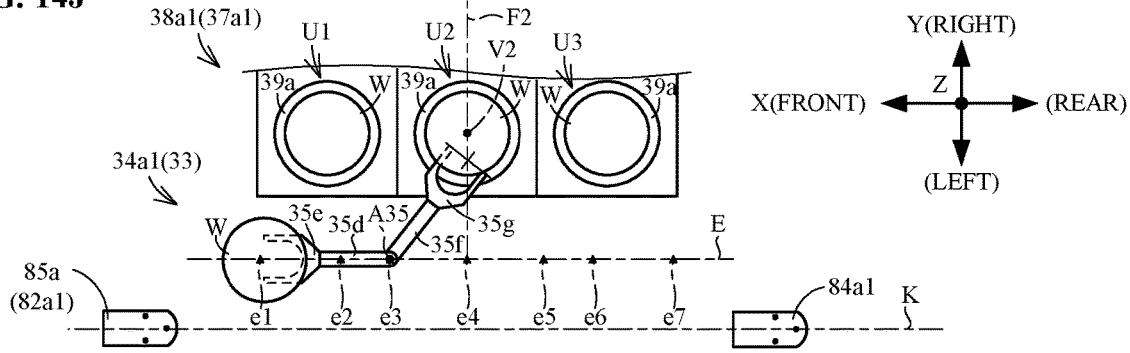
Figure 14K:
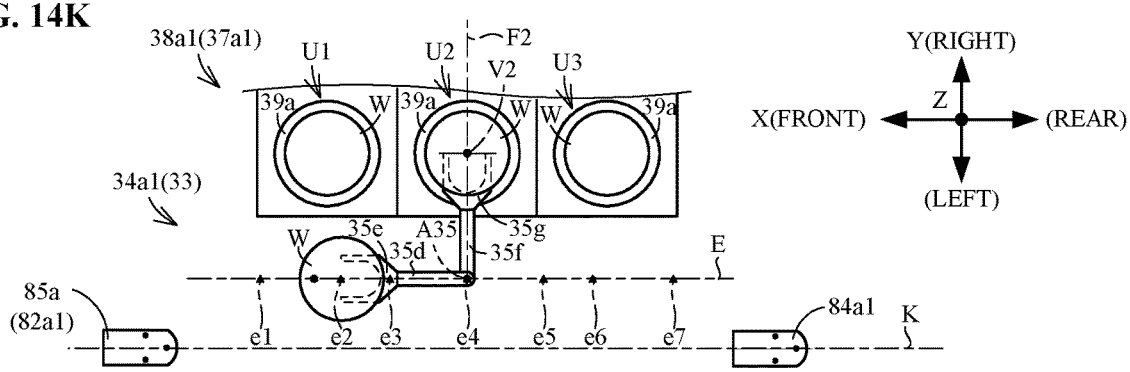
Figure 14L:
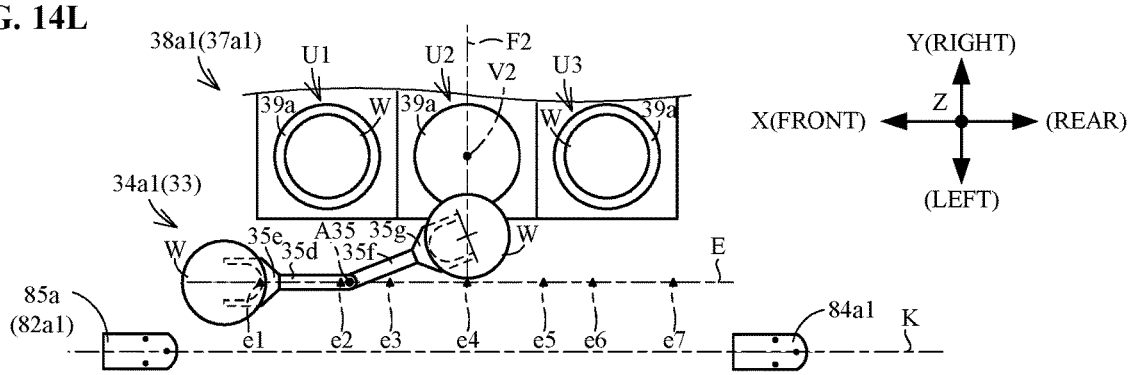
Figure 14M:
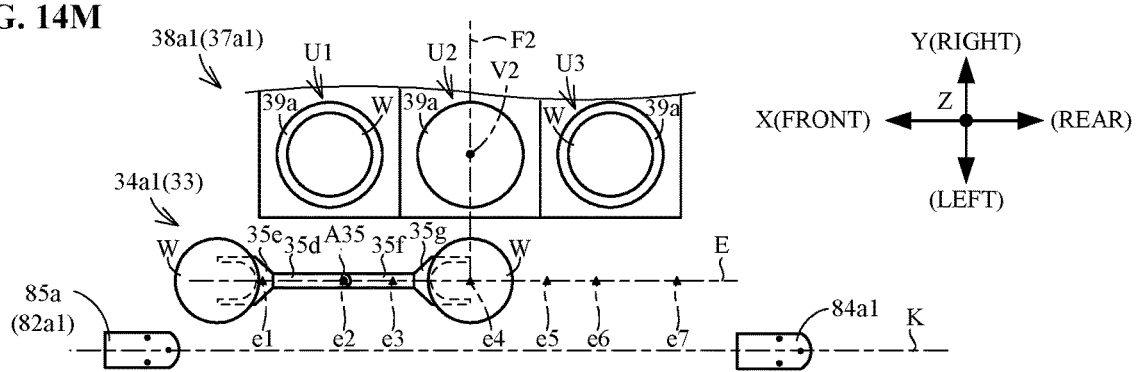
Figure 14N:
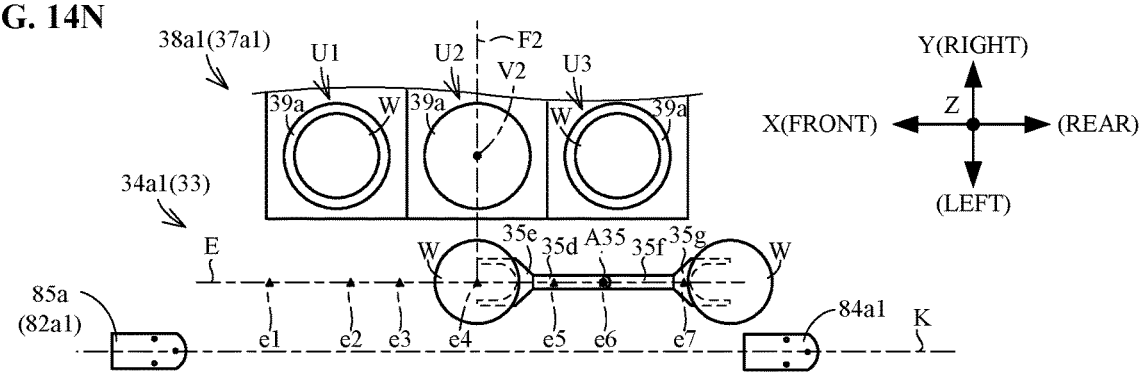
Figure 14O:
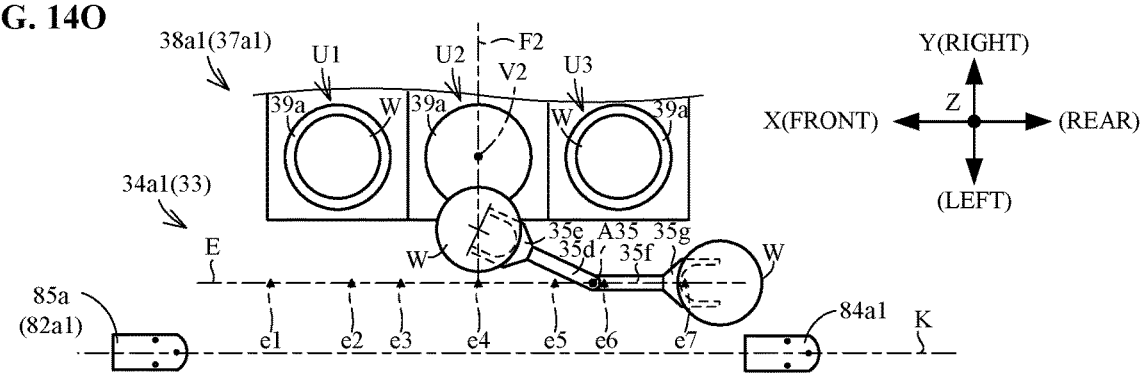
Figure 14P:
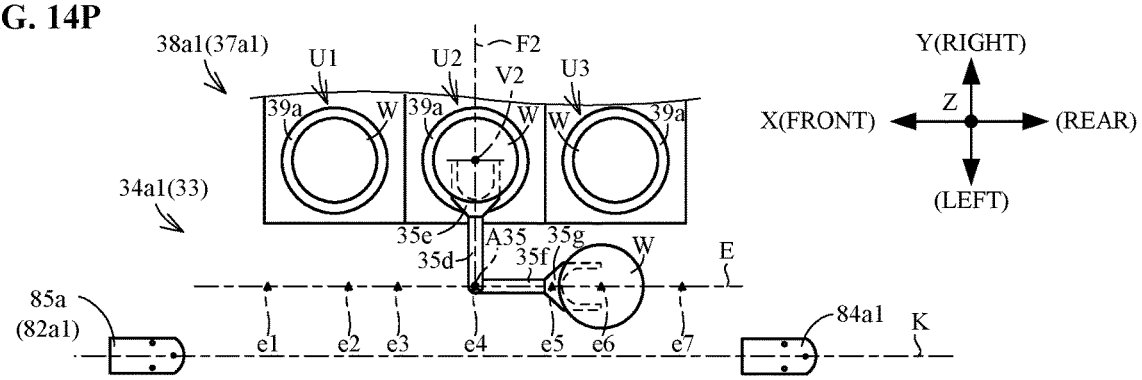
Figure 14Q:
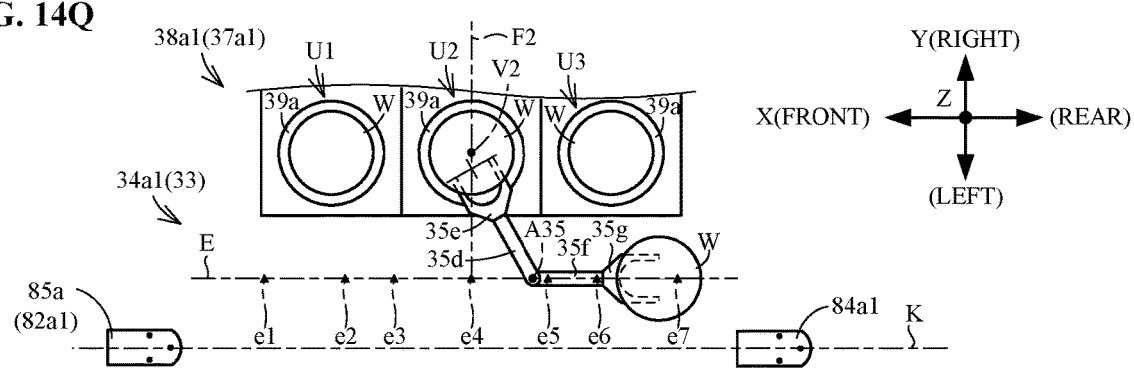
Figure 14R:
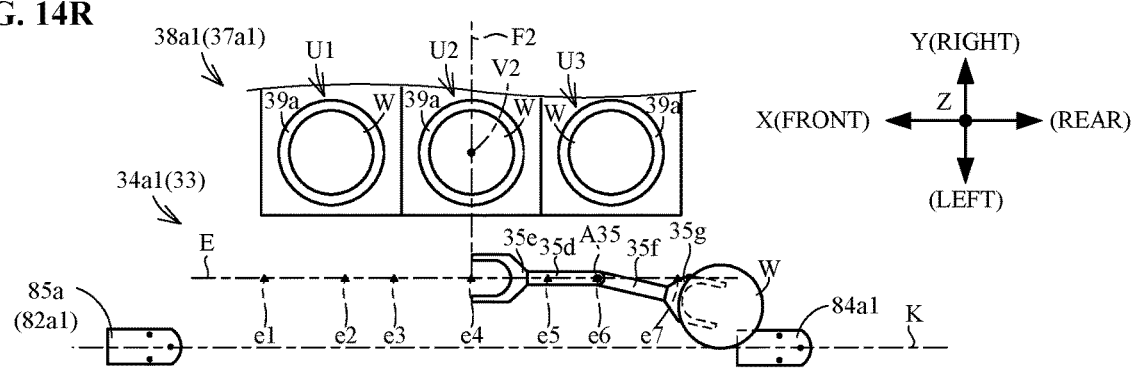

FIGS. 14A-14R are plan views showing an example of operation of the transport mechanism 34a1. These figures illustrate an operation of the transport mechanism 34a1 to access the rack 82a1 and then access the heat-treating units 38a1. FIGS. 14A-14R depict the transport mechanism 34a1 simply.

In the following description, in order to distinguish three heat-treating units 38a1 aligned substantially in the longitudinal direction X, these heat-treating units 38a1 will be referred to as heat-treating units U1, U2 and U3. The heat-treating unit U2 is located rearward of the heat-treating unit U1. The heat-treating unit U3 is located rearward of the heat-treating unit U2.

In the following description, the axes of rotation A35d and A35f will be referred to simply as axis of rotation A35. The axis of rotation A35, in plan view, moves on the imaginary line E. Rotating counterclockwise in FIGS. 14A-14R will be referred to simply as "rotate". Rotating clockwise in FIGS. 14A-14R will be referred to simply as "rotate" or as "rotate in the opposite direction".

FIGS. 14A-14R show points e1, e2, e3, e4, e5, e6, and e7 on the imaginary line E. Point e1 corresponds to a foremost position to which the axis of rotation A35 is movable. Point e7 corresponds to a rearmost position to which the axis of rotation A35 is movable. Point e4 corresponds to a position opposed to the heat-treating unit U2 substantially in the transverse direction Y in plan view. More particularly, the heat-treating unit U2 has an imaginary plate central point V2. The plate central point V2 is located centrally of the first plate 39a of the heat-treating unit U2 in plan view. An imaginary line passing through the plate central point V2 and substantially parallel to the transverse direction Y in plan view is called imaginary line F2. The point e4 is a position where the imaginary line E crosses the imaginary line F2 in plan view.

Points e2 and e3 are located rearward of point e1 and forward of point e4. Point e3 is located rearward of point e2. Points e5 and e6 are located rearward of point e4 and forward of point e7. Point e6 is located rearward of point e5. Points e2 and e6 are determined beforehand from the positional relationship between the axis of rotation A35, holders 35e and 35g, and heat-treating unit U2. Point e3 is determined beforehand from the positional relationship between the axis of rotation A35, holders 35e and 35g, and rack 82a1. Point e5 is determined beforehand from the positional relationship between the axis of rotation A35, holders 35e and 35g, and rack 84a1.

In the following description, the two plates 85 of the rack 82a1 will be called plates 85a and 85b. Wafers W are passed from the indexer's transport mechanism 25 to the transport mechanism 34a1 via the plate 85a. Wafers W are passed from the transport mechanism 34a1 to the indexer's transport mechanism 25 via the plate 85b.

Reference is made to FIG. 14A. The axis of rotation A35 is located rearward of point e3. The arm 35d points forward. The holder 35e is located forward of the axis of rotation A35. The arm 35f points in the direction opposite to the arm 35d. That is, the arm 35f points rearward. The holder 35g is located rearward of the axis of rotation A35. The holder 35e holds one wafer W. The wafer W held by the holder 35e is a treated wafer W, for example. The wafer W held by the holder 35e is a wafer W unloaded from the inspecting section 41a1, for example. The holder 35g is not holding a wafer W. No wafer W is placed on the plate 85b of the rack 82a1.

Reference is made to FIGS. 14A-14D. The horizontal mover 35b moves forward relative to the rail 35a. The axis of rotation A35 moves forward past points e3 and e2 to point e1. When the axis of rotation A35 reaches point e1, the horizontal mover 35b will stop the movement.

When the axis of rotation A35 moves forward to point e3, the arm 35d does not rotate. Consequently, there occurs no change in the relative positional relationship between the axis of rotation A35 and holder 35e. The holder 35e and the wafer W held by the holder 35e make parallel translation forward.

When the axis of rotation A35 moves forward from point e3 to point e1, the arm 35d will rotate. Consequently, when the axis of rotation A35 moves forward from point e3 to point e1, the holder 35e and the wafer W held the holder 35e will move forward and leftward.

When the axis of rotation A35 reaches point e1, the arm 35d will stop its rotation. When the axis of rotation A35 is located at point e1, the holder 35e is located forward and leftward of the axis of rotation A35. When the axis of rotation A35 is located at point e1, the holder 35e and the wafer W held the holder 35e overlap the plate 85b of the rack 82a1 in plan view. When the axis of rotation A35 is located at point e1, the holder 35e will place the wafer W on the plate 85b of the rack 82a1.

When the axis of rotation A35 moves forward past points e3 and e2 to point e1, the arm 35f does not rotate. Consequently, there occurs no change in the relative positional relationship between the axis of rotation A35 and holder 35g. The holder 35g makes parallel translation forward.

Reference is made to FIGS. 14D-14E. The horizontal mover 35b moves rearward relative to the rail 35a. The axis of rotation A35 moves back from point e1.

When the axis of rotation A35 moves back from point e1, the arm 35d will rotate in the opposite direction. Consequently, the holder 35e moves rearward and rightward. When the holder 35e moves rearward and rightward, the holder 35e does not hold a wafer W. The holder 35e moves to a position not overlapping the rack 82a1. When the axis of rotation A35 moves back from point e1, the arm 35f will not rotate. Consequently, the holder 35g makes parallel translation rearward.

Reference is made to FIGS. 14E-14F. The vertical mover 35c moves substantially in the up-down direction Z relative to the horizontal mover 35b. Consequently, the holders 35e and 35g make parallel translation substantially in the up-down direction Z. The holder 35e moves to substantially the same height position as the plate 85a. One wafer W is present on the plate 85a. The wafer W on the plate 85a is a wafer W to be treated, for example.

Reference is made to FIGS. 14F-14G. The horizontal mover 35b moves forward again. The axis of rotation A35 moves forward to point e1 again. When the axis of rotation A35 reaches point e1, the horizontal mover 35b will stop the movement.

When the axis of rotation A35 moves forward to point e1, the arm 35d will rotate. Consequently, when the axis of rotation A35 moves forward to point e1, the holder 35e will move forward and leftward. When the axis of rotation A35 reaches point e1, the arm 35d will stop its rotation. When the axis of rotation A35 is located at point e1, the holder 35e is located forward and leftward of the axis of rotation A35. When the axis of rotation A35 is located at point e1, the holder 35e overlaps the plate 85a of the rack 82a1 in plan view. When the axis of rotation A35 is located at point e1, the holder 35e takes a wafer W from the plate 85a.

When the axis of rotation A35 moves forward to point e1, the arm 35f will not rotate. Consequently, the holder 35g makes parallel translation forward.

Reference is made to FIGS. 14G-14K. The horizontal mover 35b moves rearward again. The axis of rotation A35 moves back from point e1 to point e4. When the axis of rotation A35 reaches point e4, the horizontal mover 35b will stop the movement.

When the axis of rotation A35 moves back from point e1 to point e3, the arm 35d will rotate in the opposite direction. Consequently, the holder 35e and the wafer W held by the holder 35e move rearward and rightward.

When the axis of rotation A35 reaches point e3, the arm 35d will stop its rotation. When the axis of rotation A35 is located at point e3, the arm 35d points forward. The holder 35e is located forward of the axis of rotation A35.

When the axis of rotation A35 moves back from point e3 to point e4, the arm 35d will not rotate. Consequently, the holder 35e and the wafer W held by the holder 35e make parallel translation rearward.

When the axis of rotation A35 moves back from point e1 to point e2, the arm 35f will not rotate. Consequently, the holder 35g makes parallel translation rearward.

When the axis of rotation A35 moves back from point e2 to point e4, the arm 35f will rotate. Consequently, the holder 35g moves rightward. More particularly, the holder 35g moves along the imaginary line F2. The holder 35g, while rotating about the axis of rotation A35, moves rightward along the imaginary line F2 from point e4. The holder 35g moves along the imaginary line F2 from point e4 toward the heat-treating unit U2.

Thus, with the horizontal mover 35b moving substantially in the longitudinal direction X and the arm 35f rotating about the axis of rotation A35, the holder 35g linearly moves substantially in the transverse direction Y toward the heat-treating unit U2.

When the axis of rotation A35 reaches point e4, the arm 35f will stop the rotation. When the axis of rotation A35 is located at point e4, the arm 35f points rightward. When the axis of rotation A35 is located at point e4, the holder 35g is located rightward of the axis of rotation A35. When the axis of rotation A35 is located at point e4, the holder 35g overlaps the first plate 39a of the heat-treating unit U2 in plan view. When the axis of rotation A35 is located at point e4, the holder 35g takes a wafer W from the first plate 39a of the heat-treating unit U2. Here, the wafer W on the first plate 39a of the heat-treating unit U2 is a wafer W already treated by the heat-treating unit U2, for example.

Reference is made to FIGS. 14K-14M. The horizontal mover 35b moves forward. The axis of rotation A35 advances from point e4 to point e2. When the axis of rotation A35 reaches point e2, the horizontal mover 35b will stop the forward movement.

When the axis of rotation A35 advances from point e4 to point e2, the arm 35d will not rotate. Consequently, the holder 35e and the wafer W held by the holder 35e make parallel translation forward.

When the axis of rotation A35 advances from point e4 to point e2, the arm 35f will rotate in the opposite direction. Consequently, the holder 35g and the wafer W held by the holder 35g move leftward. More particularly, the holder 35g and the wafer W held by the holder 35g move along the imaginary line F2. The holder 35g and the wafer W held by the holder 35g move leftward along the imaginary line F2 toward point e4. The holder 35g and the wafer W held by the holder 35g move along the imaginary line F2 away from the heat-treating unit U2. There is no wafer W placed on the first plate 39a of the heat-treating unit U2.

Thus, with the horizontal mover 35b moving substantially in the longitudinal direction X and the arm 35f rotating about the axis of rotation A35, the holder 35g linearly moves substantially in the transverse direction Y away from the heat-treating unit U2. Consequently, the wafer W held by the holder 35g also linearly moves substantially in the transverse direction Y away from the heat-treating unit U2.

When the axis of rotation A35 reaches point e2, the arm 35f will end its rotation in the opposite direction. When the axis of rotation A35 is located at point e2, the arm 35f points rearward. When the axis of rotation A35 is located at point e2, the holder 35g and the wafer W held by the holder 35g are located rearward of the axis of rotation A35.

Reference is made to FIGS. 14M-14N. The horizontal mover 35b moves rearward. The axis of rotation A35 moves back from point e2 to point e6.

When the axis of rotation A35 moves back from point e2 to point e6, the arm 35d will not rotate. Consequently, the holder 35e and the wafer W held by the holder 35e make parallel translation rearward. When axis of rotation A35 moves back from point e2 to point e6, the arm 35f will not rotate. Consequently, the holder 35g and the wafer W held by the holder 35g make parallel translation rearward.

Reference is made to FIGS. 14N-14P. The horizontal mover 35b moves forward. The axis of rotation A35 advances from point e6 to point e4. When the axis of rotation A35 reaches point e4, the horizontal mover 35b will stop the movement.

When the axis of rotation A35 advances from point e6 to point e4, the arm 35d will rotate in the opposite direction. Consequently, the holder 35e and the wafer W held by the holder 35e move rightward. More particularly, the holder 35e and the wafer W held by the holder 35e move along the imaginary line F2. The holder 35e and the wafer W held by the holder 35e move from point e4 rightward along the imaginary line F2. The holder 35e and the wafer W held by the holder 35e move along the imaginary line F2 from point e4 toward the heat-treating unit U2.

Thus, with the horizontal mover 35b moving substantially in the longitudinal direction X and the arm 35d rotating about the axis of rotation A35, the holder 35e linearly moves substantially in the transverse direction Y toward the heat-treating unit U2. Consequently, the wafer W held by the holder 35e is linearly moved substantially in the transverse direction Y toward the heat-treating unit U2.

When the axis of rotation A35 reaches point e4, the arm 35d will stop the rotation. When the axis of rotation A35 is located at point e4, the arm 35d points rightward. When the axis of rotation A35 is located at point e4, the holder 35e and the wafer W held by the holder 35e are located rightward of the axis of rotation A35. When the axis of rotation A35 is located at point e4, the holder 35e and the wafer W held by the holder 35e overlap the first plate 39a of the heat-treating unit U2 in plan view. The holder 35e places the wafer W on the first plate 39a of the heat-treating unit U2.

When the axis of rotation A35 advances from point e6 to point e4, the arm 35f will not rotate. Consequently, the holder 35g and the wafer W held by the holder 35g make parallel translation forward.

Reference is made to FIGS. 14P-14R. The horizontal mover 35b moves rearward. The axis of rotation A35 moves back from point e4 to point e6.

When the axis of rotation A35 moves back from point e4 to point e6, the arm 35d will rotate. Consequently, the holder 35e moves leftward. More particularly, the holder 35e moves along the imaginary line F2. The holder 35e moves leftward along the imaginary line F2 toward point e4. The holder 35e moves along the imaginary line F2 away from the heat-treating unit U2. The holder 35e is not holding a wafer W.

Thus, with the horizontal mover 35b moving substantially in the longitudinal direction X and the arm 35d rotating about the axis of rotation A35, the holder 35e linearly moves substantially in the transverse direction Y away from the heat-treating unit U2.

When the axis of rotation A35 reaches point e6, the arm 35d will end its rotation. When the axis of rotation A35 is located at point e6, the arm 35d points forward. When the axis of rotation A35 is located at point e6, the holder 35e is located forward of the axis of rotation A35.

When the axis of rotation A35 moves back from point e4 to point e5, the arm 35f will not rotate. Consequently, the holder 35g and the wafer W held by the holder 35g make parallel translation rearward.

When the axis of rotation A35 moves back from point e5 to point e6, the arm 35f will rotate in the opposite direction. Consequently, the holder 35g and the wafer W held by the holder 35g move leftward and rearward.

Subsequently, although not shown, the transport mechanism 34a1 accesses the rack 84a1. For example, with the horizontal mover 35b moving further rearward, the axis of rotation A35 will move back to point e7. When the axis of rotation A35 moves back from point e5 to point e7, the holder 35g will rotate in the opposite direction. And when the axis of rotation A35 is located at point e7, the holder 35g will place the wafer W on the rack 84a1.

The transport mechanisms 34a2-34a4 and 34b1-34b4 operate as does the transport mechanism 34a1.

In the example of operation described above, the transport mechanism 34a1 transports wafers W from the rack 82a1 (plate 85a) to the heat-treating unit 38a1 (U2) (see FIGS. 14F-14P). However, this is not limitative. For example, the transport mechanism 34a1 can transport wafers W between the rack 82a1 and rack 84a1 without placing the wafers W on the heat-treating unit 38a1.

For expediency, an example of operation in which the transport mechanism 34a1 transports wafers W from the rack 82a1 to the rack 84a1 without placing the wafers W on the heat-treating unit 38a1 will be described with reference to FIGS. 14A-14R.

First, the holder 35e takes a wafer W from the rack 82a1 (FIGS. 14F-14G). Then, the holder 35e moves to the position shown in FIG. 14N. The holder 35e and the wafer W held by the holder 35e are located forward of the axis of rotation A35.

Next, while the horizontal mover 35b moves forward, the arm 35d rotates. Consequently, the wafer W held by the holder 35e moves along the imaginary line F2 toward the heat-treating unit U2 (FIGS. 14N-14P). When the holder 35e reaches the position shown in FIG. 14P, the holder 35e will not place the wafer W on the heat-treating unit U2. The holder 35e will keep holding the wafer W, in a space above the first plate 39a. The holder 35e and the wafer W held by the holder 35e move rightward of the axis of rotation A35.

Then, the horizontal mover 35b advances further, and the arm 35d rotates further. Consequently, the arm 35d and holder 35e execute substantially the same operation as the arm 35f and holder 35g shown in FIGS. 14K-14M. The wafer W held by the holder 35e moves along the imaginary line F2 away from the heat-treating unit U2. The holder 35e and the wafer W held by the holder 35e move rearward of the axis of rotation A35.

Subsequently, the horizontal mover 35b moves back. Consequently, the holder 35e accesses the rack 84a1 and places the wafer W on the rack 84a1.

Thus, the holder 35e can circle about the axis of rotation A35 using the space of the heat-treating unit 38a1. The holder 35e can move from the position forward of the axis of rotation A35 to the position rearward of the axis of rotation A35 without placing the wafer W on the heat-treating unit 38a1. The holder 35e can therefore access the rack 84a1 after accessing the rack 82a1. Consequently, the transport mechanism 34a1 can transport the wafer W from the rack 82a1 to the rack 84a1 without placing the wafer W on the heat-treating unit 38a1.

With the transport mechanism 34a1 following a procedure reverse to the foregoing example of operation, the holder 35e can move from the position rearward of the axis of rotation A35 to the position forward of the axis of rotation A35 by using the space of the heat-treating unit 38a1. Consequently, the transport mechanism 34a1 can transport a wafer W from the rack 84a1 to the rack 82a1 without placing the wafer W on the heat-treating unit 38a1.

Note that the arms 35d and 35f are rotatable approximately 250 degrees about the axis of rotation A35, respectively.

Advantageous Effects of the Embodiment

The heat-treating section 37a1 and transporting space 32 are aligned substantially in the transverse direction Y. The heat-treating section 37a1 has a plurality of heat-treating units 38a1. Each of the heat-treating units 38a1 performs heat treatment on one wafer W. The transport mechanism 34a1 transports wafers W to the heat-treating units 38a1. Here, the heat-treating units 38a1 are aligned substantially in the longitudinal direction X. Consequently, the number of heat-treating units 38a1 included in the heat-treating section 37a1 can be increased relatively easily. The heat-treating section 37a1 can therefore perform heat treatment in parallel on a relatively large number of wafers W. Thus, the throughput of the substrate treating apparatus 1 can be improved conveniently.

Similarly, the heat-treating section 37b1 and transporting space 32 are aligned substantially in the transverse direction Y. More particularly, the transporting space 32 is located substantially in the transverse direction Y between the heat-treating section 37a1 and heat-treating section 37b1. The heat-treating section 37b1 has a plurality of heat-treating units 38b1. Each of the heat-treating units 38b1 performs heat treatment on one wafer W. The transport mechanism 34b1 transports wafers W to the heat-treating units 38b1. Here, the heat-treating units 38b1 are aligned substantially in the longitudinal direction X. Consequently, the number of heat-treating units 38b included in the heat-treating section 37b1 can be increased relatively easily. The heat-treating section 37b1 can therefore perform heat treatment in parallel on a relatively large number of wafers W. Thus, the throughput of the substrate treating apparatus 1 can be improved conveniently.

Here, the number of heat-treating units 38a1 included in heat-treating section 37a1 does not exceed twelve. This can conveniently prevent an excessive increase in the transport load of wafers W falling on the transport mechanism 34a1. Similarly, the number of heat-treating units 38b1 included in heat-treating section 37b1 does not exceed twelve. This can conveniently prevent an excessive increase in the transport load of wafers W falling on the transport mechanism 34b1.

The transport mechanism 34a1 is movable substantially in the longitudinal direction X relative to the heat-treating units 38a1. The transport mechanism 34a1 can therefore conveniently access the heat-treating units 38a1. The transport mechanism 34b1 is movable substantially in the longitudinal direction X relative to the heat-treating units 38b1. The transport mechanism 34b1 can therefore conveniently access the heat-treating units 38b1.

The transport mechanism 34b1 is movable independently of the transport mechanism 34a1. The transport mechanisms 34a1 and 34b1 can therefore efficiently access the heat-treating units 38a1 and 38b1, respectively.

The transport mechanism 34a1 has a horizontal mover 35b, arms 35d and 35f, and holders 35e and 35g. The arms 35d and 35f are supported by the horizontal mover 35b. The holders 35e and 35g are fixed to the arms 35d and 35f. Thus, the holders 35e and 35g are indirectly supported by the horizontal mover 35b. The horizontal mover 35b is movable substantially in the longitudinal direction X relative to the heat-treating units 38a1. The holders 35e and 35g are therefore movable substantially in the longitudinal direction X relative to the heat-treating units 38a1. The arms 35d and 35f are rotatable about the axes of rotation A35d and A35f relative to the horizontal mover 35b. The holders 35e and 35g are thus rotatable about the axes of rotation A35d and A35f relative to the horizontal mover 35b. The holders 35e and 35g can therefore conveniently access the heat-treating units 38a1.

The transport mechanism 34b1 has substantially the same construction as the transport mechanism 34a1. Consequently, the holders 35e and 35g of the transport mechanism 34b1 can conveniently access the heat-treating units 38b1.

In plan view, the position of the axes of rotation A35d and A35f relative to the horizontal mover 35b is constant. Consequently, the arms 35d and 35f are supported by a simple construction on the horizontal mover 35b. The holders 35e and 35g are fixed to the arms 35d and 35E Further, in plan view, the distance between the holder 35e and the axis of rotation A35d is constant. In plan view, the distance between the holder 35g and the axis of rotation A35f is constant. Consequently, the holders 35e and 35g are supported by a simple construction on the arms 35d and 35E Thus, the transport mechanism 34a1 has a simple construction. As a result, the size of the transport mechanism 34a1 is relatively small. For example, the size of the arms 35d and 35f is relatively small. An installation space for the transport mechanism 34a1 in plan view can be reduced effectively. Consequently, the area of the transporting space 32 in plan view can be reduced effectively.

Incidentally, with the transport mechanism 68a, the position of the axis of rotation A69e relative to the horizontal mover 69d in plan view is constant, but the distance between the holder 69f and the axis of rotation A69e in plan view is not constant. Further, the distance of between the holder 69g and the axis of rotation A69e in plan view is not constant. The construction of the transport mechanism 68a is therefore relatively complicated. This will be described specifically hereinafter.

In plan view, the position of the axis of rotation A69e relative to the horizontal mover 69d is constant. For example, even when the rotating element 69e rotates about the axis of rotation A69e relative to the horizontal mover 69d, the axis of rotation A69e is maintained in the position rightward of the horizontal mover 69d in plan view. Consequently, the rotating element 69e is supported on the horizontal mover 69d through a relatively simple construction. However, the distance between the holder 69f and the axis of rotation A69e in plan view is not constant. For example, when the holder 69f advances or withdraws relative to the rotating element 69e, the holder 69f will move toward or away from the axis of rotation A69e in plan view. The construction in which the rotating element 69e supports the holder 69f is therefore relatively complicated. Consequently, the rotating element 69e is relatively large. Similarly, in plan view, the distance between the holder 69g and the axis of rotation A69e is not constant. The construction in which the rotating element 69e supports the holder 69g is therefore also relatively complicated. Consequently, the rotating element 69e is increased in size.

The transport mechanism 34b1 has substantially the same construction as the transport mechanism 34a1. Thus, the construction of the transport mechanism 34b1 is simple. This can effectively reduce the installation space for the transport mechanism 34b1 in plan view. Consequently, the area of the transporting space 32 in plan view can be reduced with increased effect.

Regarding the transport mechanism 34a1, when the horizontal mover 35b moves substantially in the longitudinal direction X, the holders 35e and 35g will make parallel translation substantially in the longitudinal direction X. When the arm 35d rotates about the axis of rotation A35d, the holder 35e will rotate about the axis of rotation A35d. When the arm 35f rotates about the axis of rotation A35f, the holder 35g will rotate about the axis of rotation A35f. Here, when the arm 35d rotates about the axis of rotation A35d while the horizontal mover 35b moves substantially in the longitudinal direction X, a wafer W held by the holder 35e will be linearly moved substantially in the transverse direction Y toward the heat-treating unit 38a1. Similarly, when the arm 35f rotates about the axis of rotation A35f while the horizontal mover 35b moves substantially in the longitudinal direction X, a wafer W held by the holder 35g will be linearly moved substantially in the transverse direction Y toward the heat-treating unit 38a1. Therefore, even if the length La in the longitudinal direction X of one heat-treating unit 38a1 is short, the transport mechanism 34a1 can conveniently transport the wafer W to the heat-treating unit 38a1.

Regarding the transport mechanism 34b1 also, when the arms 35d and 35f rotate about the axes of rotation A35d and A35f while the horizontal mover 35b moves substantially in the longitudinal direction X, wafers W held by the holders 35e and 35g will be linearly moved substantially in the transverse direction Y toward the heat-treating unit 38b1. Therefore, even if the length Lb in the longitudinal direction X of one heat-treating unit 38b1 is short, the transport mechanism 34b1 can conveniently transport the wafers W to the heat-treating unit 38b1.

The length La in the longitudinal direction X of each heat-treating unit 38a1 does not exceed three times the radius r of wafers W. Thus, the size of the heat-treating unit 38a1 is relatively small. The installation space of the heat-treating unit 38a1 can therefore be reduced conveniently. The length Lb in the longitudinal direction X of each heat-treating unit 38b1 does not exceed three times the radius r of wafers W. Thus, the size of the heat-treating unit 38b1 is relatively small. The installation space of the heat-treating unit 38b1 can therefore be reduced conveniently.

As described above, the transport mechanism 34a1 linearly transports wafers W substantially in the transverse direction Y toward the heat-treating unit 38a1. Therefore, even if the length La does not exceed three times the radius r of wafers W, the transport mechanism 34a1 can conveniently transport wafers W to the heat-treating unit 38a1. Similarly, the transport mechanism 34b1 linearly transports wafers W substantially in the transverse direction Y toward the heat-treating unit 38b1. Therefore, even if the length Lb does not exceed three times the radius r of wafers W, the transport mechanism 34b1 can conveniently transport wafers W to the heat-treating unit 38b1.

The distance Da between two first central points Ga1 adjoining substantially in the longitudinal direction X does not exceed three times the radius r of wafers W. Thus, the distance Da is relatively small. Consequently, the size of the heat-treating units 38a1 is relatively small, and two heat-treating units 38a1 aligned substantially in the longitudinal direction X are close to each other. The installation space of the heat-treating units 38a1 can therefore be reduced conveniently. That is, the installation space of the heat-treating section 37a1 can be reduced conveniently. Similarly, the distance Db between two second central points Gb1 adjoining substantially in the longitudinal direction X does not exceed three times the radius r of wafers W. Thus, the size of the heat-treating units 38b1 is relatively small, and two heat-treating units 38b1 aligned substantially in the longitudinal direction X are close to each other. The installation space of the heat-treating units 38b1 can therefore be reduced conveniently. That is, the installation space of the heat-treating section 37b1 can be reduced conveniently. Consequently, the footprint of the substrate treating apparatus 1 can be reduced.

The length L1 in the transverse direction Y of the transporting space 32 does not exceed five times the radius r of wafers W. This realizes a reduction in the area of the transporting space 32 in plan view. The footprint of the substrate treating apparatus 1 can therefore be reduced.

The heat treatment the heat-treating section 37a1 performs on wafers W includes pretreatment. The heat treatment the heat-treating section 37b1 performs on wafers W also includes pretreatment. Here, the pretreatment is heat treatment performed on wafers W before solution treatment. The substrate treating apparatus 1 can therefore efficiently perform pretreatment on wafers W.

The heat treatment the heat-treating section 37a1 performs on wafers W includes posttreatment. The heat treatment the heat-treating section 37b1 performs on wafers W also includes posttreatment. Here, the posttreatment is heat treatment performed on wafers W after solution treatment. The substrate treating apparatus 1 can therefore efficiently perform posttreatment on wafers W.

The heat treatment the heat-treating section 37a1 performs on wafers W includes hydrophobizing treatment. The heat treatment the heat-treating section 37b1 performs on wafers W also includes hydrophobizing treatment. The substrate treating apparatus 1 can therefore efficiently perform hydrophobizing treatment on wafers W.

The heat treatment the heat-treating section 37a1 performs on wafers W includes heating treatment. The heat treatment the heat-treating section 37b1 performs on wafers W also includes heating treatment. The substrate treating apparatus 1 can therefore efficiently perform heating treatment on wafers W.

The heat treatment the heat-treating section 37a1 performs on wafers W includes cooling treatment. The heat treatment the heat-treating section 37b1 performs on wafers W also includes cooling treatment. The substrate treating apparatus 1 can therefore efficiently perform cooling treatment on wafers W.

The heat treatment the heat-treating section 37b1 performs on wafers W is the same as the heat treatment the heat-treating section 37a1 performs on wafers W. The substrate treating apparatus 1 can therefore efficiently perform heat treatment on wafers W.

The rack 82a1 and rack 82b1 are aligned in the up-down direction Z. The rack 82b1 overlaps the rack 82a1 in plan view. This realizes a reduction in the installation space of the racks 82a1 and 82b1 in plan view. The footprint of the substrate treating apparatus 1 can therefore be reduced.

The solution treating section 71 is located outside the area Ba where the transport mechanism 34a1 can transport wafers W. Thus, the solution treating section 71 is located in a position inaccessible to the transport mechanism 34a1. The transport mechanism 34a1 does not therefore transport wafers W to the solution treating section 71. This can conveniently prevent an excessively large transport load of wafers W falling on the transport mechanism 34a1. The solution treating section 71 is located outside the area Bb where the transport mechanism 34b1 can transport wafers W. The transport mechanism 34b1 does not therefore transport wafers W to the solution treating section 71. This can conveniently prevent an excessively large transport load of wafers W falling on the transport mechanism 34b1.

The substrate treating apparatus 1 includes the solution treating transport mechanism 67. Consequently, wafers W can conveniently be transported to the solution treating section 71.

The solution treating transport mechanism 67 is located rearward of the transport mechanism 34a1. Consequently, the transport mechanism 34a1 can conveniently be prevented from interfering with the solution treating transport mechanism 67. The solution treating transport mechanism 67 is located rearward of the transport mechanism 34b1. Consequently, the transport mechanism 34b1 can conveniently be prevented from interfering with the solution treating transport mechanism 67.

The solution treating section 71 is located in a position adjoining the solution treating transport mechanism 67. Consequently, the solution treating transport mechanism 67 can easily access the solution treating section 71.

The transport mechanisms 34a2 and 34b2 are arranged above the transport mechanisms 34a1 and 34b1. This can reduce the installation space of the transport mechanisms 34a1, 34a2, 34b1 and 34b2 in plan view. In other words, the installation area of the transporting space 32 in plan view can be reduced.

The heat-treating section 37a2 overlaps the heat-treating section 37a1 in plan view. This can reduce the installation space of the heat-treating sections 37a1 and 37a2 in plan view. The heat-treating section 37b2 overlaps the heat-treating section 37b1 in plan view. This can reduce the installation space of the heat-treating sections 37b1 and 37b2 in plan view.

The heat-treating section 37a2 and transporting space 32 are aligned substantially in the transverse direction Y. The heat-treating section 37a2 has a plurality of heat-treating units 38a2. Each of the heat-treating units 38a2 performs heat treatment on one wafer W. The transport mechanism 34a2 transports wafers W to the heat-treating units 38a2. Here, the heat-treating units 38a2 are aligned substantially in the longitudinal direction X. Consequently, the number of heat-treating units 38a2 included in the heat-treating section 37a2 can be increased relatively easily. The heat-treating section 37a2 can therefore perform heat treatment in parallel on a relatively large number of wafers W. Thus, the throughput of the substrate treating apparatus 1 can be improved conveniently.

The heat-treating section 37b2 and transporting space 32 are aligned substantially in the transverse direction Y. More particularly, the transporting space 32 is located substantially in the transverse direction Y between the heat-treating section 37a2 and heat-treating section 37b2. The heat-treating section 37b2 has a plurality of heat-treating units 38b2. Each of the heat-treating units 38b2 performs heat treatment on one wafer W. The transport mechanism 34b2 transports wafers W to the heat-treating units 38b2. Here, the heat-treating units 38*b*2 are aligned substantially in the longitudinal direction X. Consequently, the number of heat-treating units 38*b*2 included in the heat-treating section 37*b*2 can be increased relatively easily. The heat-treating section 37*b*2 can therefore perform heat treatment in parallel on a relatively large number of wafers W. Thus, the throughput of the substrate treating apparatus 1 can be improved conveniently.

The heat treatment the heat-treating sections 37*a*2, 37*b*1 and 37*b*2 perform on wafers W is the same as the heat treatment the heat-treating section 37*a*1 performs on wafers W. The substrate treating apparatus 1 can therefore efficiently perform heat treatment on wafers W.

The racks 82*a*1, 82*a*2, 82*b*1 and 82*b*2 are aligned substantially in the up-down direction Z. The racks 82*a*2, 82*b*1 and 82*b*2 overlap the rack 82*a*1 in plan view, respectively. This can reduce the installation space of the racks 82*a*1, 82*a*2, 82*b*1 and 82*b*2 in plan view. Thus, the footprint of the substrate treating apparatus 1 can be reduced.

The indexer's transport mechanism 25 transports wafers W between the carrier C and rack 82*a*1. Consequently, wafers W can be transported between the indexer's transport mechanism 25 and transport mechanism 34*a*1 through the rack 82*a*1. For example, the indexer's transport mechanism 25 can pass wafers W taken from the carrier C on to the transport mechanism 34*a*1. For example, the indexer's transport mechanism 25 can load wafers W received from the transport mechanism 34*a*1 into the carrier C.

Similarly, the indexer's transport mechanism 25 transports wafers W between the carrier C and rack 82*b*1. Consequently, wafers W can be transported between the indexer's transport mechanism 25 and transport mechanism 34*b*1 through the rack 82*b*1. The indexer's transport mechanism 25 transports wafers W between the carrier C and rack 82*a*2. Consequently, wafers W can be transported between the indexer's transport mechanism 25 and transport mechanism 34*a*2 through the rack 82*a*2. The indexer's transport mechanism 25 transports wafers W between the carrier C and rack 82*b*2. Consequently, wafers W can be transported between the indexer's transport mechanism 25 and transport mechanism 34*b*2 through the rack 82*b*2.

The solution treating section 71 is located outside the area where the transport mechanism 34*a*2 can transport wafers W. The transport mechanism 34*a*2 does not therefore transport wafers W to the solution treating section 71. This can conveniently prevent an excessively large transport load of wafers W falling on the transport mechanism 34*a*2.

The solution treating section 71 is located outside the area where the transport mechanism 34*b*2 can transport wafers W. The transport mechanism 34*b*2 does not therefore transport wafers W to the solution treating section 71. This can conveniently prevent an excessively large transport load of wafers W falling on the transport mechanism 34*b*2.

The solution treating transport mechanism 67 is located rearward of the transport mechanisms 34*a*2 and 34*b*2. Consequently, the transport mechanisms 34*a*2 and 34*b*2 can conveniently be prevented from interfering with the solution treating transport mechanism 67.

The solution treating section 71 is located in a position aligning with the solution treating transport mechanism 67 substantially in the transverse direction Y. The solution treating transport mechanism 67 can therefore easily access the solution treating section 71.

The racks 84*a*1, 84*a*2, 84*b*1 and 84*b*2 are aligned substantially in the up-down direction Z. The racks 84*a*2, 84*b*1 and 84*b*2 overlap the rack 84*a*1 in plan view, respectively. This can reduce the installation space of the racks 84*a*1, 84*a*2, 84*b*1 and 84*b*2 in plan view. Consequently, the footprint of the substrate treating apparatus 1 can be reduced.

The transport mechanism 34*a*1 and solution treating transport mechanism 67 can place wafers W on the rack 84*a*1. The wafers W can therefore be transported through the rack 84*a*1 between the transport mechanism 34*a*1 and solution treating transport mechanism 67. For example, the solution treating transport mechanism 67 can receive wafers W from the transport mechanism 34*a*1. For example, the solution treating transport mechanism 67 can pass wafers W on to the transport mechanism 34*a*1.

Similarly, the transport mechanism 34*b*1 and solution treating transport mechanism 67 can place wafers W on the rack 84*b*1. The wafers W can therefore be transported through the rack 84*b*1 between the transport mechanism 34*b*1 and solution treating transport mechanism 67. The transport mechanism 34*a*2 and solution treating transport mechanism 67 can place wafers W on the rack 84*a*2. The wafers W can therefore be transported through the rack 84*a*2 between the transport mechanism 34*a*2 and solution treating transport mechanism 67. The transport mechanism 34*b*2 and solution treating transport mechanism 67 can place wafers W on the rack 84*b*2. The wafers W can therefore be transported through the rack 84*b*2 between the transport mechanism 34*b*2 and solution treating transport mechanism 67.

The substrate treating apparatus 1 includes the inspecting sections 41*a*1-41*a*4 and 41*b*1-41*b*4. The substrate treating apparatus 1 can thereby perform inspection of wafers W efficiently.

The movable member 51*a*1 is supported by the first frame 46. The heat-treating section 37*a*1 is supported by the movable member 51*a*1. The movable member 51*a*1 is movable relative to the first frame 46. When the movable member 51*a*1 moves relative to the first frame 46, the heat-treating section 37*a*1 will move relative to the first frame 46. This facilitates maintenance for the heat-treating section 37*a*1.

The transport mechanism 34*a*1 is supported by the movable member 51*a*1. When the movable member 51*a*1 moves relative to the first frame 46, the heat-treating section 37*a*1 will move together with the transport mechanism 34*a*1. Consequently, when the movable member 51*a*1 moves relative to the first frame 46, the relative position of the heat-treating section 37*a*1 and transport mechanism 34*a*1 can be kept constant. Thus, with the relative position of the heat-treating section 37*a*1 and transport mechanism 34*a*1 kept constant, maintenance work can be done for the heat-treating section 37*a*1. There is no need to adjust the relative position of the heat-treating section 37*a*1 and transport mechanism 34*a*1 each time maintenance is done for the heat-treating section 37*a*1. That is, the heat-treating section 37*a*1 can be maintained with increased ease.

According to the substrate treating apparatus 1, as noted above, maintenance work therefor can be done with ease.

When the movable member 51*a*1 moves relative to the first frame 46, the heat-treating section 37*a*1 will move substantially horizontally relative to the first frame 46. Consequently, the heat-treating section 37*a*1 can move relative to the first frame 46 without interfering with other members. For example, even where other members are arranged at least either above or below the heat-treating section 37*a*1, the heat-treating section 37*a*1 can move relative to the first frame 46 without interfering with the other members.

When the movable member 51a1 moves relative to the first frame 46, the heat-treating section 37a1 can be moved to the maintenance position Qa1. The heat-treating section 37a1 can therefore be moved to the maintenance position Qa1 easily.

When the heat-treating section 37a1 is in the maintenance position Qa1, at least part of the heat-treating section 37a1 is located outside the first frame 46. Thus, when the heat-treating section 37a1 is in the maintenance position Qa1, the heat-treating section 37a1 can be maintained easily.

When the heat-treating section 37a1 is in the maintenance position Qa1, the movable member 51a1 is supported by the first frame 46. Thus, when the heat-treating section 37a1 is in the maintenance position Qa1, the heat-treating section 37a1 is supported by the first frame 46 through the movable member 51a1. Consequently, the heat-treating section 37a1 can be maintained with increased ease.

When the movable member 51a1 moves relative to the first frame 46, the heat-treating section 37a1 can move to the treating position Pa1. Thus, the heat-treating section 37a1 can be moved to the treating position Pa1 easily. Consequently, the heat-treating section 37a1 can be moved easily between the maintenance position Qa1 and treating position Pa1.

As noted above, when the movable member 51a1 moves relative to the first frame 46, the heat-treating section 37a1 will move together with the transport mechanism 34a1. Consequently, also when the movable member 51a1 moves to the treating position Pa1, the relative position of the heat-treating section 37a1 and transport mechanism 34a1 can be kept constant. In sum, with the relative position of the heat-treating section 37a1 and transport mechanism 34a1 kept constant, the heat-treating section 37a1 can be moved easily between the maintenance position Qa1 and treating position Pa1.

The part of heat-treating section 37a1 located outside the first frame 46 when the heat-treating section 37a1 is in the maintenance position Qa1 is larger than the part of heat-treating section 37a1 located outside the first frame 46 when the heat-treating section 37a1 is in the treating position Pa1. Consequently, when the heat-treating section 37a1 is in the maintenance position Qa1, the heat-treating section 37a1 can be maintained easily. When the heat-treating section 37a1 is in the treating position Pa1, the heat-treating section 37a1 can appropriately carry out heat treatment on wafers W.

When the heat-treating section 37a1 is in the treating position Pa1, the whole of heat-treating section 37a1 is located inside the first frame 46. Thus, when the heat-treating section 37a1 is in the treating position Pa1, the heat-treating section 37a1 can perform heat treatment on wafers W more appropriately.

When the heat-treating section 37a1 is in the treating position Pa1, the movable member 51a1 is supported by the first frame 46. Thus, when the heat-treating section 37a1 is in the treating position Pa1, the heat-treating section 37a1 is supported by the first frame 46 through the movable member 51a1. Consequently, the heat-treating section 37a1 can perform heat treatment on wafers W more appropriately.

Regarding the transport mechanism 34a1, the rail 35a is fixed to the movable member 51a1. The horizontal mover 35b is supported by the rail 35a. The arms 35d and 35f are supported by the horizontal mover 35b. The holder 35e is fixed to the arm 35d. The holder 35g is fixed to the arm 35E Thus, the rail 35a, horizontal mover 35b, arms 35d and 35f, and holders 35e and 35g are directly or indirectly supported by the movable member 51a1. Consequently, the movable member 51a1 can conveniently support the transport mechanism 34a1.

The horizontal mover 35b is movable substantially in a horizontal direction relative to the rail 35a. The holders 35e and 35g are movable substantially in the horizontal direction relative to the rail 35a. The arm 35d is rotatable about the axis of rotation A35d relative to the horizontal mover 35b. The holder 35e is therefore rotatable about the axis of rotation A35d relative to the horizontal mover 35b. The arm 35f is rotatable about the axis of rotation A35f relative to the horizontal mover 35b. The holder 35g is therefore rotatable about the axis of rotation A35f relative to the horizontal mover 35b. Consequently, the holders 35e and 35g can conveniently access the heat-treating section 37a1.

The vertical mover 35c is supported by the horizontal mover 35b. The vertical mover 35c is movable substantially in the up-down direction Z relative to the horizontal mover 35b. The arms 35d and 35f are supported by the horizontal mover 35b through the vertical mover 35c. Consequently, when the vertical mover 35c moves substantially in the up-down direction Z relative to the horizontal mover 35b, the arms 35d and 35f and holders 35e and 35g will move substantially in the up-down direction Z relative to the horizontal mover 35b. Thus, the holders 35e and 35g can access the heat-treating section 37a1 with increased convenience.

The movable member 51b1 is supported by the second frame 47. The heat-treating section 37b1 is supported by the movable member 51b1. The movable member 51b1 is movable relative to the second frame 47. When the movable member 51b1 moves relative to the second frame 47, the heat-treating section 37b1 will move relative to the second frame 47. This facilitates maintenance for the heat-treating section 37b1.

The transport mechanism 34b1 is supported by the movable member 51b1. When the movable member 51b1 moves relative to the second frame 47, the heat-treating section 37b1 will move together with the transport mechanism 34b1. Consequently, when the movable member 51b1 moves relative to the second frame 47, the relative position of the heat-treating section 37b1 and transport mechanism 34b1 can be kept constant. Thus, with the relative position of the heat-treating section 37b1 and transport mechanism 34b1 kept constant, maintenance work can be done for the heat-treating section 37b1. There is no need to adjust the relative position of the heat-treating section 37b1 and transport mechanism 34b1 each time maintenance is done for the heat-treating section 37b1. That is, the heat-treating section 37b1 can be maintained with increased ease.

According to the substrate treating apparatus 1, as noted above, maintenance work is done with increased ease.

The substrate treating apparatus 1 includes the heat-treating section 37b1 in addition to the heat-treating section 37a1. This can conveniently improve the throughput of the substrate treating apparatus 1.

The second frame 47 is located in substantially the same height position as the first frame 46. In other words, the first frame 46 and second frame 47 are aligned substantially in a horizontal direction. The transport mechanism 34a1 is located between the heat-treating section 37a1 and second frame 47. The transport mechanism 34b1 is located between the heat-treating section 37b1 and first frame 46. In other words, the heat-treating section 37a1, transport mechanism 34a1, transport mechanism 34b1, and heat-treating section 37b1 are arranged in this order to align substantially in a horizontal direction. This realizes an efficient installation of the heat-treating sections 37a1 and 37b1 and transport mechanisms 34a1 and 34b1.

The second frame 47 is located leftward of the first frame 46. The transport mechanism 34a1 is located leftward of the heat-treating section 37a1. The transport mechanism 34b1 is located leftward of the transport mechanism 34a1. The heat-treating section 37b1 is located leftward of the transport mechanism 34b1. This realizes an efficient installation of the heat-treating sections 37a1 and 37b1 and transport mechanisms 34a1 and 34b1.

When the movable member 51a1 moves relative to the first frame 46, the heat-treating section 37a1 can move in a first direction relative to the first frame 46. When the heat-treating section 37a1 moves in the first direction relative to the first frame 46, the heat-treating section 37a1 will move away from the second frame 47. Consequently, the heat-treating section 37a1 can move without interfering with the second frame 47.

The heat-treating section 37a1 is located rightward of the heat-treating section 37b1. When the movable member 51a1 moves relative to the first frame 46, the heat-treating section 37a1 can move rightward relative to the first frame 46. When the heat-treating section 37a1 moves rightward relative to the first frame 46, the heat-treating section 37a1 will move away from the heat-treating section 37b1. Consequently, the heat-treating section 37a1 can move without interfering with the heat-treating section 37b1.

When the movable member 51b1 moves relative to the second frame 47, the heat-treating section 37b1 can move in a second direction relative to the second frame 47. When the heat-treating section 37b1 moves in the second direction relative to the second frame 47, the heat-treating section 37b1 will move away from the first frame 46. Consequently, the heat-treating section 37b1 can move without interfering with the first frame 46.

The heat-treating section 37b1 is located leftward of the heat-treating section 37a1. When the movable member 51b1 moves relative to the second frame 47, the heat-treating section 37b1 can move leftward relative to the second frame 47. When the heat-treating section 37b1 moves leftward relative to the second frame 47, the heat-treating section 37b1 will move away from the heat-treating section 37a1. Consequently, the heat-treating section 37b1 can move without interfering with the heat-treating section 37a When the movable member 51a1 moves relative to the first frame 46, the movable member 51a1 can draw at least part of the heat-treating section 37a1 in the first direction out of the first frame 46. This facilitates maintenance for the heat-treating section 37a1.

When the movable member 51b1 moves relative to the second frame 47, the movable member 51b1 can draw at least part of the heat-treating section 37b1 in the second direction out of the second frame 47. This facilitates maintenance for the heat-treating section 37b1.

When the movable member 51b1 moves relative to the second frame 46, the heat-treating section 37b1 can be moved to the maintenance position Qb1. The heat-treating section 37b1 can therefore be moved to the maintenance position Qb1 easily.

The second frame 47 is located leftward of the first frame 46. When the heat-treating section 37a1 is in the maintenance position Qa1, at least part of the heat-treating section 37a1 is located rightward of the first frame 46. Thus, when the heat-treating section 37a1 is in the first maintenance position Qa1, at least part of the heat-treating section 37a1 is located outside the first frame 46 and outside the second frame 47. Consequently, when the heat-treating section 37a1 is in the maintenance position Qa1, maintenance work can be done for the heat-treating section 37a1 easily.

The first frame 46 is located rightward of the second frame 47. When the heat-treating section 37b1 is in the maintenance position Qb1, at least part of the heat-treating section 37b1 is located leftward of the second frame 47. Thus, when the heat-treating section 37b1 is in the maintenance position Qb1, at least part of the heat-treating section 37b1 is located outside the first frame 46 and outside the second frame 47. Consequently, when the heat-treating section 37b1 is in the maintenance position Qb1, maintenance work can be done for the heat-treating section 37b1 easily.

The second frame 47 has substantially the same shape as the first frame 46. The first frame 46 and second frame 47 can therefore be manufactured easily. Consequently, the substrate treating apparatus 1 can be manufactured easily.

The second frame 47 is separable from the first frame 46. Consequently, the substrate treating apparatus 1 can be manufactured easily.

For example, the manufacturing of the substrate treating apparatus 1 can be divided into the following first operation, second operation, and third operation:

First operation for mounting the movable member 51a1, heat-treating section 37a1, and transport mechanism 34a1 in the first frame 46;

Second operation for mounting the movable member 51b1, heat-treating section 37b1, and transport mechanism 34b1 in the second frame 47; and Third operation for connecting the first frame 46 and second frame 47.

Here, the first operation, second operation, and third operation can be done in different places and at different times.

The substrate treating apparatus 1 can therefore be manufactured easily.

The transport mechanism 34b1 is located in a position bilaterally symmetric to the transport mechanism 34a1. The heat-treating section 37b1 is located in a position bilaterally symmetric to the heat-treating section 37a1. Consequently, the substrate treating apparatus 1 can designed and manufactured with increased ease.

The movable member 51a2 is supported by the first frame 46. The heat-treating section 37a2 is supported by the movable member 51a2. The movable member 51a2 is movable relative to the first frame 46. When the movable member 51a2 moves relative to the first frame 46, the heat-treating section 37a2 will move relative to the first frame 46. This facilitates maintenance for the heat-treating section 37a2.

The transport mechanism 34a2 is supported by the movable member 51a2. When the movable member 51a2 moves relative to the first frame 46, the heat-treating section 37a2 will move together with the transport mechanism 34a2. Consequently, when the movable member 51a2 moves relative to the first frame 46, the relative position of the heat-treating section 37a2 and transport mechanism 34a2 can be kept constant. Thus, with the relative position of the heat-treating section 37a2 and transport mechanism 34a2 kept constant, maintenance work can be done for the heat-treating section 37a2. There is no need to adjust the relative position of the heat-treating section 37a2 and transport mechanism 34a2 each time maintenance is done for the heat-treating section 37a2. That is, the heat-treating section 37a2 can be maintained with increased ease.

According to the substrate treating apparatus 1, as noted above, maintenance work therefore can be done with ease.

The movable member 51a2 is movable relative to the first frame 46 independently of the movable member 51a1. Consequently, the heat-treating sections 37a1 and 37a2 can be moved individually. Therefore, for example, maintenance work can easily be done for only one of the heat-treating sections 37a1 and 37a2. Or maintenance work can easily be done for both of the heat-treating sections 37a1 and 37a2.

The substrate treating apparatus 1 includes the heat-treating section 37a2 in addition to the heat-treating section 37a1. This can conveniently improve the throughput of the substrate treating apparatus 1.

The heat-treating section 37a2 is located above the heat-treating section 37a1. This realizes a reduction in the installation space of the heat-treating sections 37a1 and 37a2 in plan view. The transport mechanism 34a2 is located above the transport mechanism 34a1. This realizes a reduction in the installation space of the transport mechanisms 34a1 and 34a2 in plan view. The footprint of the substrate treating apparatus 1 can therefore be reduced.

The guides 55 are fixed to the first frame 46. The slides 56 are fixed to the movable member 51a1. The slides 56 are guided by the guides 55. The movable member 51a1 can move conveniently relative to the first frame 46.

When the heat-treating section 37a1 is in the maintenance position Qa1, at least part of the inspecting section 41a1 is located outside the first frame 46. Consequently, when the heat-treating section 37a1 is in the maintenance position Qa1, maintenance work can easily be carried out for the inspecting section 41a.

When the heat-treating section 37a1 is in the maintenance position Qa1, at least part of the electric equipment section 57a1 is located outside the first frame 46. Consequently, when the heat-treating section 37a1 is in the maintenance position Qa1, maintenance work can easily be carried out for the electric equipment section 57a1.

This invention is not limited to the foregoing embodiment, but may be modified as follows:

In the foregoing embodiment, the heat-treating transport mechanism 33 includes eight transport mechanisms 34a1-34a4 and 34b1-34b4. This invention is not limited to this. The number of transport mechanisms 34 included in the heat-treating transport mechanism 33 may be changed as appropriate.

In the foregoing embodiment, the axis of rotation A35f is located in the same position as the axis of rotation A35d. This invention is not limited to this. For example, the axis of rotation A35f may be located in a different position from the axis of rotation A35d.

In the foregoing embodiment, the substrate treating apparatus 1 includes eight heat-treating sections 37a1-37a4 and 37b1-37b4. This invention is not limited to this. The number of heat-treating sections 37 included in the substrate treating apparatus 1 may be changed as appropriate.

In the foregoing embodiment, the heat-treating section 37a1 includes seven heat-treating units 38a1. This invention is not limited to this. The number of heat-treating units 38a1 included in the heat-treating section 37a1 may be changed as appropriate.

In the foregoing embodiment, the heat treatment the heat-treating section 37a1 performs on wafers W is exemplified by hydrophobizing treatment, heating treatment, and cooling treatment. This invention is not limited to this. For example, the heat treatment the heat-treating section 37a1 performs on wafers W may not include one or two of the hydrophobizing treatment, heating treatment, and cooling treatment.

In the foregoing embodiment, the heat treatment the heat-treating section 37b1 performs on wafers W is the same as the heat treatment the heat-treating section 37a1 performs on wafers W. This invention is not limited to this. The heat treatment the heat-treating section 37b1 performs on wafers W may be different from the heat treatment the heat-treating section 37a1 performs on wafers W.

In the foregoing embodiment, the slides 56 are fixed to lower parts of the movable member 51a1. This invention is not limited to this. The slides 56 may be fixed to arbitrary parts of the movable member 51a1. For example, the slides 56 may be fixed to side parts or upper parts of the movable member 51a1.

In the foregoing embodiment, the solution treating section 71 is located in positions aligned substantially in the transverse direction Y with the solution treating transport mechanism 67. This invention is not limited to this. For example, the solution treating section 71 may be located in positions rearward of the solution treating transport mechanism 67. For example, the solution treating section 71 may be located in at least either the positions aligned substantially in the transverse direction Y with the solution treating transport mechanism 67 or the positions rearward of the solution treating transport mechanism 67.

In the foregoing embodiment, the coating treatment the solution treating section 71 performs on wafers W is treatment for forming resist film on wafers W. The invention is not limited to this. The coating treatment may be treatment for forming antireflection film on wafers W.

In the foregoing embodiment, the solution treatment the solution treating section 71 performs on wafers W is coating treatment. The invention is not limited to this. The solution treatment may be developing treatment for developing wafers W. The developing treatment supplies a developer to wafers W. The solution treatment may be cleaning treatment for cleaning wafers W. The cleaning treatment supplies a cleaning liquid to wafers W.

In the foregoing embodiment, the substrate treating apparatus 1 includes the inspecting sections 41. The invention is not limited to this. For example, the inspecting sections 41 may be omitted.

In the foregoing embodiment, the movable member 51a1 supports the inspecting section 41a. The invention is not limited to this. The movable member 51a1 does not need to support the inspecting section 41a.

In the foregoing embodiment, the inspecting section 41a has one inspecting unit 42a1. This invention is not limited to this. The inspecting section 41a may have a plurality of inspecting units 42a1.

The foregoing embodiment and each of the modified embodiments described hereinbefore may be further varied as appropriate by replacing or combining each component with a component of another modified embodiment.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
a transporting space extending in a longitudinal direction;
a first transport mechanism disposed in the transporting space;

a second transport mechanism disposed in the transporting space;
a first heat-treating section for performing heat treatment on substrates; and
a second heat-treating section for performing heat treatment on the substrates;
wherein the first heat-treating section, the transporting space, and the second heat-treating section are aligned in the stated order in a transverse direction perpendicular to the longitudinal direction;
the first heat-treating section includes a plurality of first heat-treating units arranged in the longitudinal direction, each for performing heat treatment on one substrate;
the second heat-treating section includes a plurality of second heat-treating units arranged in the longitudinal direction, each for performing heat treatment on one substrate;
the first transport mechanism is configured to transport the substrates to the first heat-treating units;
the second transport mechanism is configured to transport the substrates to the second heat-treating units;
the first transport mechanism includes:
a first horizontal mover movable in the longitudinal direction relative to the first heat-treating units;
a first arm supported by the first horizontal mover to be rotatable about a first axis relative to the first horizontal mover; and
a first holder fixed to the first arm for holding the substrates:
the first axis being parallel to an up-down direction;
a position in plan view of the first axis relative to the first horizontal mover being constant;
a distance in plan view between the first holder and the first axis being constant;
the first holder does not advance and withdraw relative to the first horizontal mover in plan view; and
the second transport mechanism includes:
a second horizontal mover movable in the longitudinal direction relative to the second heat-treating units;
a second arm supported by the second horizontal mover to be rotatable about a second axis relative to the second horizontal mover; and
a second holder fixed to the second arm for holding the substrates;
the second axis being parallel to the up-down direction;
a position in plan view of the second axis relative to the second horizontal mover being constant;
a distance in plan view between the second holder and the second axis being constant;
the second holder does not advance and withdraw relative to the second horizontal mover in plan view.

2. The substrate treating apparatus according to claim 1, wherein:
the first transport mechanism is movable in the longitudinal direction relative to the first heat-treating units; and
the second transport mechanism is movable in the longitudinal direction relative to the second heat-treating units independently of the first transport mechanism.

3. The substrate treating apparatus according to claim 1, wherein:
the first holder is configured to move the substrates thereby held linearly in the transverse direction toward the first heat-treating units when the first arm rotates about the first axis while the first horizontal mover moves in the longitudinal direction; and
the second holder is configured to move the substrates thereby held linearly in the transverse direction toward the second heat-treating units when the second arm rotates about the second axis while the second horizontal mover moves in the longitudinal direction.

4. The substrate treating apparatus according to claim 1, wherein:
each of the first heat-treating units has a length in the longitudinal direction which is at most three times a radius of the substrates; and
each of the second heat-treating units has a length in the longitudinal direction which is at most three times the radius of the substrates.

5. The substrate treating apparatus according to claim 1, wherein:
the first heat-treating units have first imaginary central points located centrally thereof, respectively;
a distance between two first imaginary central points adjacent each other in the longitudinal direction being at most three times a radius of the substrates; and
the second heat-treating units have second imaginary central points located centrally thereof, respectively;
a distance between two second imaginary central points adjacent each other in the longitudinal direction being at most three times the radius of the substrates.

6. The substrate treating apparatus according to claim 1, wherein the transporting space has a length in the transverse direction which is at most five times a radius of the substrates.

7. The substrate treating apparatus according to claim 1, wherein:
the heat treatment the first heat-treating section performs on the substrates includes:
pretreatment which is heat treatment performed on the substrate before solution treatment; and
posttreatment which is heat treatment performed on the substrates after the solution treatment; and
the heat treatment the second heat-treating section performs on the substrates includes:
the pretreatment, and
the posttreatment.

8. The substrate treating apparatus according to claim 1, wherein:
the heat treatment the first heat-treating section performs on the substrates includes:
hydrophobizing treatment, and
heating treatment; and
the heat treatment the second heat-treating section performs on the substrates includes:
the hydrophobizing treatment, and
the heating treatment.

9. The substrate treating apparatus according to claim 1, wherein the heat treatment the second heat-treating section performs on the substrates is the same as the heat treatment the first heat-treating section performs on the substrates.

10. The substrate treating apparatus according to claim 1, further comprising:
a first front rack disposed forward of the first transport mechanism for allowing the first transport mechanism to place the substrates thereon; and
a second front rack disposed forward of the second transport mechanism for allowing the second transport mechanism to place the substrates thereon;
wherein the first front rack and the second front rack are aligned in an up-down direction; and
the second front rack overlaps the first front rack in plan view.

11. The substrate treating apparatus according to claim 1, further comprising a solution treating section for performing solution treatment on the substrates;
  wherein the solution treating section is located outside an area where the first transport mechanism can transport the substrates, and is located outside an area where the second transport mechanism can transport the substrates.

12. The substrate treating apparatus according to claim 11, further comprising a solution treating transport mechanism disposed rearward of the first transport mechanism and the second transport mechanism for transporting the substrates to the solution treating section;
  wherein the solution treating section is located in a position adjoining the solution treating transport mechanism.

13. The substrate treating apparatus according to claim 1, further comprising:
  a third transport mechanism disposed in the transporting space for transporting the substrates;
  a fourth transport mechanism disposed in the transporting space for transporting the substrates;
  a third heat-treating section for performing heat treatment on the substrates; and
  a fourth heat-treating section for performing heat treatment on the substrates;
  wherein the third heat-treating section, the transporting space, and the fourth heat-treating section are aligned in the stated order in the transverse direction;
  the third transport mechanism and the fourth transport mechanism are arranged above the first transport mechanism and the second transport mechanism;
  the third heat-treating section overlaps the first heat-treating section in plan view;
  the fourth heat-treating section overlaps the second heat-treating section in plan view;
  the third heat-treating section includes a plurality of third heat-treating units arranged in the longitudinal direction, each for performing heat treatment on one substrate;
  the fourth heat-treating section includes a plurality of fourth heat-treating units arranged in the longitudinal direction, each for performing heat treatment on one substrate;
  the third transport mechanism is configured to transport the substrates to the third heat-treating units; and
  the fourth transport mechanism is configured to transport the substrates to the fourth heat-treating units.

14. The substrate treating apparatus according to claim 13, wherein:
  the heat treatment the second heat-treating section performs on the substrates is the same as the heat treatment the first heat-treating section performs on the substrates;
  the heat treatment the third heat-treating section performs on the substrates is the same as the heat treatment the first heat-treating section performs on the substrates; and
  the heat treatment the fourth heat-treating section performs on the substrates is the same as the heat treatment the first heat-treating section performs on the substrates.

15. The substrate treating apparatus according to claim 13, further comprising:
  a first front rack disposed forward of the first transport mechanism for allowing the first transport mechanism to place the substrates thereon;
  a second front rack disposed forward of the second transport mechanism for allowing the second transport mechanism to place the substrates thereon;
  a third front rack disposed forward of the third transport mechanism for allowing the third transport mechanism to place the substrates thereon; and
  a fourth front rack disposed forward of the fourth transport mechanism for allowing the fourth transport mechanism to place the substrates thereon;
  wherein the first front rack, the second front rack, the third front rack, and the fourth front rack are aligned in an up-down direction;
  the second front rack overlaps the first front rack in plan view;
  the third front rack overlaps the first front rack in plan view; and
  the fourth front rack overlaps the first front rack in plan view.

16. The substrate treating apparatus according to claim 15, further comprising an indexer's transport mechanism disposed forward of the first front rack, the second front rack, the third front rack, and the fourth front rack;
  wherein the indexer's transport mechanism is configured to:
    transport the substrates between a carrier storing the substrates and the first front rack;
    transport the substrates between the carrier and the second front rack;
    transport the substrates between the carrier and the third front rack; and
    transport the substrates between the carrier and the fourth front rack.

17. The substrate treating apparatus according to claim 13, further comprising a solution treating section for performing solution treatment on the substrates;
  wherein the solution treating section is:
    located outside an area where the first transport mechanism can transport the substrates;
    located outside an area where the second transport mechanism can transport the substrates;
    located outside an area where the third transport mechanism can transport the substrates; and
    located outside an area where the fourth transport mechanism can transport the substrates.

18. The substrate treating apparatus according to claim 17, further comprising a solution treating transport mechanism disposed rearward of the first transport mechanism, the second transport mechanism, the third transport mechanism, and the fourth transport mechanism for transporting the substrates to the solution treating section;
  wherein the solution treating section is located in at least one of a position to align with the solution treating transport mechanism in the transverse direction and a position rearward of the solution treating transport mechanism.

19. The substrate treating apparatus according to claim 18, further comprising:
  a first rear rack disposed rearward of the first transport mechanism and forward of the solution treating transport mechanism for allowing the first transport mechanism and the solution treating transport mechanism to place the substrates thereon;
  a second rear rack disposed rearward of the second transport mechanism and forward of the solution treating transport mechanism for allowing the second transport mechanism and the solution treating transport mechanism to place the substrates thereon;

a third rear rack disposed rearward of the third transport mechanism and forward of the solution treating transport mechanism for allowing the third transport mechanism and the solution treating transport mechanism to place the substrates thereon; and a fourth rear rack disposed rearward of the fourth transport mechanism and forward of the solution treating transport mechanism for allowing the fourth transport mechanism and the solution treating transport mechanism to place the substrates thereon;

wherein the first rear rack, the second rear rack, the third rear rack, and the fourth rear rack are aligned in an up-down direction;

the second rear rack overlaps the first rear rack in plan view;

the third rear rack overlaps the first rear rack in plan view; and the fourth rear rack overlaps the first rear rack in plan view.

20. The substrate treating apparatus according to claim 1, wherein:

the first transport mechanism includes:

a third arm supported by the first horizontal mover to be rotatable about a third axis relative to the first horizontal mover; and a third holder fixed to the third arm for holding the substrates:

the third arm is rotatable independently of the first arm; and the second transport mechanism includes:

a fourth arm supported by the second horizontal mover to be rotatable about a fourth axis relative to the second horizontal mover; and a fourth holder fixed to the fourth arm for holding the substrates:

the fourth arm is rotatable independently of the second arm.

21. The substrate treating apparatus according to claim 20, wherein:

the third axis is coaxial with the first axis; and the fourth axis is coaxial with the second axis.

22. The substrate treating apparatus according to claim 20, wherein:

in plan view, the first axis and the third axis move on an imaginary line which passes through the first axis and extends substantially parallel to the longitudinal direction.

23. The substrate treating apparatus according to claim 10, wherein the first transport mechanism and the second transport mechanism are aligned in the transverse direction.

24. The substrate treating apparatus according to claim 20, wherein:

in plan view, the second axis and the fourth axis move on an imaginary line which passes through the second axis and extends substantially parallel to the longitudinal direction.

* * * * *